(12) United States Patent
Kato et al.

(10) Patent No.: US 11,792,985 B2
(45) Date of Patent: *Oct. 17, 2023

(54) SEMICONDUCTOR STORAGE DEVICE

(71) Applicant: Kioxia Corporation, Tokyo (JP)

(72) Inventors: Tatsuya Kato, Yokkaichi Mie (JP); Satoshi Nagashima, Yokkaichi Mie (JP); Yefei Han, Yokkaichi Mie (JP); Takayuki Ishikawa, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 153 days.

This patent is subject to a terminal disclaimer.

(21) Appl. No.: 17/190,939

(22) Filed: Mar. 3, 2021

(65) Prior Publication Data

US 2022/0085059 A1    Mar. 17, 2022

(30) Foreign Application Priority Data

Sep. 16, 2020 (JP) ................. 2020-155786

(51) Int. Cl.
*H01L 27/115* (2017.01)
*H01L 27/11582* (2017.01)
(Continued)

(52) U.S. Cl.
CPC ......... *H10B 43/27* (2023.02); *H01L 23/5226* (2013.01); *H01L 29/4234* (2013.01); *H10B 43/35* (2023.02)

(58) Field of Classification Search
CPC ........... H01L 27/11582; H01L 23/5226; H01L 27/1157; H01L 29/4234; H01L 27/11556;
(Continued)

(56) References Cited

U.S. PATENT DOCUMENTS 8,946,023 B2  2/2015  Makala et al.
9,443,868 B1  9/2016  Hu et al.
(Continued)

FOREIGN PATENT DOCUMENTS

JP   2016-092044 A   5/2016
JP   2016-171243 A   9/2016
(Continued)

OTHER PUBLICATIONS

Notice of Allowance in U.S. Appl. No. 16/294,728 dated Dec. 2, 2020.

*Primary Examiner* — Mary A Wilczewski
*Assistant Examiner* — Tsz K Chiu
(74) *Attorney, Agent, or Firm* — Foley & Lardner LLP

(57) ABSTRACT

A semiconductor storage device includes: a first conductive layer extending in a first direction; a second conductive layer that is disposed apart from the first conductive layer in a second direction intersecting the first direction, and extends in the first direction; a plurality of semiconductor layers provided between the first conductive layer and the second conductive layer and arranged in the first direction, each of which includes a first portion facing the first conductive layer, and a second portion facing the second conductive layer; a plurality of first memory cells provided between the first conductive layer and the semiconductor layers, respectively; and a plurality of second memory cells provided between the second conductive layer and the semiconductor layers, respectively. A gap is provided between the two semiconductor layers adjacent in the first direction.

14 Claims, 53 Drawing Sheets

(51) Int. Cl.
*H10B 43/27* (2023.01)
*H01L 29/423* (2006.01)
*H01L 23/522* (2006.01)
*H10B 43/35* (2023.01)

(58) Field of Classification Search
CPC ......... H01L 27/11519; H01L 27/11524; H01L 27/11565; H01L 27/11517; H01L 27/11521; H01L 27/11563; H01L 27/11568; H01L 29/40117; H01L 29/42324; H01L 29/0649; H01L 29/40114; H01L 29/0847; H01L 21/31111; H01L 23/528; H10B 43/40; H10B 43/50; H10B 43/27; H10B 43/10; H10B 41/30; H10B 41/40; H10B 41/27; H10B 43/35; H10B 43/30; H10B 41/10
See application file for complete search history.

(56) References Cited

U.S. PATENT DOCUMENTS

| | | | | |
|---|---|---|---|---|
| 9,666,594 | B2* | 5/2017 | Mizuno | H01L 29/7923 |
| 9,728,552 | B1 | 8/2017 | Fukumoto et al. | |
| 10,290,803 | B2* | 5/2019 | Sano | H10B 43/27 |
| 10,381,378 | B1* | 8/2019 | Harari | G11C 16/14 |
| 10,608,011 | B2 | 3/2020 | Harari | H01L 21/7682 |
| 10,720,448 | B2* | 7/2020 | Harari | G11C 16/26 |
| 10,985,175 | B2* | 4/2021 | Nagashima | H01L 27/11582 |
| 2010/0072538 | A1 | 3/2010 | Kito et al. | |
| 2011/0298013 | A1* | 12/2011 | Hwang | H10B 43/27 |
| | | | | 257/365 |
| 2012/0241843 | A1 | 9/2012 | Iino et al. | |
| 2015/0179820 | A1 | 6/2015 | Kim | |
| 2016/0268282 | A1 | 9/2016 | Ishibashi | |
| 2016/0268304 | A1 | 9/2016 | Ikeda et al. | |
| 2017/0018566 | A1 | 1/2017 | Sonehara | |
| 2017/0025431 | A1* | 1/2017 | Kanakamedala | H01L 29/40117 |
| 2017/0062467 | A1 | 3/2017 | Hamanaka | |
| 2017/0069646 | A1 | 3/2017 | Arisumi et al. | |
| 2017/0069656 | A1 | 3/2017 | Minami | |
| 2017/0069657 | A1 | 3/2017 | Hamanaka et al. | |
| 2017/0077128 | A1 | 3/2017 | Uchiyama | |
| 2017/0077131 | A1 | 3/2017 | Konagai et al. | |
| 2017/0148805 | A1* | 5/2017 | Nishikawa | H10B 41/35 |
| 2017/0148809 | A1* | 5/2017 | Nishikawa | H01L 29/0649 |
| 2017/0162596 | A1 | 6/2017 | Tsuda et al. | |
| 2017/0256563 | A1 | 9/2017 | Matsuda et al. | |
| 2017/0263612 | A1 | 9/2017 | Yamashita | |
| 2017/0263614 | A1 | 9/2017 | Tokuhira et al. | |
| 2017/0263630 | A1 | 9/2017 | Noda et al. | |
| 2017/0271348 | A1 | 9/2017 | Arai et al. | |
| 2017/0271349 | A1 | 9/2017 | Miyagawa et al. | |
| 2017/0271359 | A1 | 9/2017 | Sakamoto | |
| 2017/0278852 | A1 | 9/2017 | Kawai et al. | |
| 2017/0278857 | A1 | 9/2017 | Arai | |
| 2019/0252405 | A1* | 8/2019 | Tsutsumi | G11C 16/0466 |
| 2019/0312050 | A1 | 10/2019 | Lai et al. | |
| 2020/0091181 | A1* | 3/2020 | Nagashima | H01L 27/11582 |
| 2020/0098784 | A1 | 3/2020 | Nagashima et al. | |
| 2022/0254728 | A1* | 8/2022 | Matsuno | H10B 43/27 |

FOREIGN PATENT DOCUMENTS

| | | |
|---|---|---|
| JP | 2018-026518 A | 2/2018 |
| TW | 201017830 A | 5/2010 |
| TW | 201528440 A | 7/2015 |
| TW | 201944582 A | 11/2019 |
| TW | 202013691 A | 4/2020 |
| WO | WO-2021181607 A1 * | 9/2021 |

* cited by examiner

SEMICONDUCTOR STORAGE DEVICE

CROSS-REFERENCE TO RELATED APPLICATION(S)

This application is based upon and claims the benefit of priority from Japanese Patent Application No. 2020-155786, filed on Sep. 16, 2020, the entire contents of which are incorporated herein by reference.

FIELD

Embodiments described herein relate generally to a semiconductor storage device.

BACKGROUND

A semiconductor storage device is known, which includes a conductive layer, a semiconductor layer facing the conductive layer, and memory cells each of which is provided between the conductive layer and the semiconductor layer.

DETAILED DESCRIPTION

Figure 1:
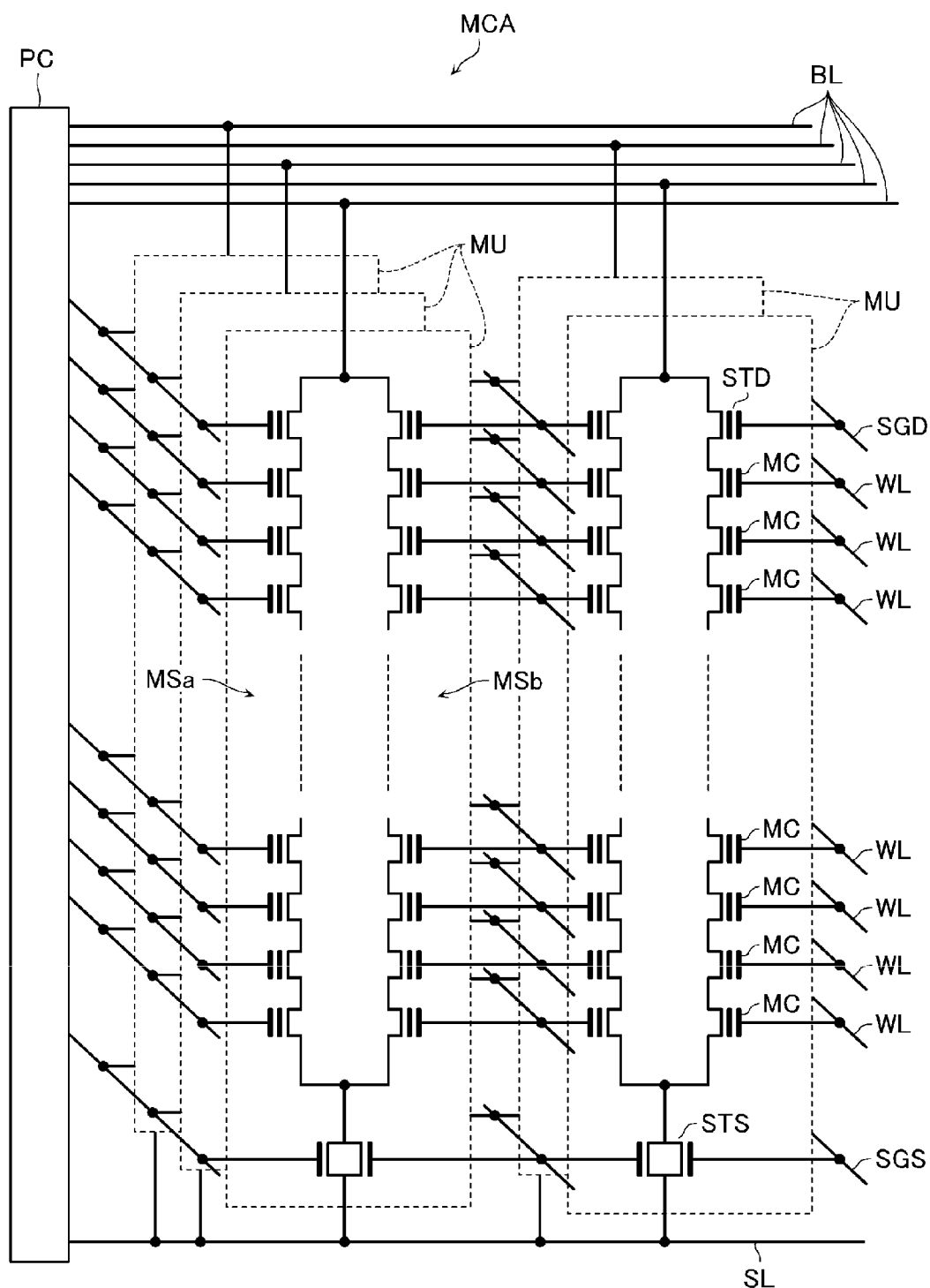
FIG. 1 is a schematic equivalent circuit diagram of a semiconductor storage device according to a first embodiment.

At least one embodiment provides a semiconductor storage device that suitably operates.

In general, according to at least one embodiment, a semiconductor storage device includes: a first conductive layer extending in a first direction; a second conductive layer that is disposed apart (spaced) from the first conductive layer in a second direction intersecting the first direction, and extends in the first direction; a plurality of semiconductor layers provided between the first conductive layer and the second conductive layer and arranged in the first direction, each of which includes a first portion facing the first conductive layer, and a second portion facing the second conductive layer; a plurality of first memory cells provided between the first conductive layer and the semiconductor layers, respectively; and a plurality of second memory cells provided between the second conductive layer and the semiconductor layers, respectively. A gap is provided between the two semiconductor layers adjacent in the first direction.

Next, a semiconductor storage device according to embodiments will be described in detail with reference to drawings. These embodiments are merely examples, and are described without the intention of limiting the present disclosure.

The drawings are schematic, and certain configurations may be omitted. Common parts in the embodiments may be denoted by common reference numerals, and descriptions thereof may be omitted.

In the present specification, a predetermined direction parallel to an upper surface of a substrate is referred to as an X direction, a direction parallel to the upper surface of the substrate and perpendicular to the X direction is referred to as a Y direction, and a direction perpendicular to the upper surface of the substrate is referred to as a Z direction.

In the present specification, a direction along a predetermined plane may be referred to as a first direction, a direction intersecting the first direction, along the predetermined plane may be referred to as a second direction, and a direction intersecting the predetermined plane may be referred to as a third direction. The first direction, the second direction, and the third direction may or may not correspond to any of the X direction, the Y direction, and the Z direction.

In the present specification, expressions such as "top" or "bottom" are based on a substrate. For example, a direction away from the substrate, along the first direction, is referred to as top, and a direction getting closer to the substrate, along the first direction, is referred to as bottom. The lower surface or the lower end mentioned in regard to a certain configuration means the surface or the end portion on the substrate side in the configuration, and the upper surface or the upper end means the surface or the end portion on the opposite side to the substrate in the configuration. A surface intersecting the second direction or the third direction is referred to as a side surface.

In the present specification, a "width" or a "thickness" in a predetermined direction, which is mentioned in regard to a configuration, a member, etc., may mean a width or a thickness of a cross-section or the like observed by the scanning electron microscopy (SEM), the transmission electron microscopy (TEM), etc.

First Embodiment

[Configuration]

FIG. 1 is a schematic equivalent circuit diagram of a semiconductor storage device according to a first embodiment.

The semiconductor storage device according to at least one embodiment includes a memory cell array MCA, and a peripheral circuit PC that controls the memory cell array MCA.

The memory cell array MCA includes a plurality of memory units MU. Each of these memory units MU includes two electrically independent memory strings MSa and MSb. One ends of the memory strings MSa and MSb are connected to drain side select transistors STD, respectively, and are connected to a common bit line BL via these. The other ends of the memory strings MSa and MSb are connected to a common source side select transistor STS, and are connected to a common source line SL via this.

Each of the memory strings MSa and MSb includes a plurality of memory cells MC connected in series. The memory cell MC is a field effect transistor that includes a semiconductor layer, a gate insulating film, and a gate electrode. The semiconductor layer functions as a channel region. The gate insulating film includes a charge storage layer capable of storing data. The threshold voltage of the memory cell MC changes according to the amount of charges in the charge storage layer. The gate electrode is a part of a word line WL.

Each of the select transistors STD and STS is a field effect transistor including a semiconductor layer, a gate insulating film, and a gate electrode. The semiconductor layer functions as a channel region. The gate electrode of the drain side select transistor STD is a part of a drain side select gate line SGD. The gate electrode of the source side select transistor STS is a part of a source side select gate line SGS.

The peripheral circuit PC generates voltages required for, for example, a read operation, a write operation, and an erase operation, and applies the voltages to the bit line BL, the source line SL, the word line WL, and select gate lines SGD and SGS. The peripheral circuit PC includes, for example, circuits such as a row decoder, a sense amplifier module, a voltage generation circuit, a sequencer, and various registers. The peripheral circuit PC is implemented by, for example, a plurality of transistors and wirings provided on a semiconductor substrate.

Figure 2:
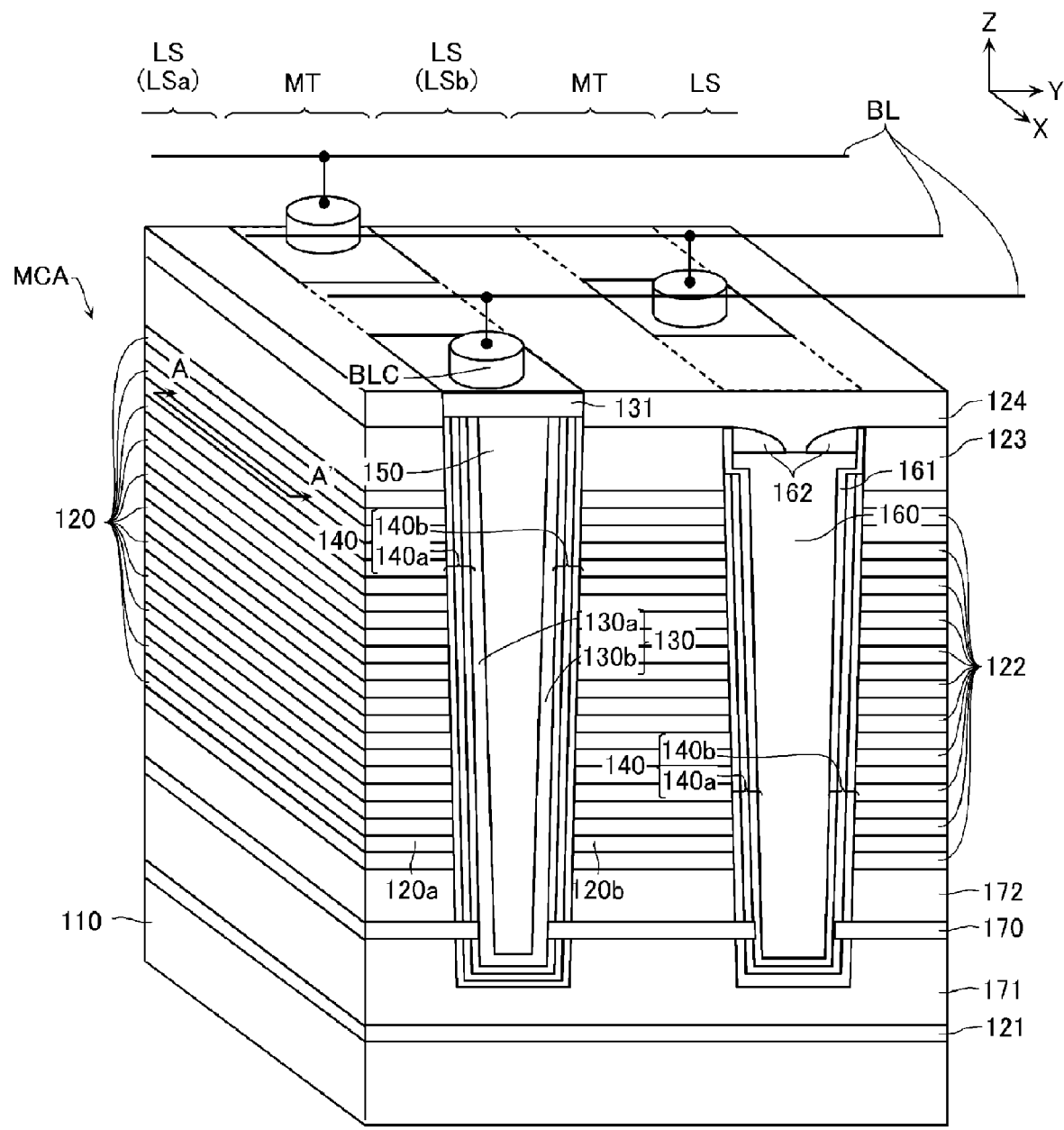
FIG. 2 is a schematic perspective view of the same semiconductor storage device.
Figure 3A:
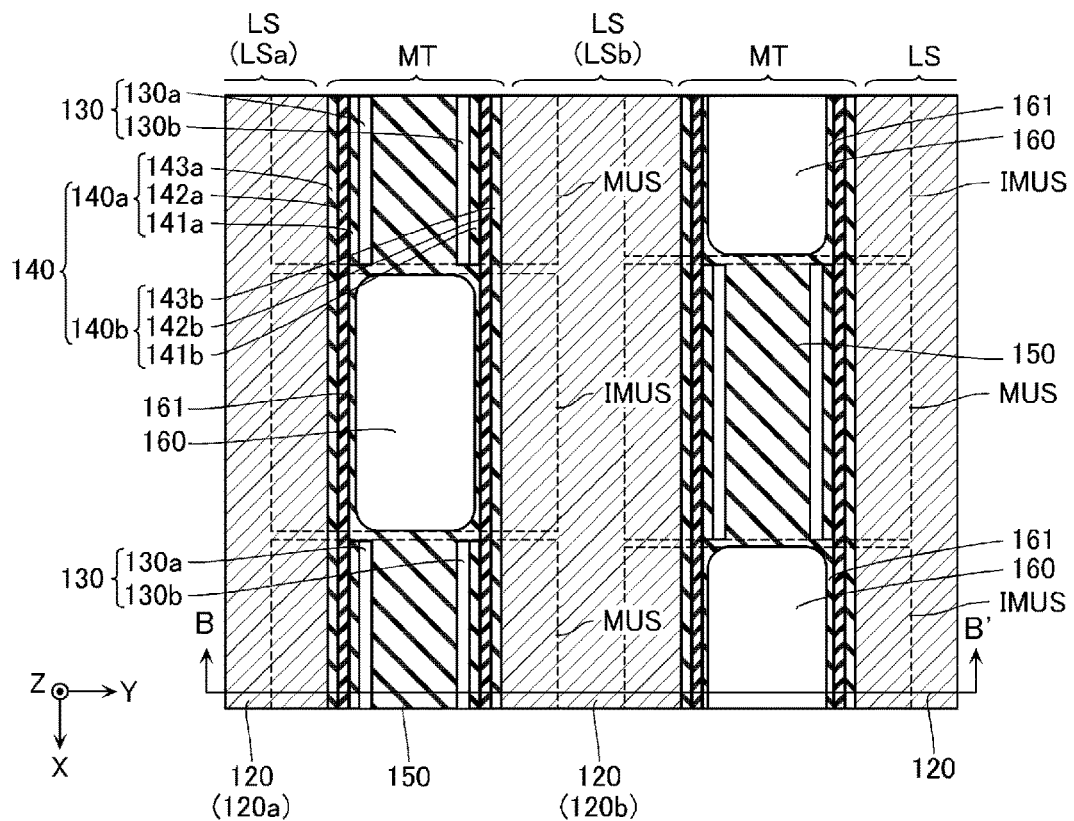
FIG. 3A is a schematic plan view corresponding to the cross-section of a portion indicated by the line A-A' in FIG. 2.
Figure 3B:
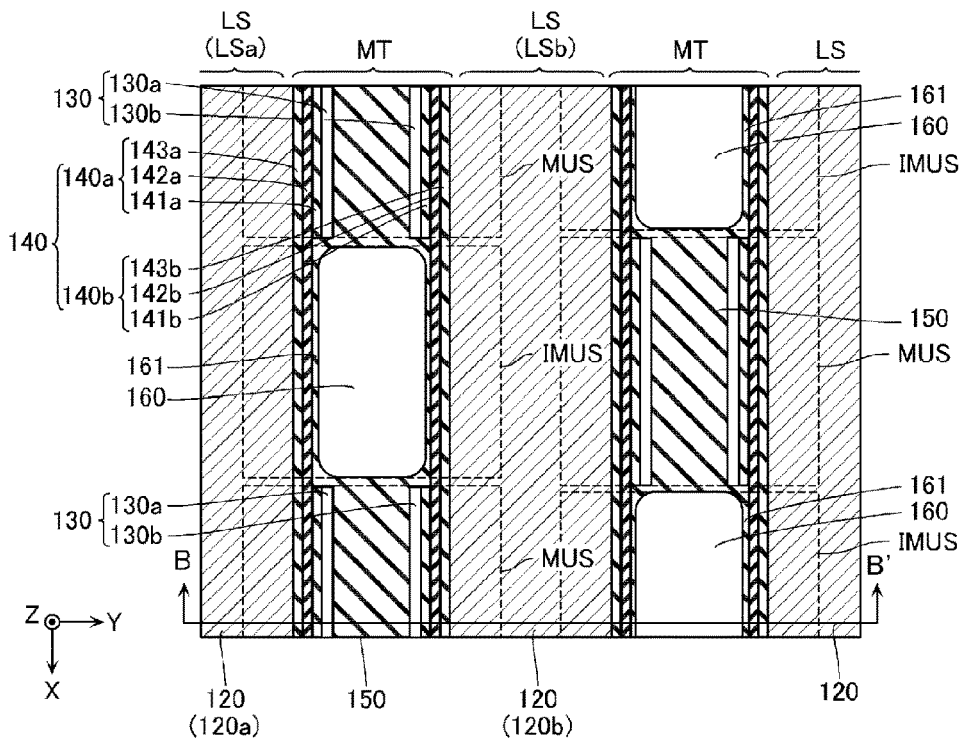
FIG. 3B is a schematic sectional view corresponding to the cross-section of a portion indicated by the line B-B' in FIG. 3A.

Next, a schematic configuration example of the semiconductor storage device according to at least one embodiment will be described with reference to FIG. 2 and FIGS. 3A and 3B. FIG. 2 is a schematic perspective view of the same semiconductor storage device. FIG. 3A is a schematic plan view corresponding to the cross-section of a portion indicated by the line A-A' of FIG. 2. FIG. 3B is a schematic sectional view corresponding to the cross-section of a portion indicated by the line B-B' in FIG. 3A. A part of the configurations are omitted in FIG. 2 and FIGS. 3A and 3B.

For example, as illustrated in FIG. 2, the semiconductor storage device according to at least one embodiment includes a substrate 110, and a memory cell array MCA provided above the substrate 110.

The substrate 110 is, for example, a semiconductor substrate of monocrystalline silicon (Si). The substrate 110 includes, for example, a double-well structure that has an n-type impurity layer on the upper surface of the semiconductor substrate and a p-type impurity layer in the n-type impurity layer. For example, transistors or wirings constituting the peripheral circuit PC may be provided on the upper surface of the substrate 110.

The memory cell array MCA includes a plurality of stacked structures LS arranged in the Y direction. The stacked structure LS includes a plurality of conductive layers 120 stacked in the Z direction. Memory trench structures MT are provided between these stacked structures LS. The stacked structure LS and the memory trench structure MT are arranged alternately in the Y direction. For example, as illustrated in FIG. 3A, the memory trench structure MT includes a plurality of memory unit structures MUS and inter-memory-unit structures IMUS, which are arranged in the X direction. The memory unit structure MUS includes a semiconductor layer 130, a part of a gate insulating layer 140, and an insulating layer 150. The inter-memory-unit structure IMUS has a part of the gate insulating layer 140 and a gap 160. For example, as illustrated in FIG. 2, lower side wall portions of the semiconductor layer 130 are connected to a semiconductor layer 170.

The conductive layer 120 is a substantially plate-shaped conductive layer extending in the X direction, and is, for example, a stacked film of titanium nitride (TiN) and tungsten (W), or a conductive layer of polycrystalline silicon (p-Si) or the like in which an impurity is injected. Apart of these conductive layers 120 functions as gate electrodes of the word lines WL and the memory cells MC, respectively (see FIG. 1). Among these conductive layers 120, one or more conductive layers 120 located above the conductive layers 120 functioning as the word lines WL and the like function as a gate electrode of the drain side select gate line SGD and the drain side select transistor STD (see FIG. 1). Among these conductive layers 120, one or more conductive layers 120 located below the conductive layers 120 functioning as the word lines WL and the like function as a gate electrode of the source side select gate line SGS and the source side select transistor STS (see FIG. 1).

Insulating layers 122 of silicon oxide (SiO2) are provided between the conductive layers 120, and between the lowermost conductive layer 120 and a semiconductor layer 172. An insulating layer 123 of silicon oxide (SiO2) is provided on the upper surface of the uppermost conductive layer 120 among the conductive layers 120. An insulating layer 124 of silicon oxide (SiO2) is provided on the upper surface of the insulating layer 123.

In the following description, one of the two stacked structures LS arranged in the Y direction may be referred to as a stacked structure LSa, and the other may be referred to as a stacked structure LSb. The conductive layer 120 in the stacked structure LSa may be referred to as a first conductive layer 120a, and the conductive layer 120 in the stacked structure LSb may be referred to as a second conductive layer 120b.

For example, as illustrated in FIG. 3A, the semiconductor layers 130 are arranged in the X direction while corresponding to the memory unit structures MUS arranged in the X direction. The semiconductor layer 130 includes a first semiconductor layer 130a provided between the stacked structure LSa and the insulating layer 150, and a second semiconductor layer 130b provided between the stacked structure LSb and the insulating layer 150.

The first semiconductor layers 130a are arranged in the X direction, in which each extends in the Z direction and faces the plurality of first conductive layers 120a. The first semiconductor layer 130a is, for example, a semiconductor layer of undoped polycrystalline silicon (Si). The first semiconductor layer 130a functions as a channel region of the plurality of memory cells MC in the memory string MSa (FIG. 1).

The second semiconductor layers 130b are arranged in the X direction, in which each extends in the Z direction and faces the plurality of second conductive layers 120b. The second semiconductor layer 130b is, for example, a semiconductor layer of undoped polycrystalline silicon (Si). The second semiconductor layer 130b functions as a channel region of the plurality of memory cells MC in the memory string MSb (see FIG. 1).

For example, as illustrated in FIG. 2, a semiconductor layer 131 is connected to the upper end surfaces of the first semiconductor layer 130a and the second semiconductor layer 130b. The semiconductor layer 131 is, for example, a semiconductor layer of polycrystalline silicon (Si), which contains an N-type impurity such as phosphorous (P). The semiconductor layer 131 is connected to a bit line contact BLC of tungsten (W), and the bit line BL of copper (Cu).

The gate insulating layer 140 includes a first gate insulating layer 140a, and a second gate insulating layer 140b.

The first gate insulating layer 140a is provided on the side surface of the stacked structure LS on one side in the Y direction, between the plurality of first semiconductor layers 130a arranged in the X direction, and the plurality of first conductive layers 120a arranged in the Z direction, and extends in the X direction and the Z direction. For example, as illustrated in FIG. 3A, the first gate insulating layer 140a includes a first insulating layer 141a, a first charge storage layer 142a, and a first block insulating layer 143a.

The second gate insulating layer 140b is provided on the side surface of the stacked structure LS on the other side in the Y direction, between the plurality of second semiconductor layers 130b arranged in the X direction, and the plurality of second conductive layers 120b arranged in the Z direction, and extends in the X direction and the Z direction. For example, as illustrated in FIG. 3A, the second gate insulating layer 140b includes a second insulating layer 141b, a second charge storage layer 142b, and a second block insulating layer 143b.

The first insulating layers 141a and the second insulating layers 141b are provided corresponding to the plurality of memory unit structures MUS arranged in the X direction. The first insulating layer 141a and the second insulating layer 141b include, for example, insulating layers of silicon oxide (SiO2).

The first charge storage layer 142a extends in the X direction over a plurality of regions where the first conductive layers 120a and the plurality of first semiconductor layers 130a face each other, and is provided between the first conductive layers 120a and the plurality of first semiconductor layers 130a. The second charge storage layer 142b extends in the X direction over a plurality of regions where the second conductive layers 120b and the plurality of second semiconductor layers 130b face each other, and is provided between the second conductive layers 120b and the plurality of second semiconductor layers 130b. The first charge storage layer 142a and the second charge storage layer 142b include, for example, insulating layers of silicon nitride (SiN).

The first block insulating layer 143a extends in the X direction over a plurality of regions where the first conductive layers 120a and the plurality of first semiconductor layers 130a face each other, and is provided between the first conductive layers 120a and the first charge storage layer 142a. The second block insulating layer 143b extends in the X direction over a plurality of regions where the second conductive layers 120b and the plurality of second semiconductor layers 130b face each other, and is provided between the second conductive layers 120b and the second charge storage layer 142b. The first block insulating layer 143a and the second block insulating layer 143b include, for example, insulating layers of silicon oxide (SiO2).

The insulating layer 150 is provided between the first semiconductor layer 130a and the second semiconductor layer 130b, in the central portion of the memory unit structure MUS, and extends in the Z direction. The insulating layer 150 is not provided in the inter-memory-unit structure IMUS. The insulating layer 150 is, for example, an insulating layer of silicon oxide (SiO2).

The gap 160 is provided in the central portion of the inter-memory-unit structure IMUS, and extends in the Z direction. The gap 160 refers to a space surrounded by a solid material around the portion where the gap 160 is present, and the portion where the gap 160 is present does not include any solid material. The gap 160 is, for example, a space containing air composed of a mixture of a plurality of gases such as nitrogen, oxygen, and rare gas. The gap 160 may be degassed such that no gas may be contained.

An insulating layer 161 is provided at a position where the side surfaces and the lower surface of the gap 160 are covered. The insulating layer 161 is an insulating layer of, for example, silicon oxide (SiO2).

For example, as illustrated in FIG. 3B, an insulating layer 162 is provided at a position where a part of the upper surface of the gap 160 is covered. The insulating layers 162 are provided such that the thicknesses decrease toward the central portion in the Y direction from both side surface portions of the memory trench structure MT in the Y direction, and the insulating layers 162 are separated from each other at the central portion in the Y direction to leave a gap. The insulating layer 162 is an insulating layer of, for example, silicon oxide (SiO2).

The insulating layer 124 is provided at a position where the upper surface of the gap 160 is partially covered at a gap between the insulating layers 162, and at a position where the upper surface portions of the insulating layers 162 are covered. The insulating layer 124 is, for example, an insulating layer of silicon oxide (SiO2).

The semiconductor layer 170 (FIG. 2) is a plate-shaped semiconductor layer extending in the X direction and the Y direction. The semiconductor layer 170 is, for example, a conductive layer of polycrystalline silicon (Si) in which an impurity is injected, and functions as a part of the source line SL (FIG. 1).

A semiconductor layer 171 and the semiconductor layer 172 extending in the X direction and the Y direction are provided at positions where the semiconductor layer 171 and the semiconductor layer 172 are in contact with the lower surface and the upper surface of the semiconductor layer 170, respectively. The semiconductor layer 171 and the semiconductor layer 172 are, for example, conductive layers of polycrystalline silicon (Si) in which an impurity is injected, and function as a part of the source line SL (see FIG. 1). The structure of the source line SL is properly changeable. For example, a part of the source line SL may include apart of the surface of the substrate 110. The source line SL may include, for example, a metal layer of titanium nitride (TiN), tungsten (W), etc.

Figure 4:
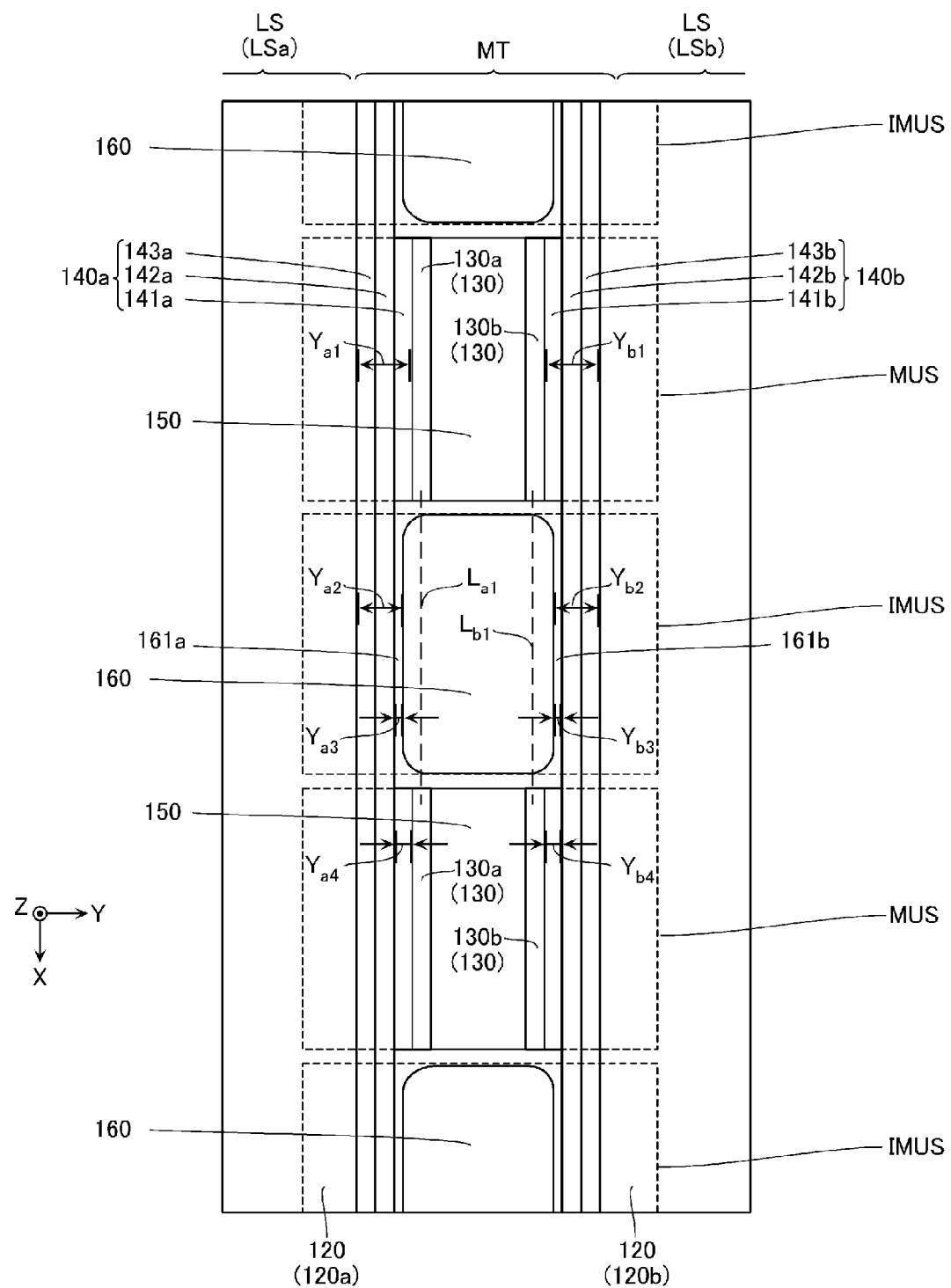
FIG. 4 is an enlarged-scale schematic view of portions corresponding to a memory unit structure MUS and the vicinity thereof in FIG. 3A.

Next, the structure of the gap 160 and its vicinity will be described in detail by using FIG. 4. FIG. 4 is an enlarged-scale schematic view of portions corresponding to the memory unit structure MUS, the inter-memory-unit structure IMUS, and the vicinity thereof in FIG. 3A.

The gap 160 is provided between the semiconductor layer 130 (the first semiconductor layer 130a and the second semiconductor layer 130b) in one of two memory unit structures MUS adjacent to each other in the X direction, and the semiconductor layer 130 (the first semiconductor layer 130a and the second semiconductor layer 130b) in the other memory unit structure MUS.

FIG. 4 illustrates a first virtual line La1 extending in the X direction to pass through two first semiconductor layers 130a adjacent in the X direction, and a second virtual line Lb1 extending in the X direction to pass through two second semiconductor layers 130b adjacent in the X direction. As exemplified in FIG. 4, the gap 160 may be provided such that the first virtual line La1 and the second virtual line Lb1 pass through a part of the gap 160.

As illustrated in FIG. 4, a distance Ya2 in the Y direction between the first conductive layer 120a and the gap 160 is smaller than a distance Ya1 in the Y direction between the first conductive layer 120a and the first semiconductor layer 130a. A distance Yb2 in the Y direction between the second conductive layer 120b and the gap 160 is smaller than a distance Yb1 in the Y direction between the second conductive layer 120b and the second semiconductor layer 130b.

A Y-direction width Ya3 of an insulating layer 161a provided between the gap 160 and the first charge storage layer 142a is smaller than a Y-direction width Ya4 of the first insulating layer 141a provided between the first semiconductor layer 130a and the first charge storage layer 142a. Likewise, a Y-direction width Yb3 of an insulating layer 161b provided between the gap 160 and the second charge storage layer 142b is smaller than a Y-direction width Yb4 of the second insulating layer 141b provided between the second semiconductor layer 130b and the second charge storage layer 142b. The width Ya3 of the insulating layer 161a and the width Yb3 of the insulating layer 161b may be zero.

In the example illustrated in FIG. 4, the width Ya3 is smaller than the width Ya4. Meanwhile, the width Ya3 may be larger than the width Ya4. In this case, the width Ya3 may be smaller than the sum of the width Ya4 and the Y-direction width of the first semiconductor layer 130a, or may be larger than the sum of these widths. Likewise, in the example illustrated in FIG. 4, the width Yb3 is smaller than the width Yb4. Meanwhile, the width Yb3 may be larger than the width Yb4. In this case, the width Yb3 may be smaller than the sum of the width Yb4 and the Y-direction width of the second semiconductor layer 130b, or may be larger than the sum of these widths.

In the example illustrated in FIG. 4, the first virtual line La1 and the second virtual line Lb1 pass through a part of the gap 160. Meanwhile, the gap 160 may be provided between the first virtual line La1 and the second virtual line Lb1 such that the first virtual line La1 and the second virtual line Lb1 do not pass through a part of the gap 160.

[Production Method]

Figure 5A:
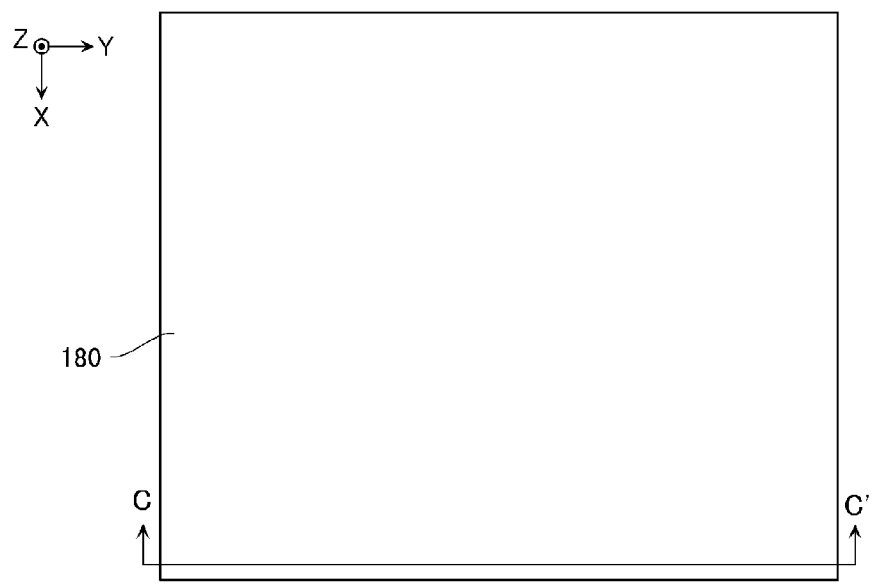
FIGS. 5A and 5B are a schematic plan view and a sectional view illustrating a production method of the same semiconductor storage device.
Figure 5B:
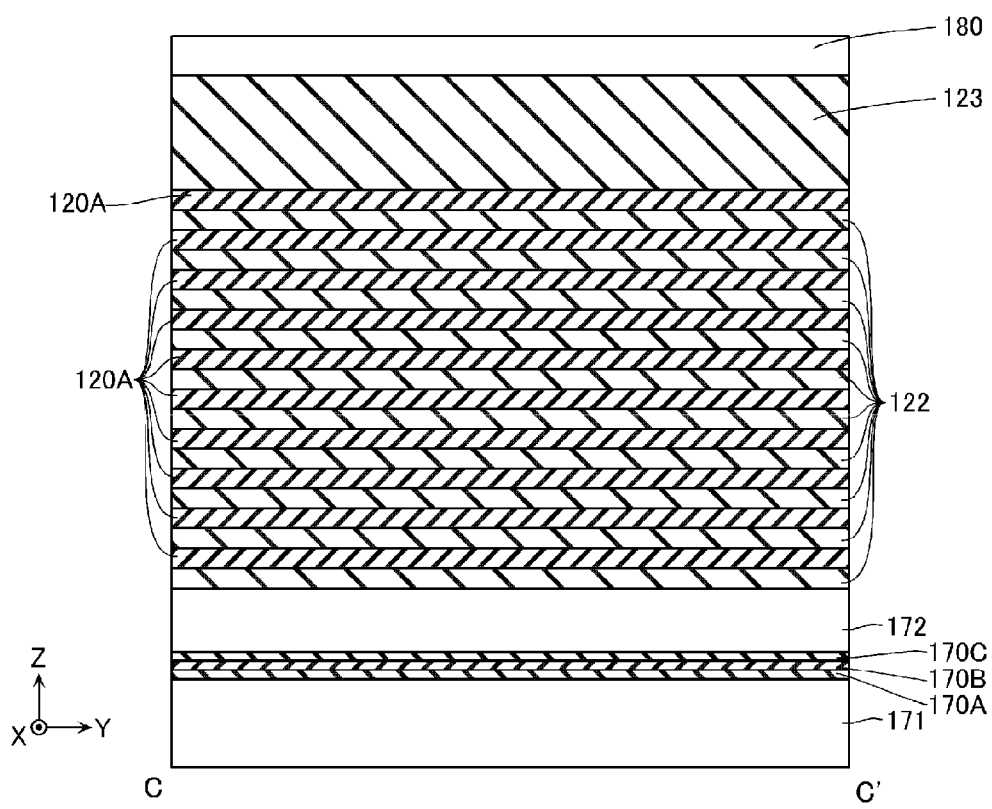
Figure 6:
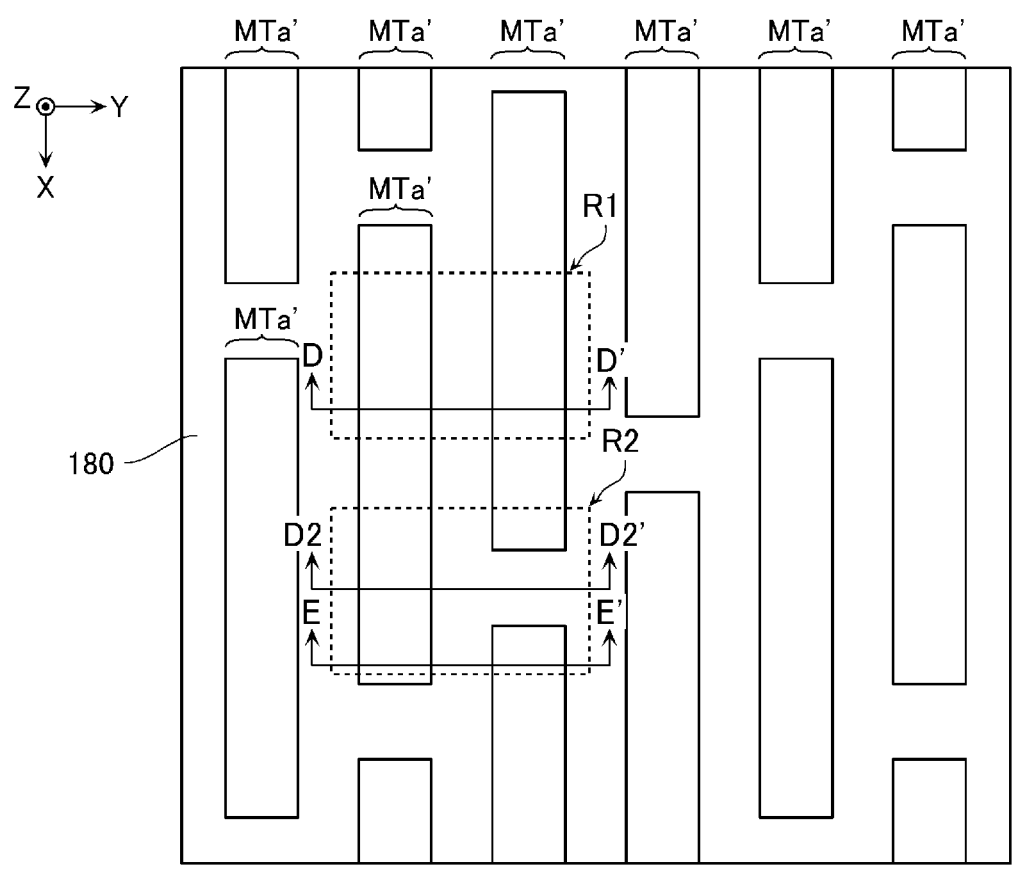
FIG. 6 is a schematic plan view illustrating the same production method.

Next, a production method of the semiconductor storage device according to at least one embodiment will be described with reference to FIGS. 5A and 5B to FIGS. 36A and 36B. FIG. 5A is a schematic plan view illustrating the same production method. FIG. 5B is a schematic sectional view illustrating the same production method, and illustrates a cross-section corresponding to the line C-C' in FIG. 5A. FIG. 6 is a schematic plan view illustrating the same production method.

Figure 7A:
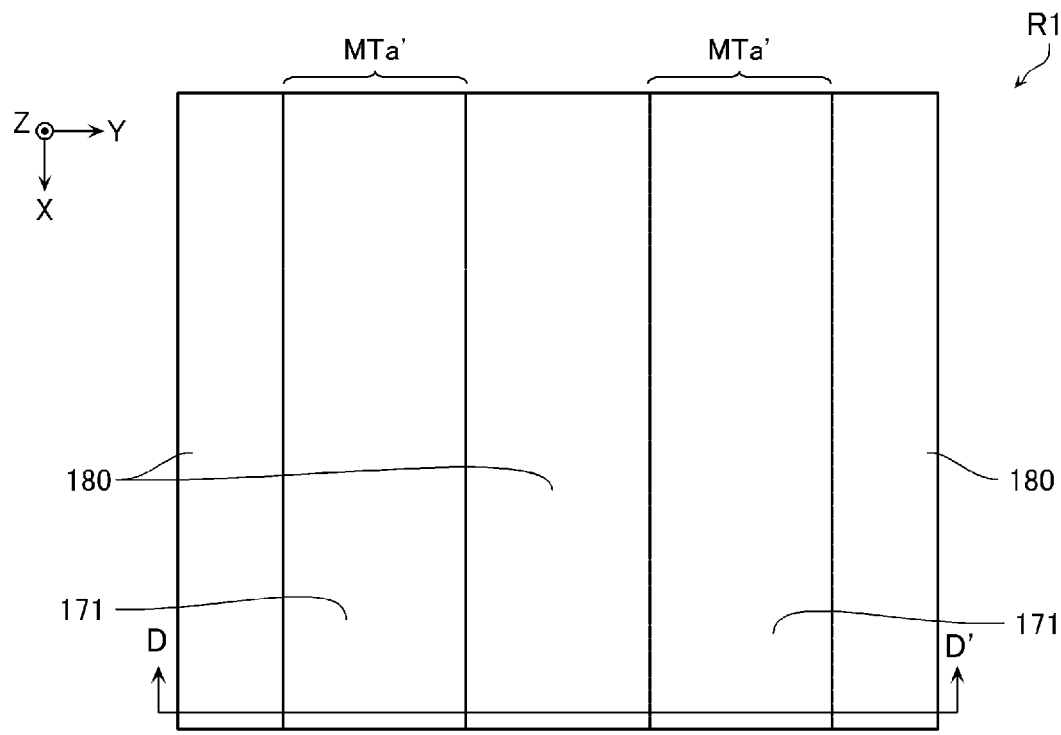
FIGS. 7A and 7B are a schematic plan view and a sectional view illustrating the same production method.
Figure 9A:
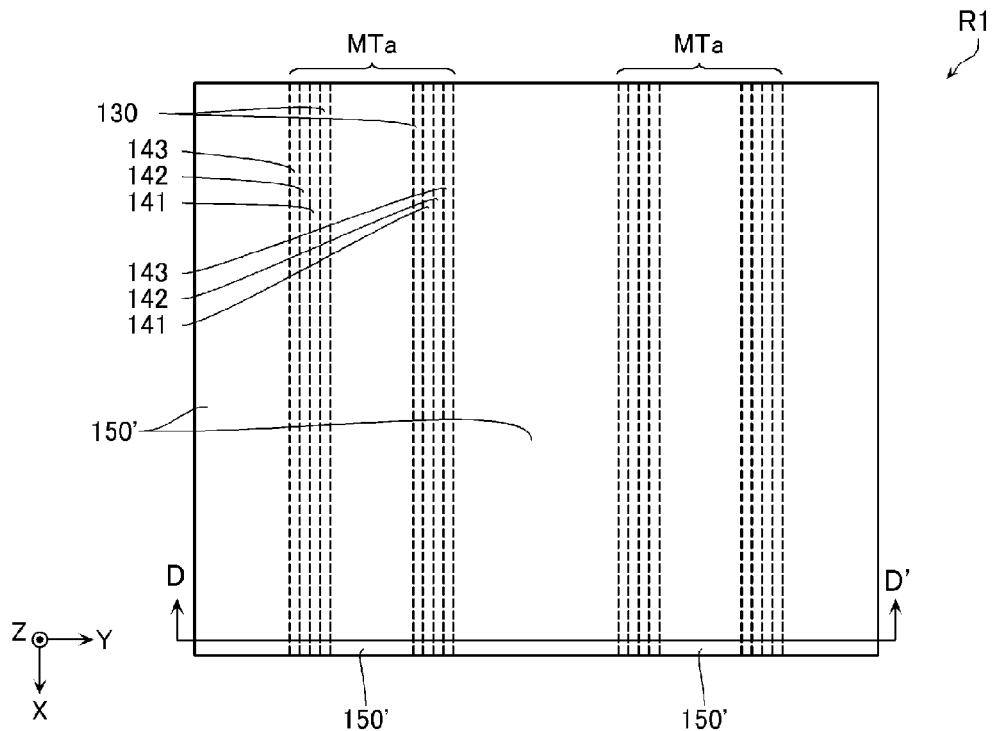
FIGS. 9A and 9B are a schematic plan view and a sectional view illustrating the same production method.

FIG. 7A, FIG. 9A, . . . , FIG. 23A, FIG. 31A, FIG. 33A, FIG. 35A, and FIG. 36A are schematic plan views illustrating the same production method, and are enlarged-scale views corresponding to the region R1 illustrated in FIG. 6.

Figure 7B:
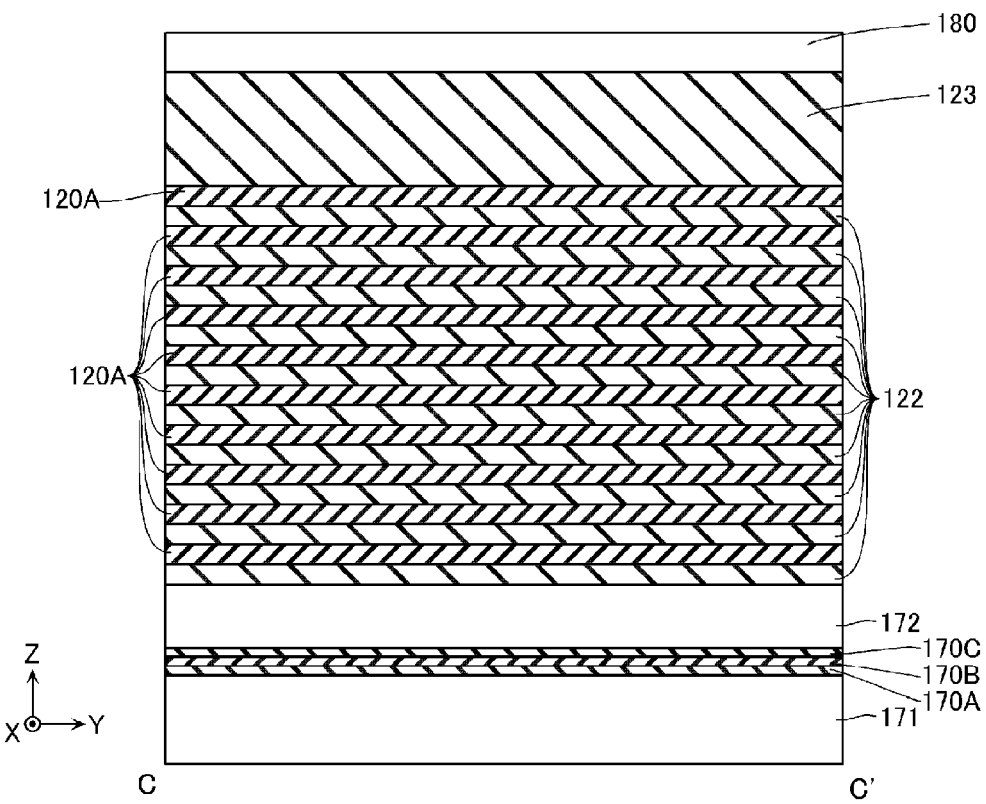
Figure 9B:
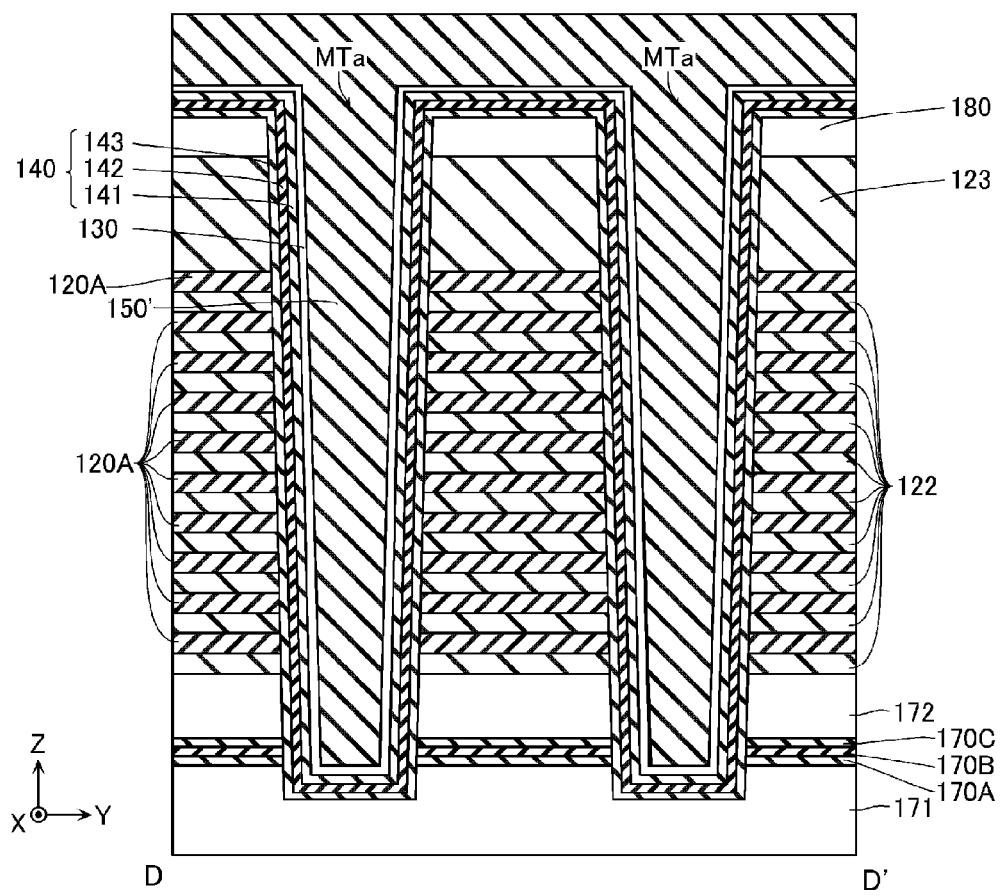

FIG. 7B, FIG. 9B, . . . , FIG. 23B, FIG. 31B, FIG. 33B, FIG. 35B, and FIG. 36B are schematic sectional views illustrating the same production method, and illustrate cross-sections corresponding to the line D-D' in FIG. 7A, FIG. 9A, . . . , FIG. 23A, FIG. 31A, FIG. 33A, FIG. 35A, and FIG. 36A.

Figure 8A:
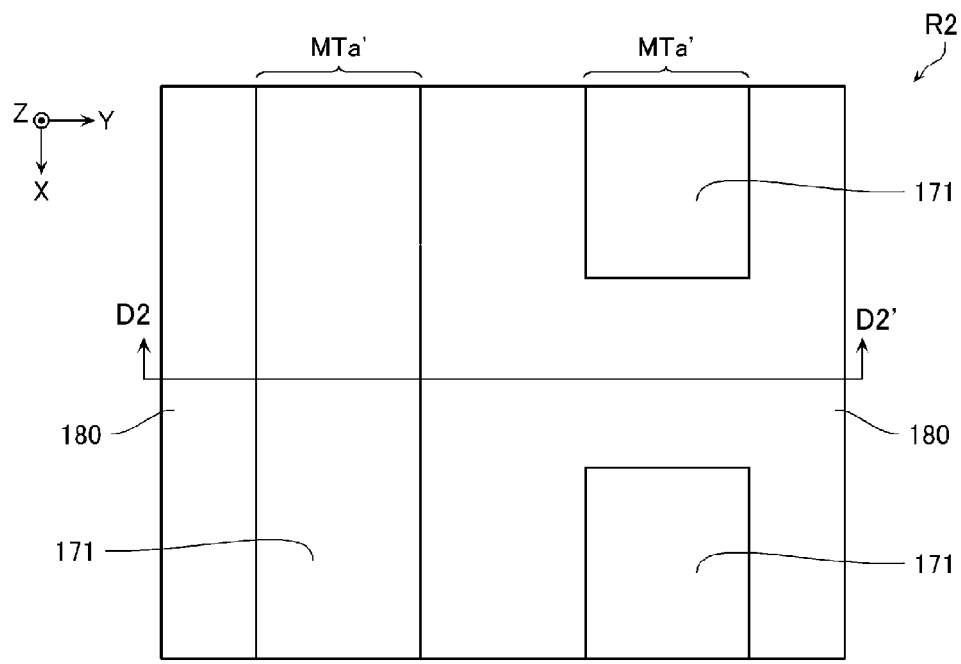
FIGS. 8A and 8B are a schematic plan view and a sectional view illustrating the same production method.
Figure 24A:
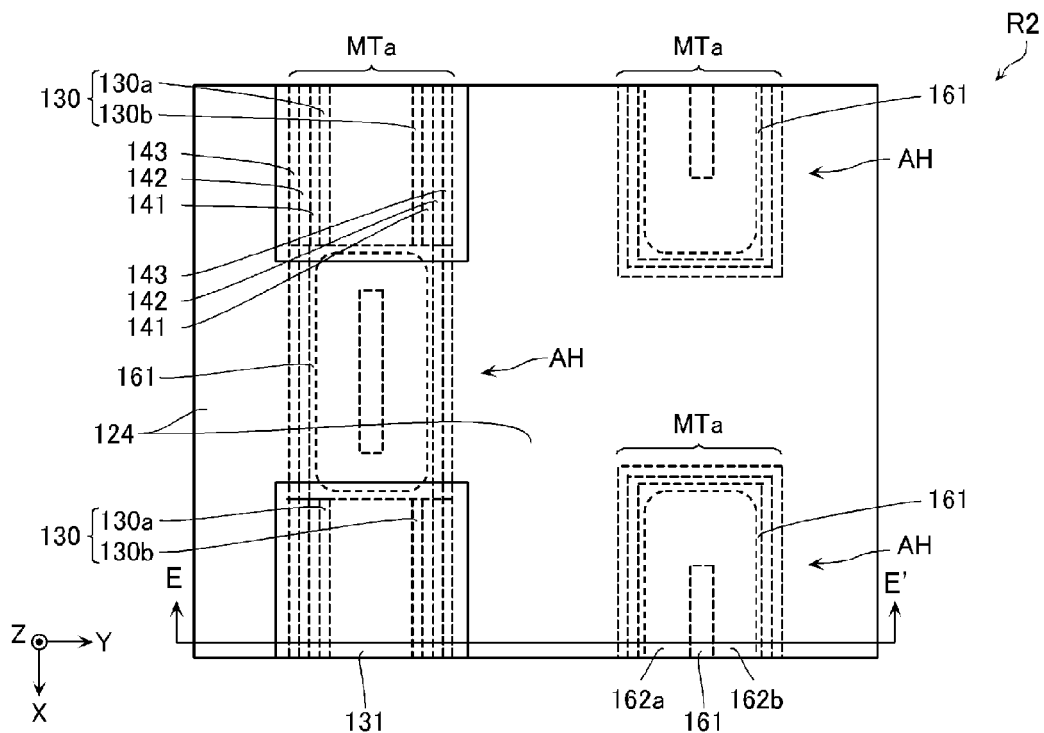
FIGS. 24A and 24B are a schematic plan view and a sectional view illustrating the same production method.
Figure 30A:
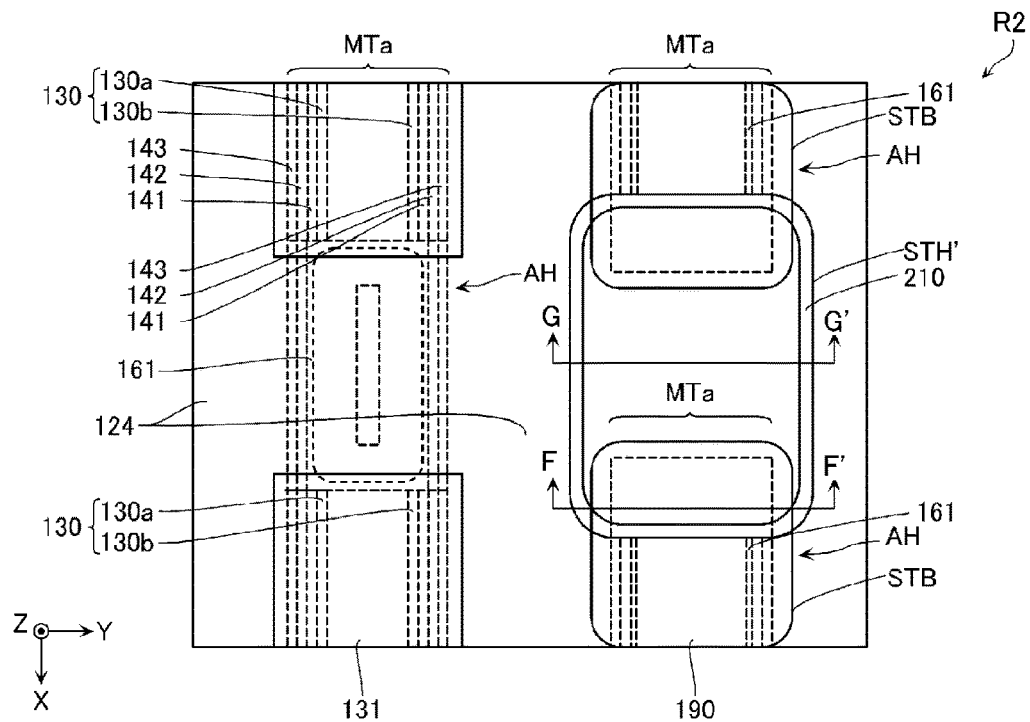
FIGS. 30A to 30C are a schematic plan view and a sectional view illustrating the same production method.
Figure 30B:
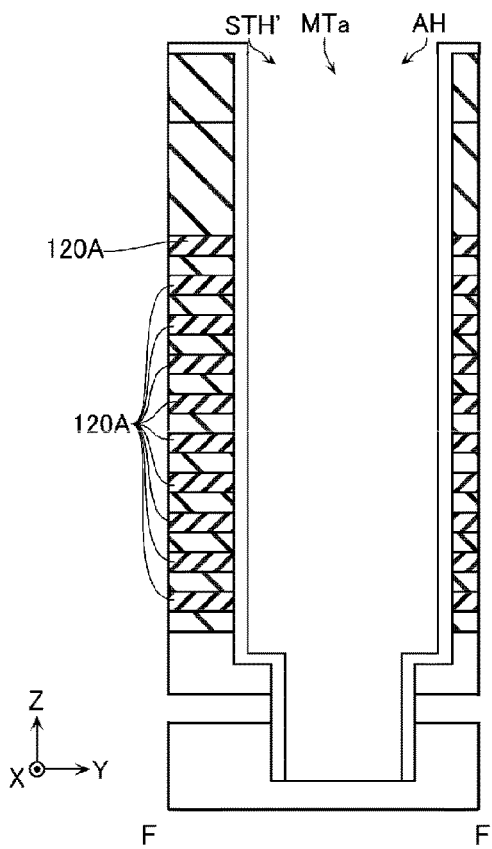
Figure 30C:
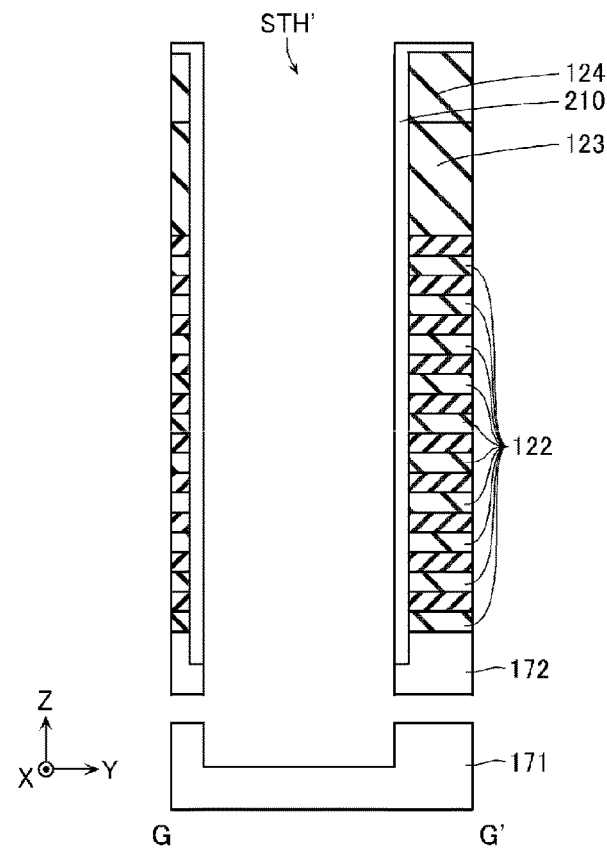
Figure 32A:
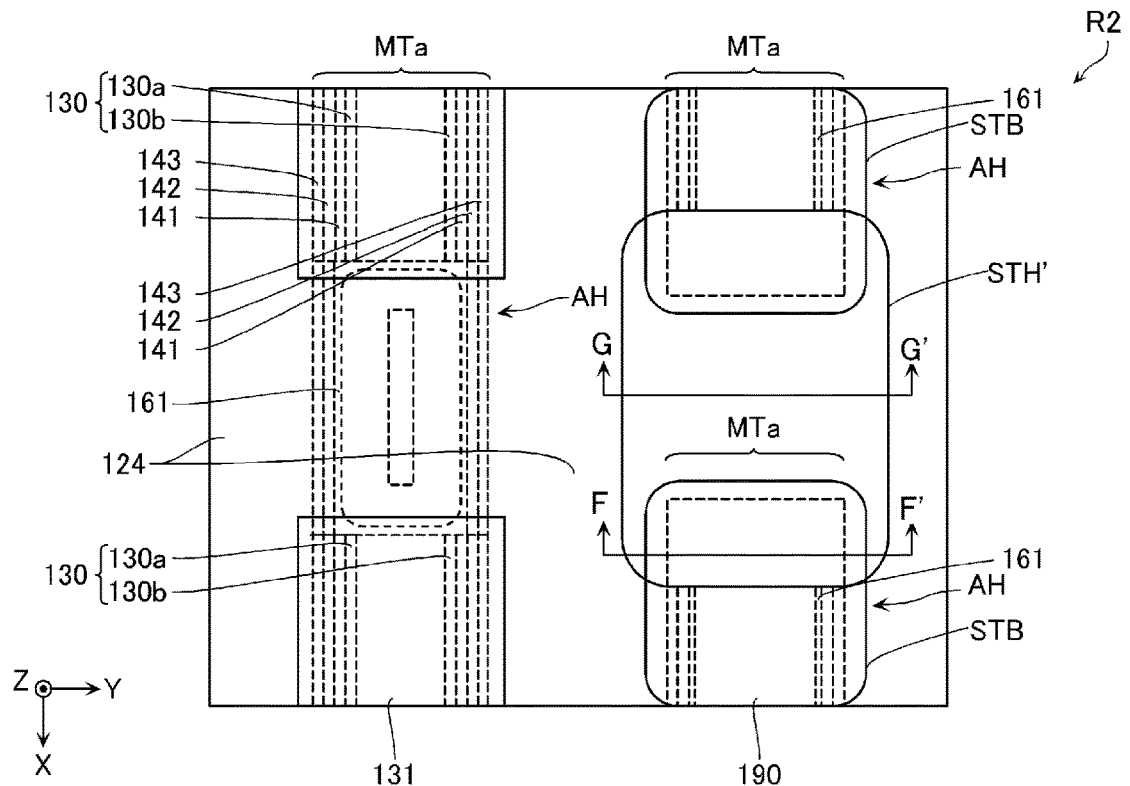
FIGS. 32A to 32C are a schematic plan view and a sectional view illustrating the same production method.
Figure 34A:
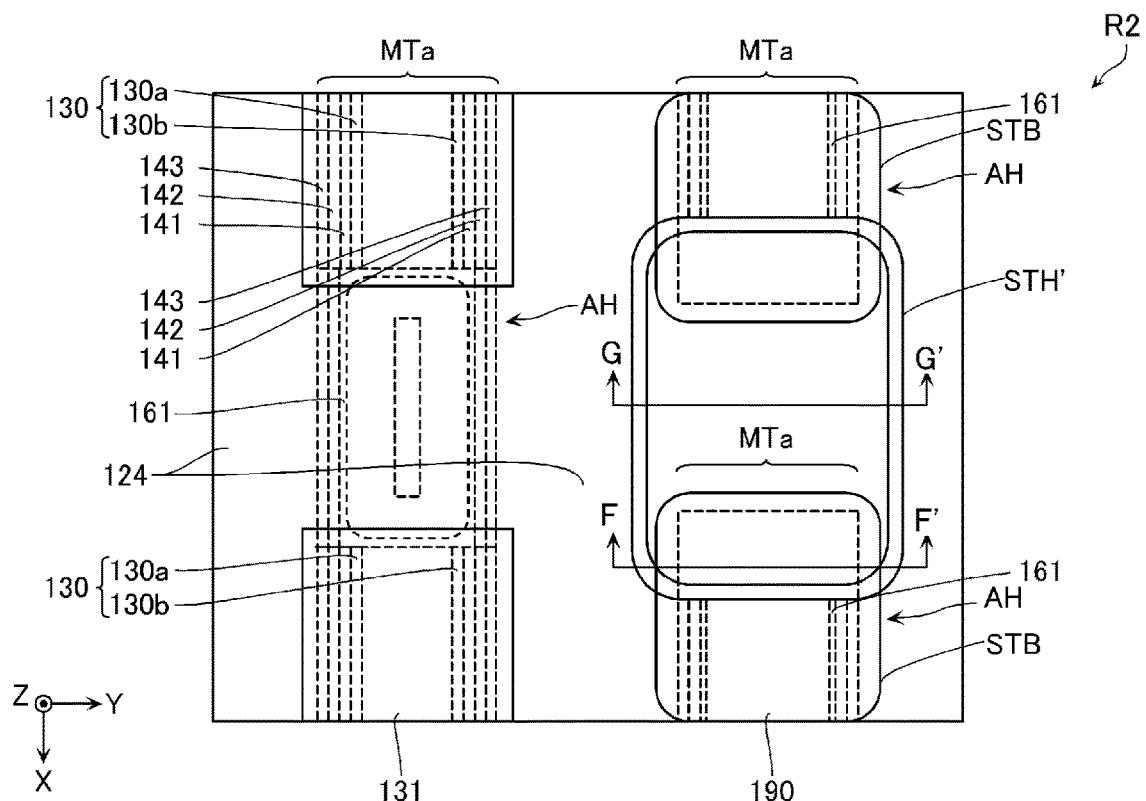
FIGS. 34A to 34C are a schematic plan view and a sectional view illustrating the same production method.
Figure 34B:
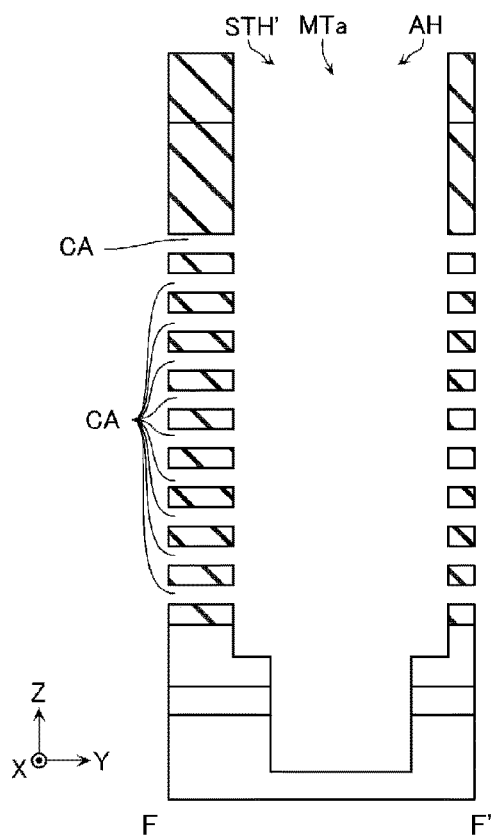
Figure 34C:
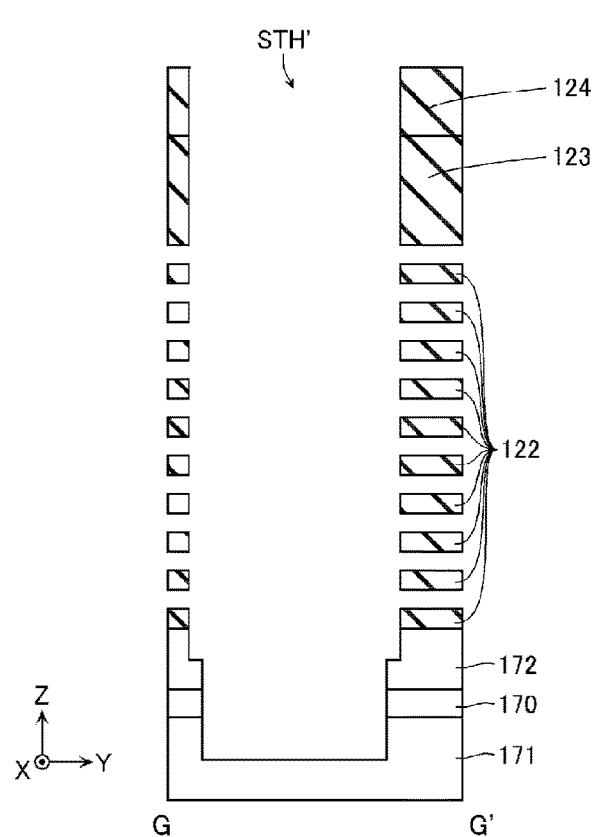
Figure 35A:
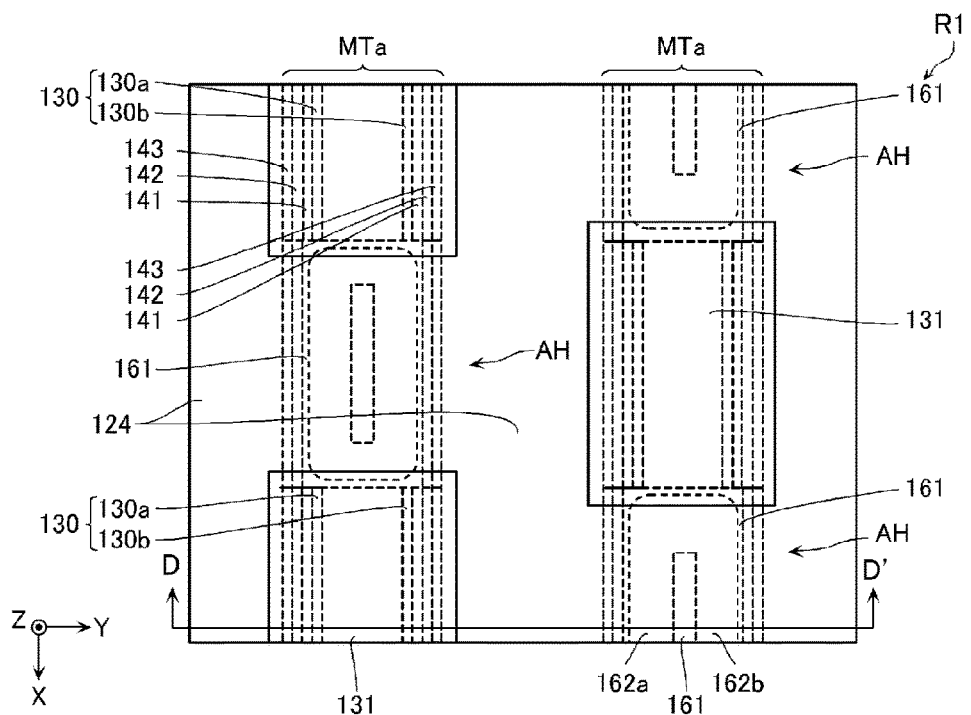
FIGS. 35A and 35B are a schematic plan view and a sectional view illustrating the same production method.
Figure 35B:
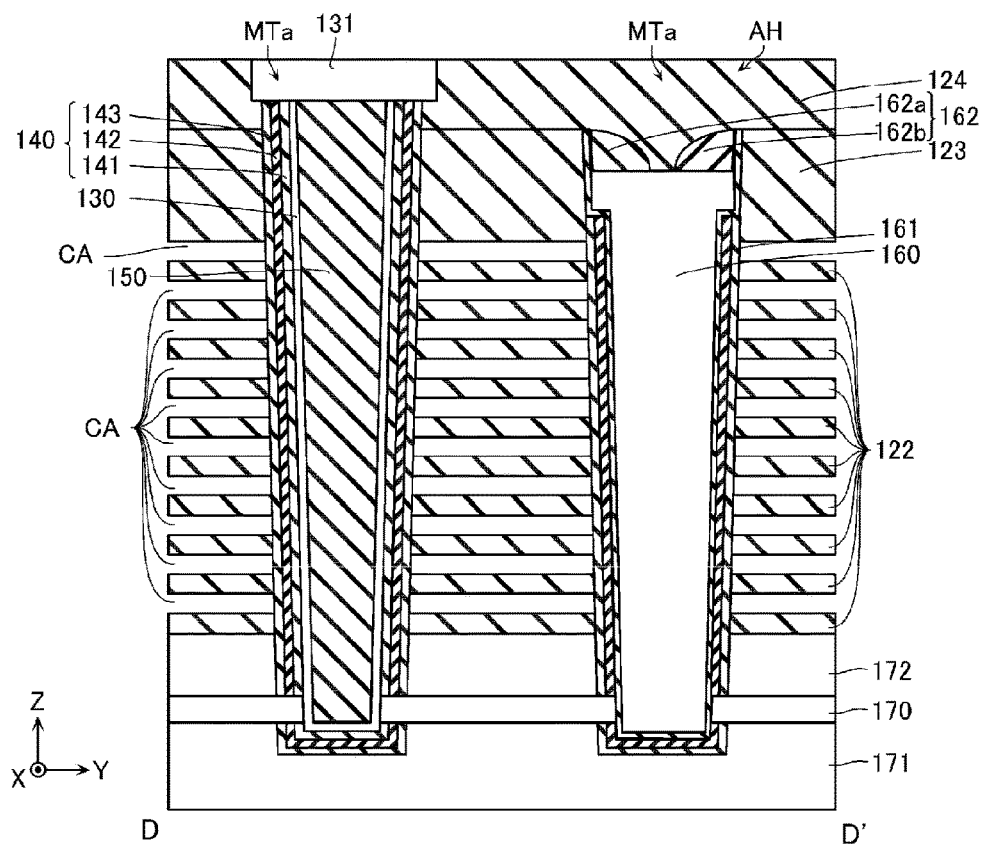

FIG. 8A, FIG. 24A, . . . , FIG. 30A, FIG. 32A, and FIG. 34A are schematic plan views illustrating the same production method, and are enlarged-scale views corresponding to the region R2 illustrated in FIG. 6.

Figure 8B:
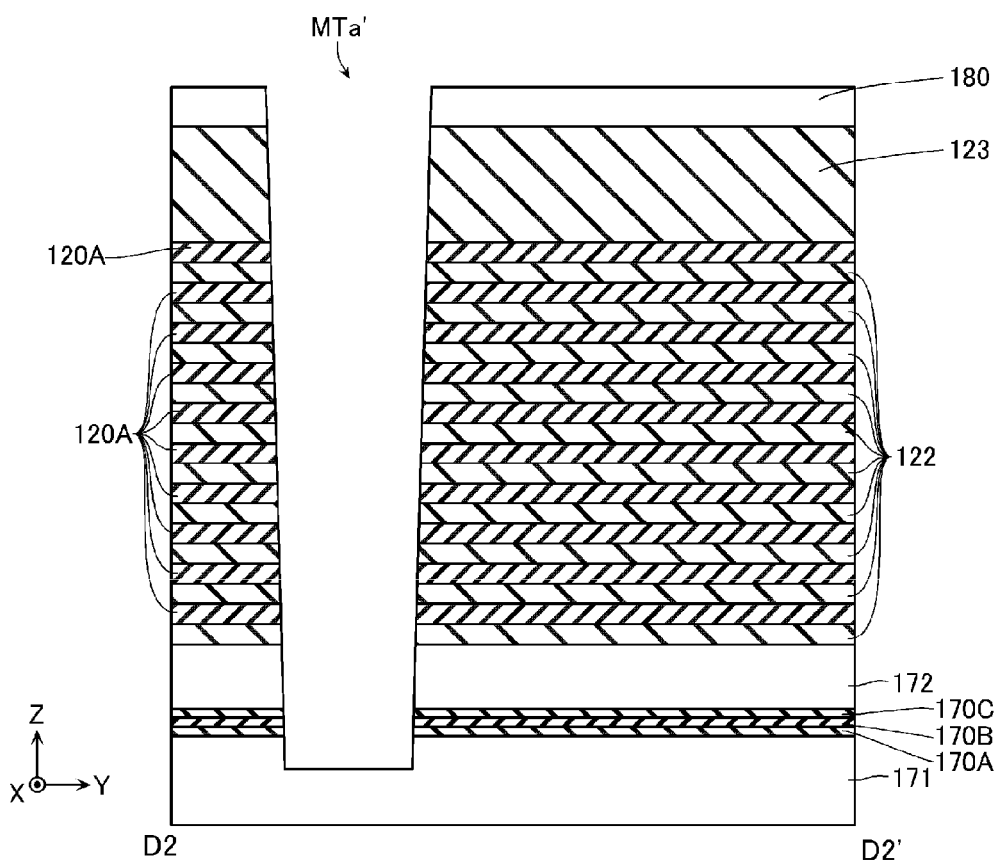
Figure 24B:
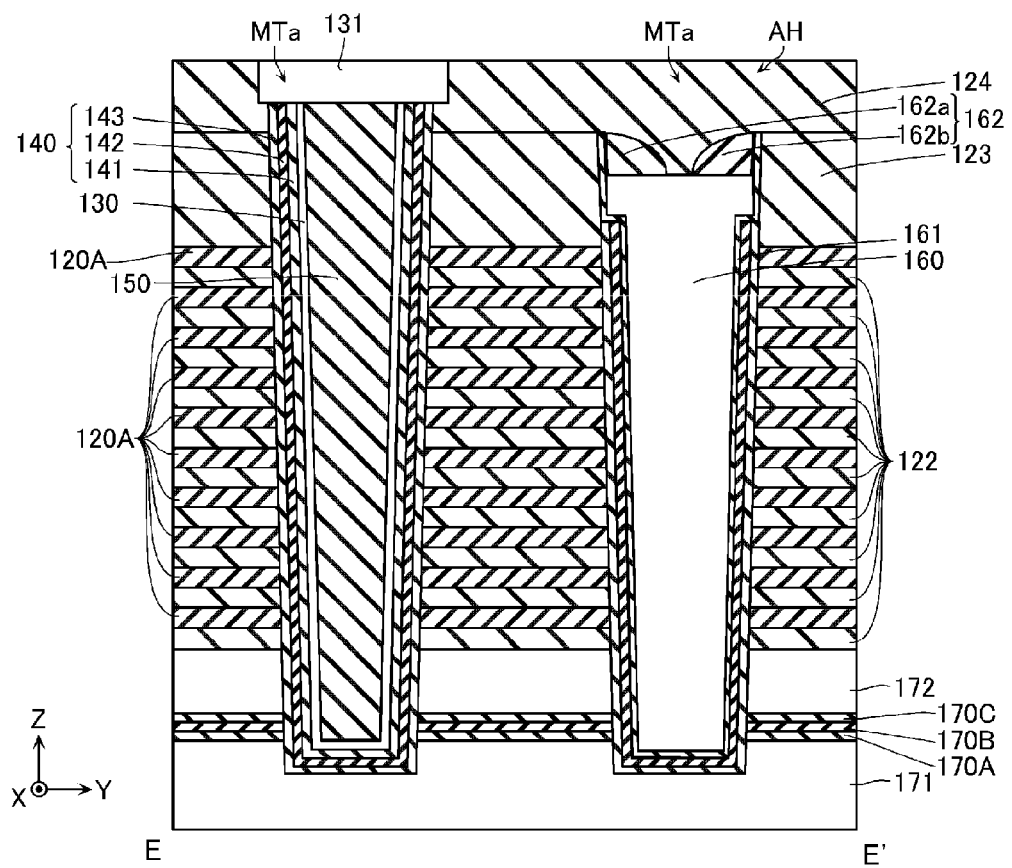
Figure 26A:
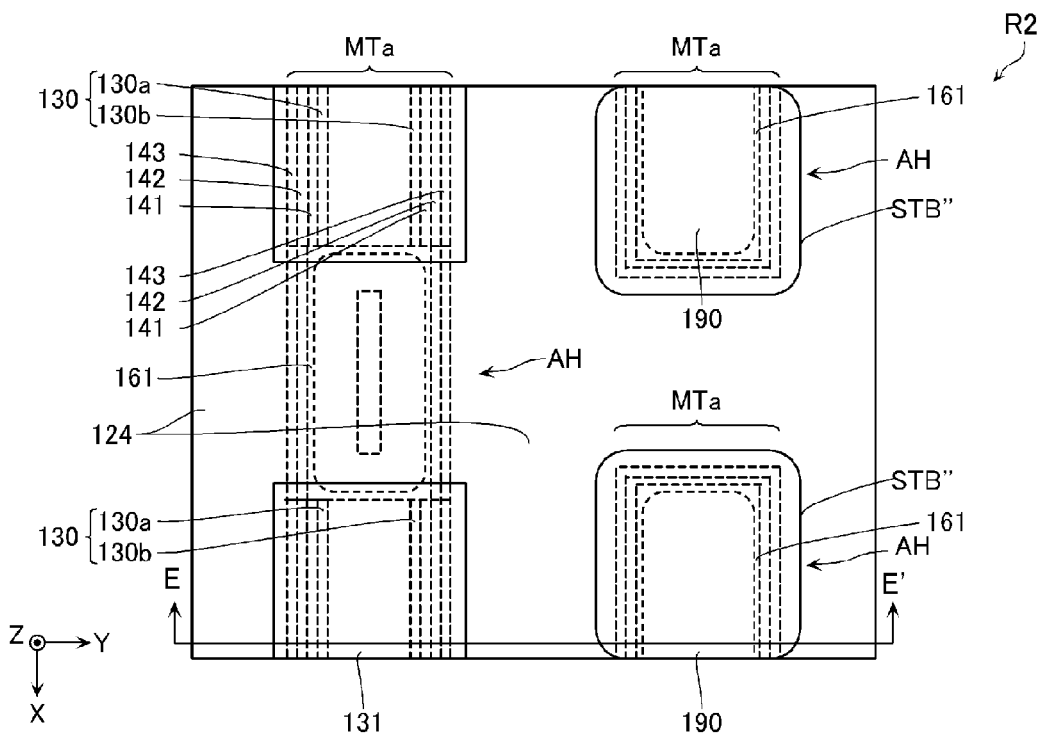
FIGS. 26A and 26B area schematic plan view and a sectional view illustrating the same production method.
Figure 26B:
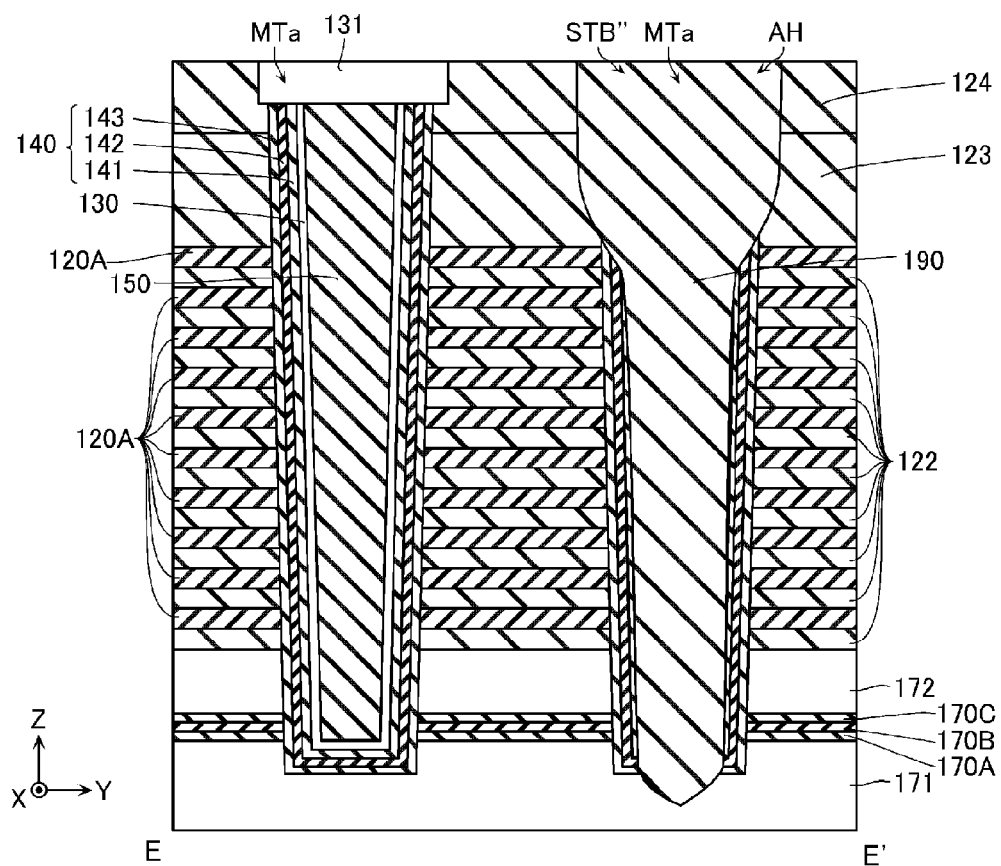

FIG. 8B, and FIG. 24B, . . . , FIG. 26B are schematic sectional views illustrating the same production method, and illustrate cross-sections corresponding to the line D2-D2' in FIG. 8A, and the line E-E' in FIG. 24A, . . . , FIG. 26A.

Figure 27A:
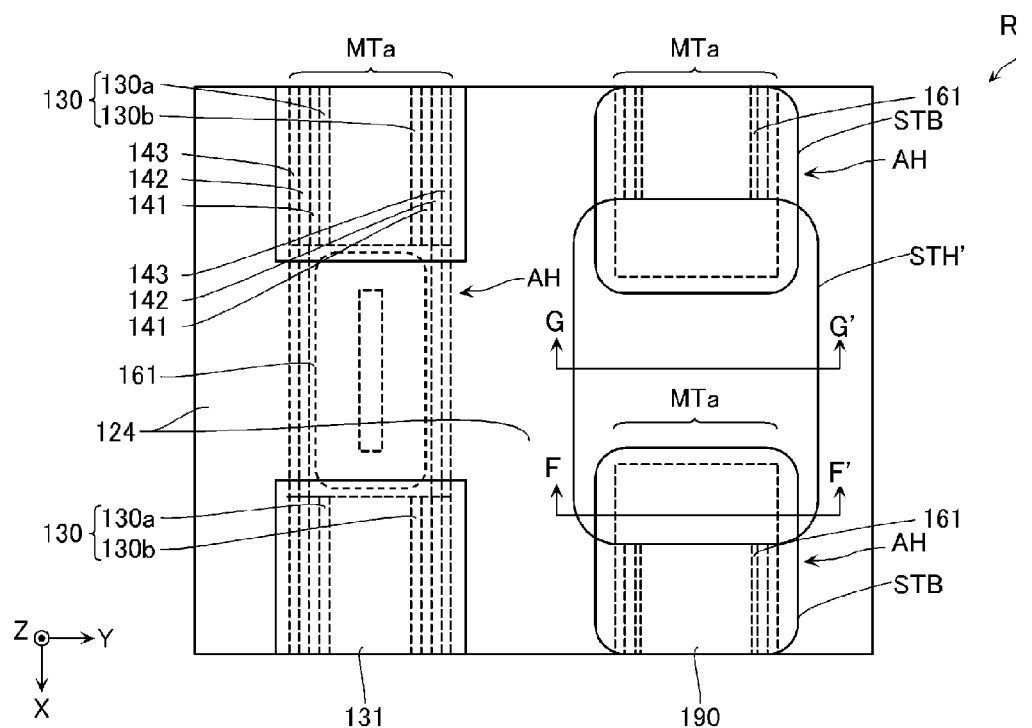
FIGS. 27A to 27C are a schematic plan view and a sectional view illustrating the same production method.
Figure 27B:
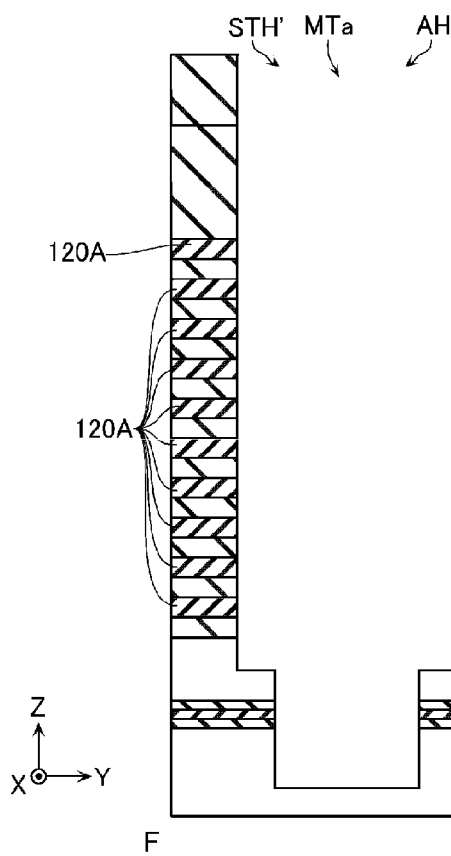
Figure 27C:
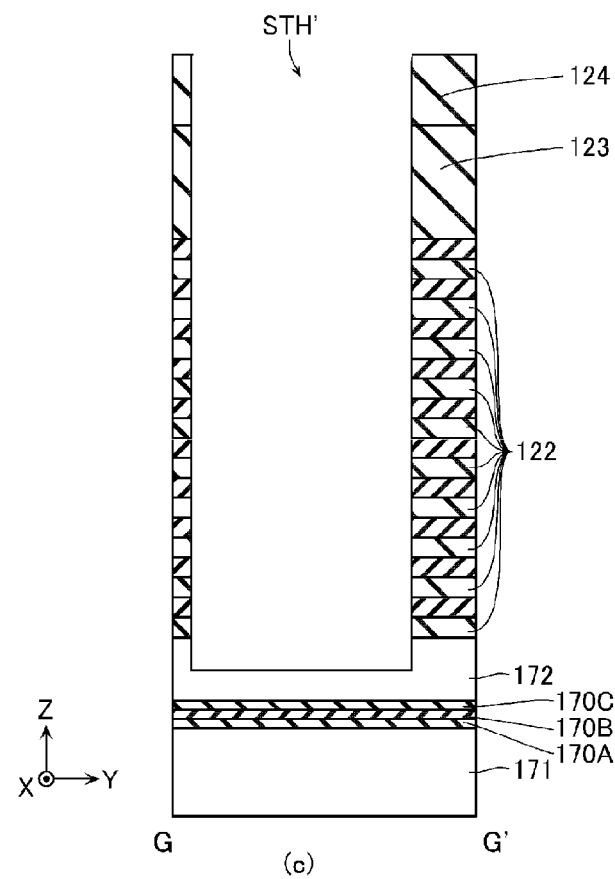

FIGS. 27B and 27C, . . . FIGS. 30B and 30C, FIGS. 32B and 32C, and FIGS. 34B and 34C are schematic sectional views illustrating the same production method, and illustrate cross-sections corresponding to the line F-F' and the line G-G' in FIG. 27A, . . . , FIG. 30A, FIG. 32A, and FIG. 34A.

In the following description, the first semiconductor layer 130a and the second semiconductor layer 130b may be referred to as the semiconductor layer 130. The first insulating layer 141a and the second insulating layer 141b may be referred to as an insulating layer 141. The first charge storage layer 142a and the second charge storage layer 142b may be referred to as a charge storage layer 142. The first block insulating layer 143a and the second block insulating layer 143b may be referred to as a block insulating layer 143.

As illustrated in FIGS. 5A and 5B, in the same production method, the semiconductor layer 171 is formed above the substrate 110 (not illustrated). An insulating layer 170A, an insulating layer 170B, an insulating layer 170C, and the semiconductor layer 172 are formed on the upper surface of the semiconductor layer 171. The insulating layer 170A and the insulating layer 170C are made of, for example, silicon oxide (SiO2), etc. The insulating layer 170B is made of, for example, silicon nitride (SiN). The plurality of insulating layers 122 and a plurality of sacrificial layers 120A are alternately stacked on the upper surface of the semiconductor layer 172. The insulating layer 123 and a semiconductor layer 180 are formed on the upper surface of the uppermost sacrificial layer 120A. The sacrificial layer 120A is made of, for example, silicon nitride (SiN). The insulating layer 123 is made of, for example, silicon oxide (SiO2). The semiconductor layer 180 is made of, for example, amorphous silicon (Si). The film deposition for the semiconductor layer 171, the insulating layer 170A, the insulating layer 170B, the insulating layer 170C, the semiconductor layer 172, the insulating layers 122, the sacrificial layers 120A, the insulating layer 123, and the semiconductor layer 180 is performed by, for example, chemical vapor deposition (CVD).

Next, as illustrated in FIG. 6, from the upper surface of the structure illustrated in FIGS. 5A and 5B, a plurality of openings MTa' having a constant width in the Y direction, and extending in the X direction is formed. The plurality of openings MTa' are arranged at a predetermined cycle in the X direction and the Y direction.

As illustrated in FIGS. 7A and 7B and FIGS. 8A and 8B, the opening MTa' extends in the Z direction, and partially divides the semiconductor layer 180, the insulating layer 123, the sacrificial layers 120A and the insulating layers 122, the semiconductor layer 172, the insulating layer 170C, the insulating layer 170B, and the insulating layer 170A in the Y direction so that the upper surface of the semiconductor layer 171 is exposed. In this step, as illustrated in FIGS. 8A and 8B, a portion in the plurality of sacrificial layers 120A stacked in the Z direction, which is provided between two openings MTa' adjacent in the X direction, is not divided in the Y direction. For example, an insulating layer having openings in portions corresponding to the openings MTa' is formed on the upper surface of the structure illustrated in FIG. 5B, and this insulating layer is used as a mask to perform reactive ion etching (RIE) so that the openings MTa' are formed.

Next, as illustrated in FIGS. 9A and 9B, the film deposition of the block insulating layer 143, the charge storage layer 142, the insulating layer 141, and the semiconductor layer 130 is performed on the upper surface of the semiconductor layer 180, and the lower surface and the side surfaces of the opening MTa'. The film deposition of an insulating layer 150' for filling the opening MTa' is performed on the upper surface of the semiconductor layer 130 to form a structure MTa. This step is performed by, for example, a method such as CVD. When the semiconductor layer 130 is formed, the film deposition of an amorphous silicon layer is performed, and in any of steps after this step, heating treatment or the like is performed to modify the crystal structure of the amorphous silicon layer so that the semiconductor layer 130 of polycrystalline silicon (Si) may be formed.

Figure 10A:
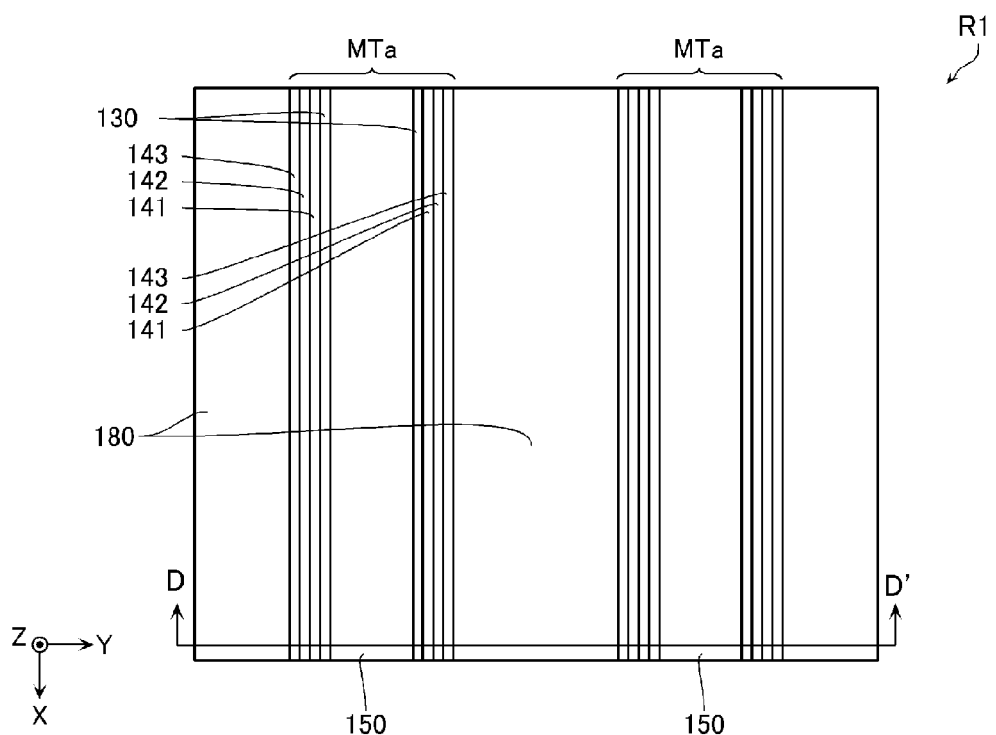
FIGS. 10A and 10B are a schematic plan view and a sectional view illustrating the same production method.
Figure 10B:
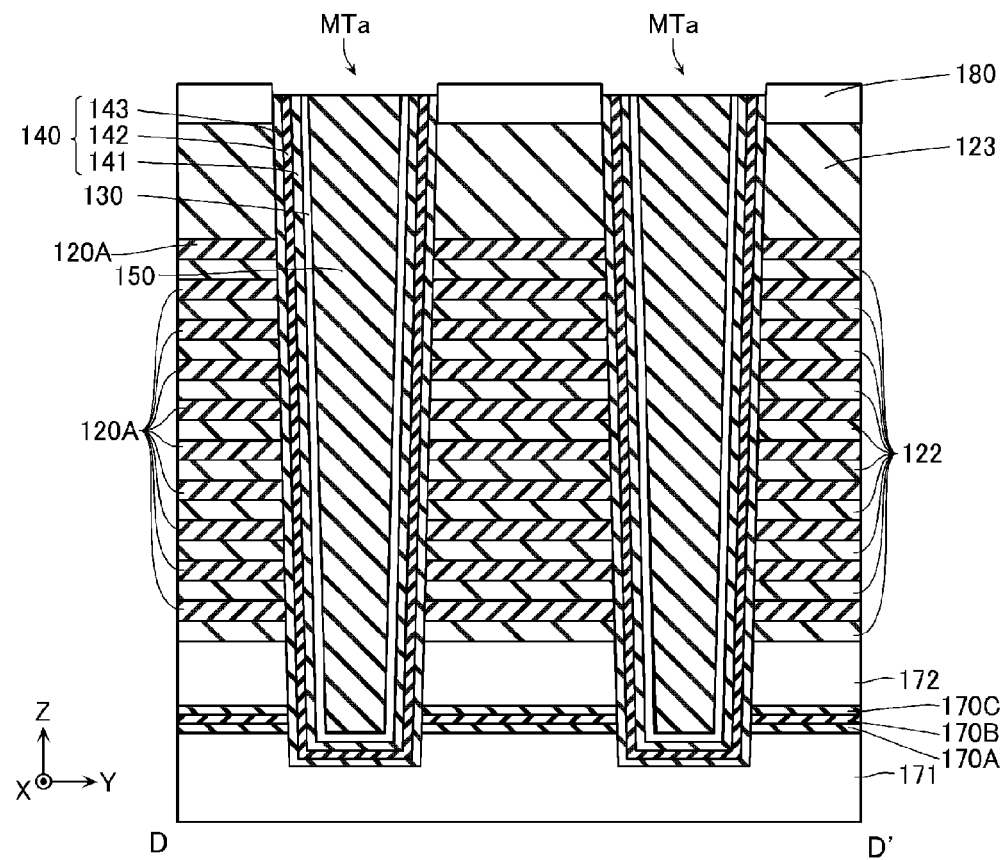

Next, as illustrated in FIGS. 10A and 10B, from the upper surface of the structure illustrated in FIG. 9B, the insulating layer 150', the semiconductor layer 130, the insulating layer 141, the charge storage layer 142, and the block insulating layer 143 are partially removed. In this step, the semiconductor layer 180 serves as an etching stopper, and the portion of the structure MTa is removed up to a position lower than the upper surface of the semiconductor layer 180. Then, the insulating layer 150 is formed within the structure MTa. This step is performed by, for example, wet etching or the like.

Figure 11A:
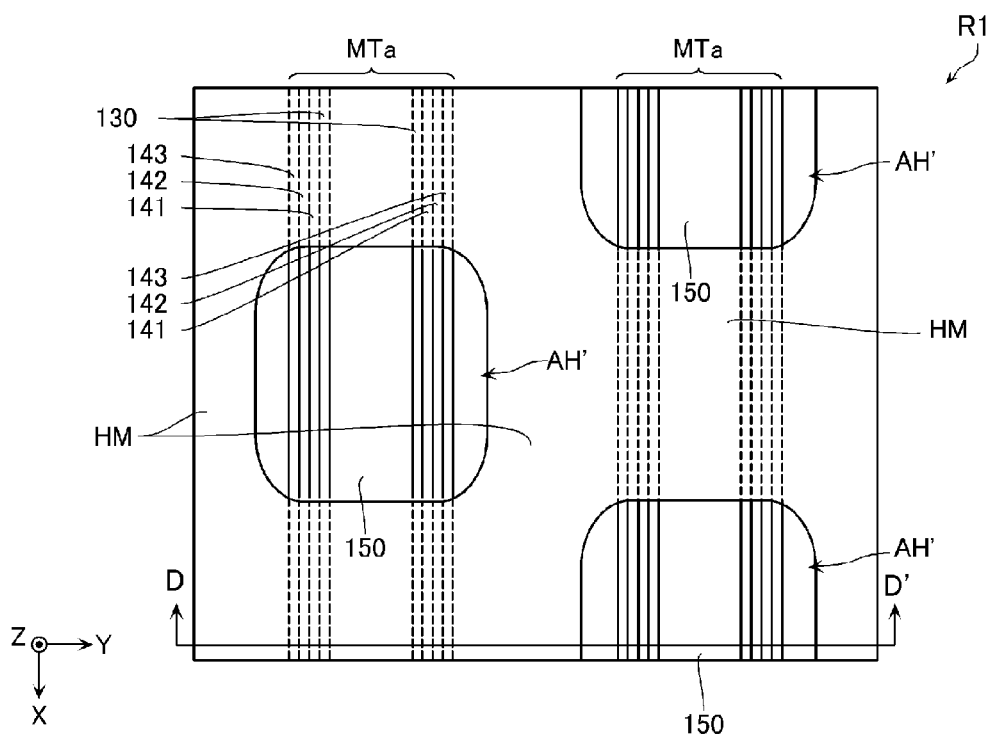
FIGS. 11A and 11B area schematic plan view and a sectional view illustrating the same production method.
Figure 11B:
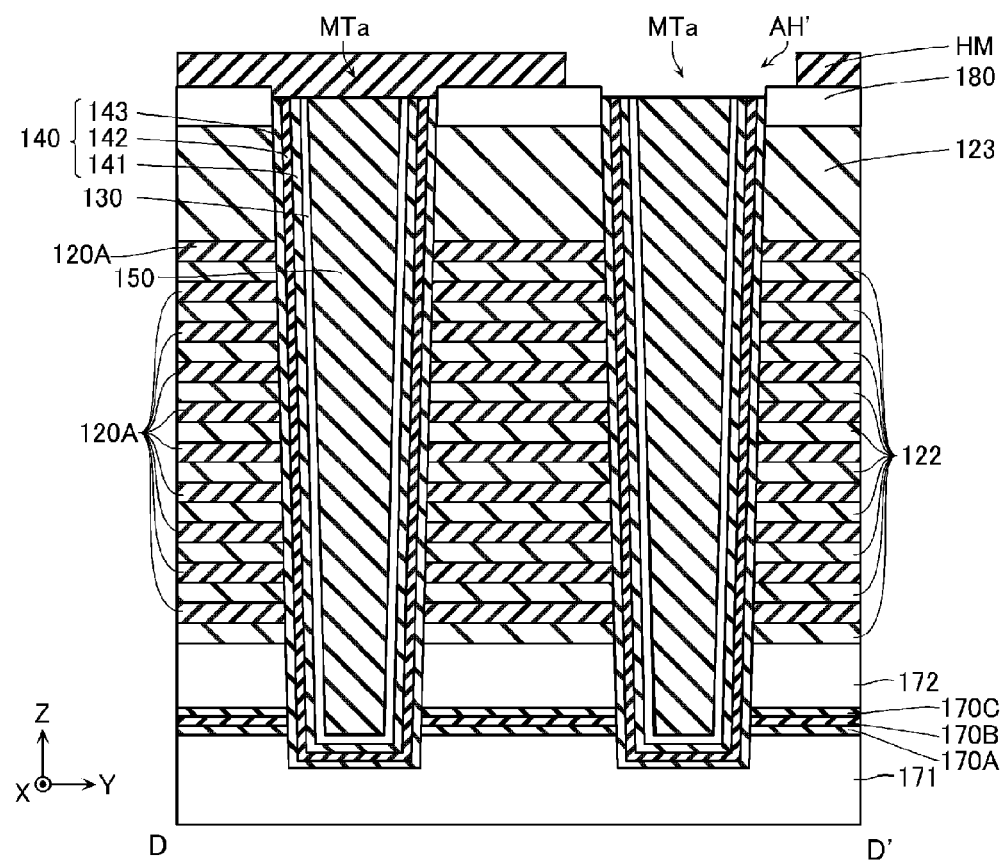

Next, as illustrated in FIGS. 11A and 11B, a hard mask HM such as an oxide film is formed on the upper surface of the structure illustrated in FIG. 10B, and openings AH' are formed in the hard mask HM. The formation of the hard mask HM is performed by, for example, CVD, etc. The formation of the openings AH' is performed by a method such as, for example, photolithography or wet etching.

Figure 12A:
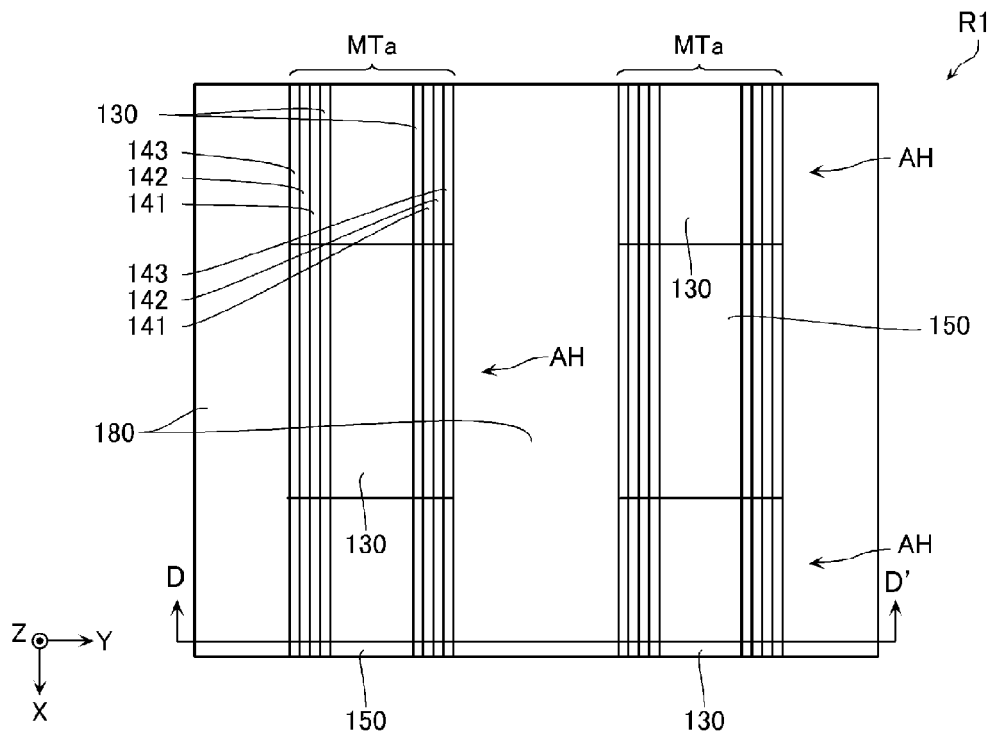
FIGS. 12A and 12B are a schematic plan view and a sectional view illustrating the same production method.
Figure 12B:
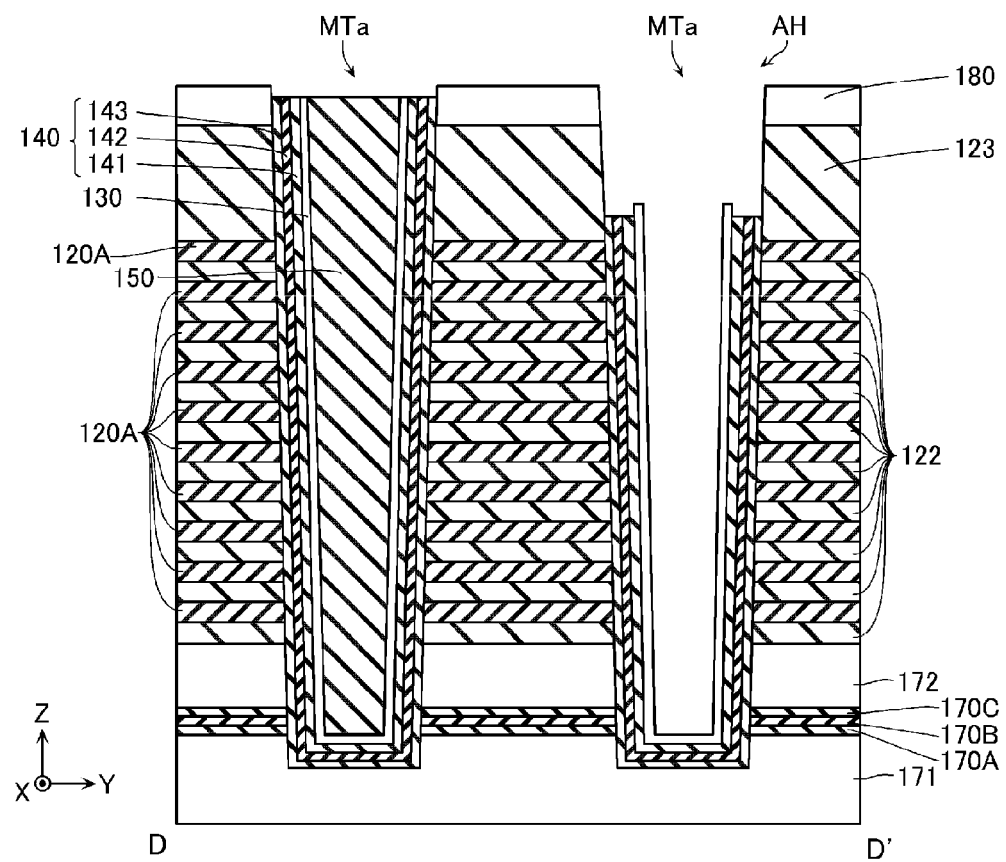

Next, as illustrated in FIGS. 12A and 12B, a portion of the insulating layer 150, which is provided at a position corresponding to the opening AH', is removed, and then the hard mask HM is removed. This step is performed by, for example, RIE, etc. In this step, apart of the semiconductor layer 130, apart of the insulating layer 141, apart of the charge storage layer 142, and a part of the block insulating layer 143 are also simultaneously removed up to a position higher than the uppermost sacrificial layer 120A. Since this step uses the semiconductor layer 180 as a mask, the etching rate of the semiconductor layer 130 of the same material as the semiconductor layer 180 is slow, and thus the upper surface of the semiconductor layer 130 is formed at a position higher than the upper surfaces of the insulating layer 141, the charge storage layer 142, and the block insulating layer 143. In the following steps, a region where the opening AH' was present is referred to as a region AH.

Figure 13A:
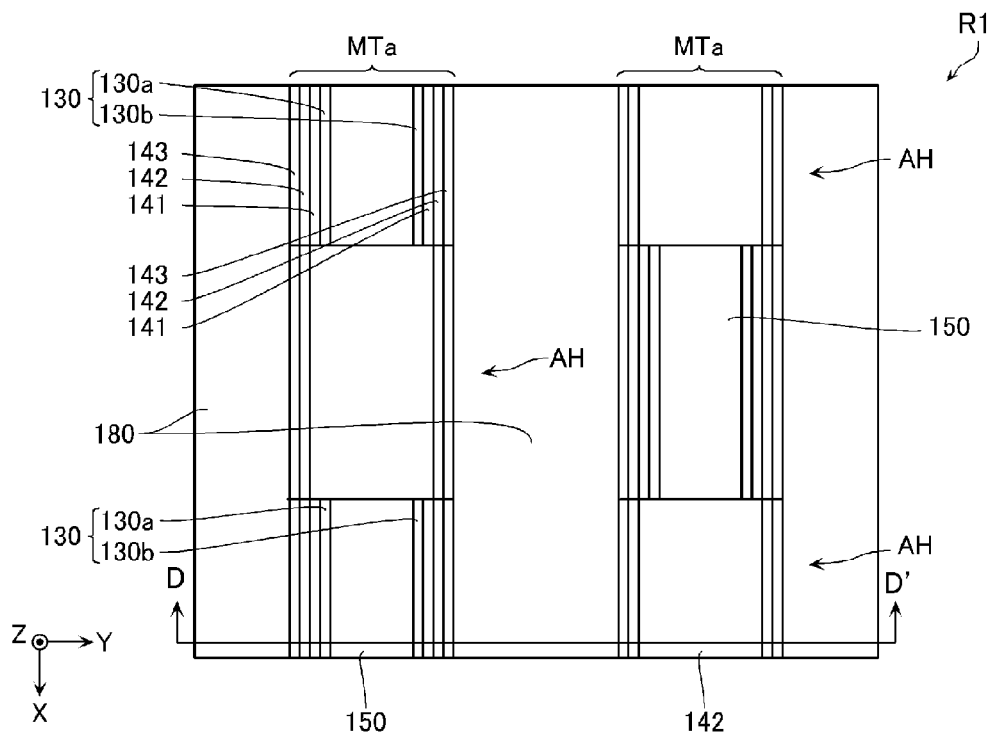
FIGS. 13A and 13B are a schematic plan view and a sectional view illustrating the same production method.
Figure 13B:
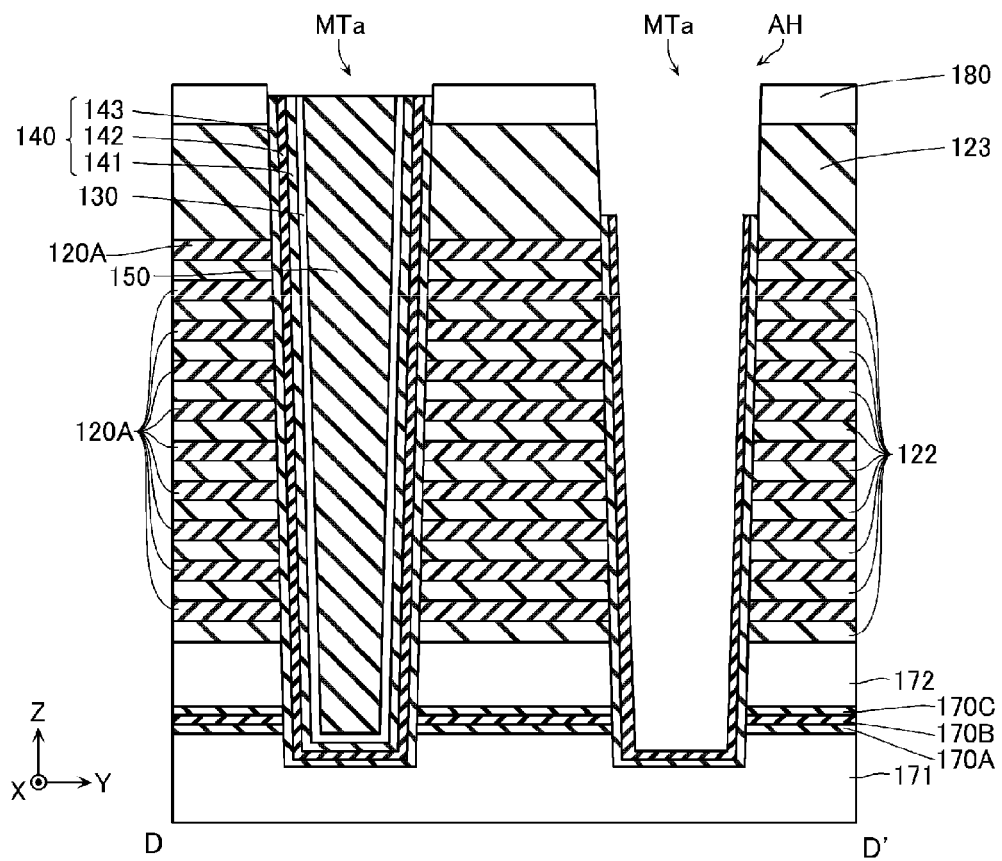

Next, as illustrated in FIGS. 13A and 13B, portions of the semiconductor layer 130 and the insulating layer 141 in the structure MTa, which are exposed at a position corresponding to the region AH, are removed. This step is performed by, for example, isotropic etching through RIE, etc. Through this step, a portion of the semiconductor layer 130 provided within the structure MTa is divided in the X direction, and the first semiconductor layers 130a and the second semiconductor layers 130b arranged in the X direction are formed.

Figure 14A:
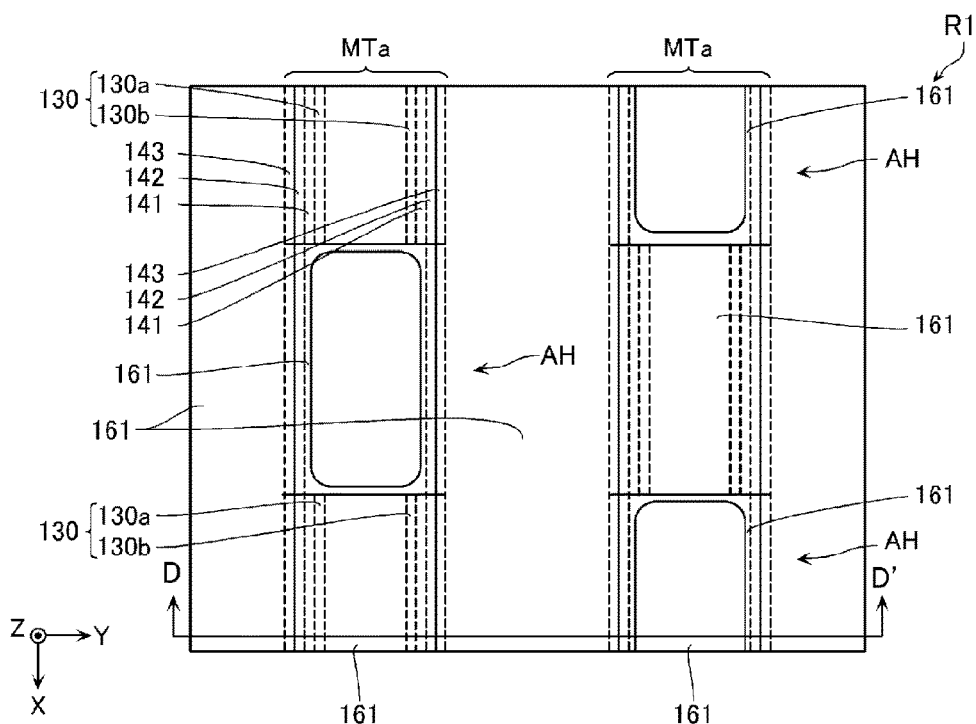
FIGS. 14A and 14B are a schematic plan view and a sectional view illustrating the same production method.
Figure 14B:
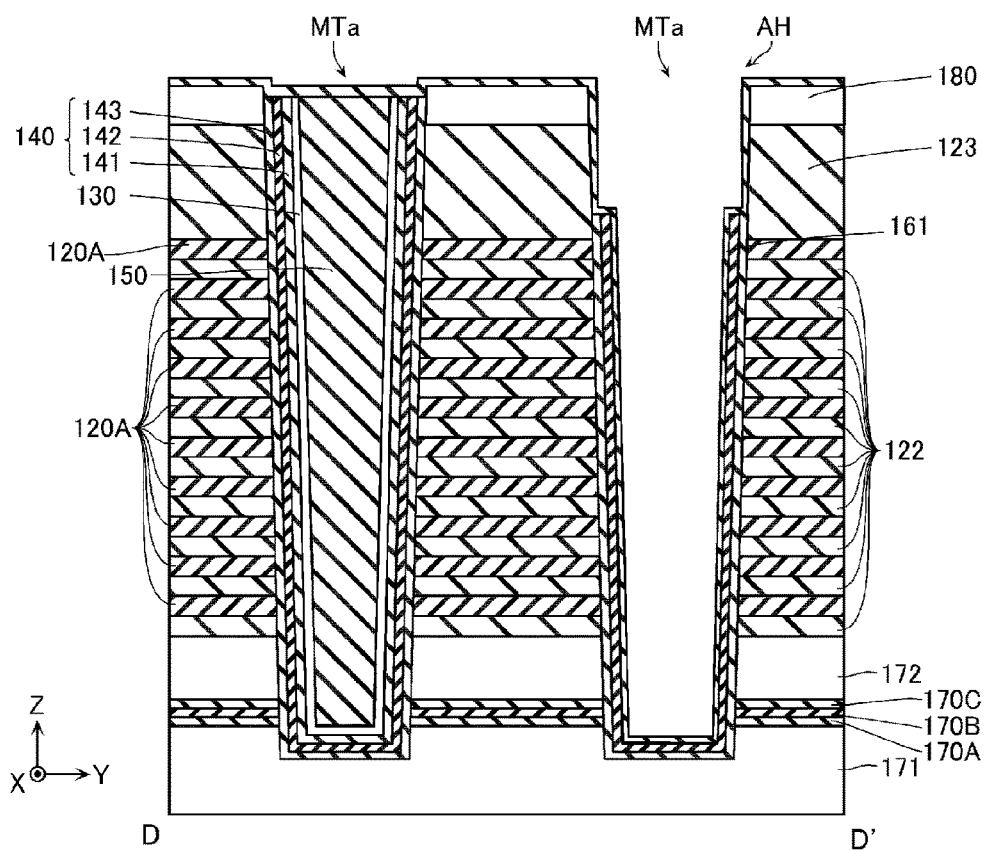

Next, as illustrated in FIGS. 14A and 14B, the insulating layer 161 is formed on the upper surface of the structure illustrated in FIGS. 13A and 13B, and the side wall surfaces and the lower surface at the position corresponding to the region AH of the structure MTa. The insulating layer 161 is formed to have a thickness smaller than that of the insulating layer 141. This step is performed by, for example, CVD, etc.

Figure 15A:
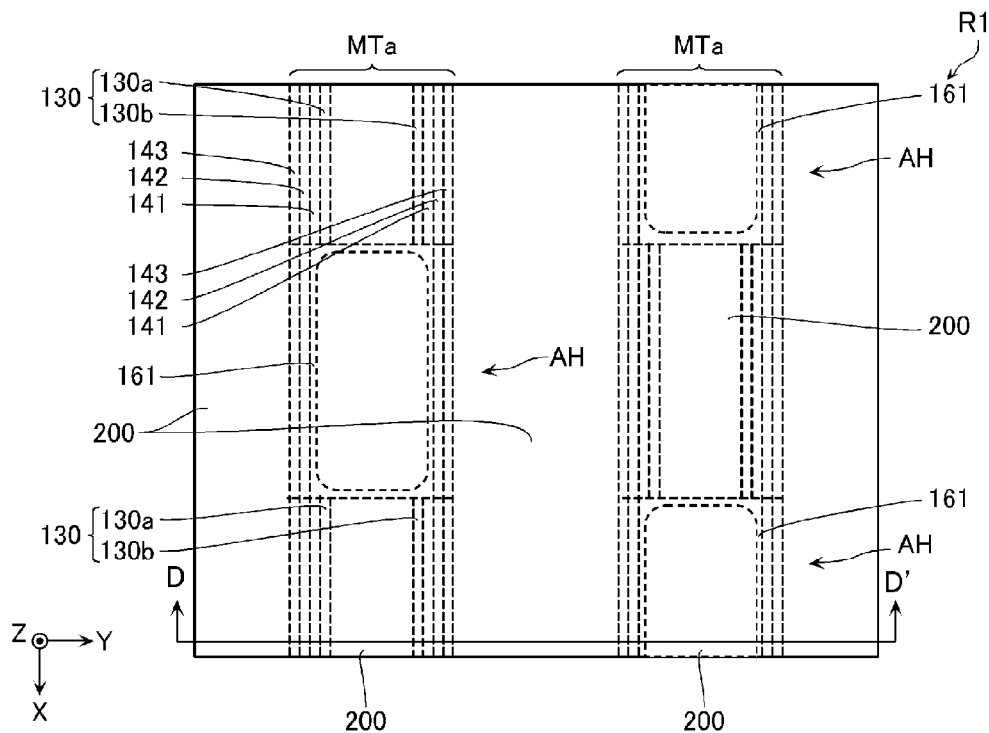
FIGS. 15A and 15B are a schematic plan view and a sectional view illustrating the same production method.
Figure 15B:
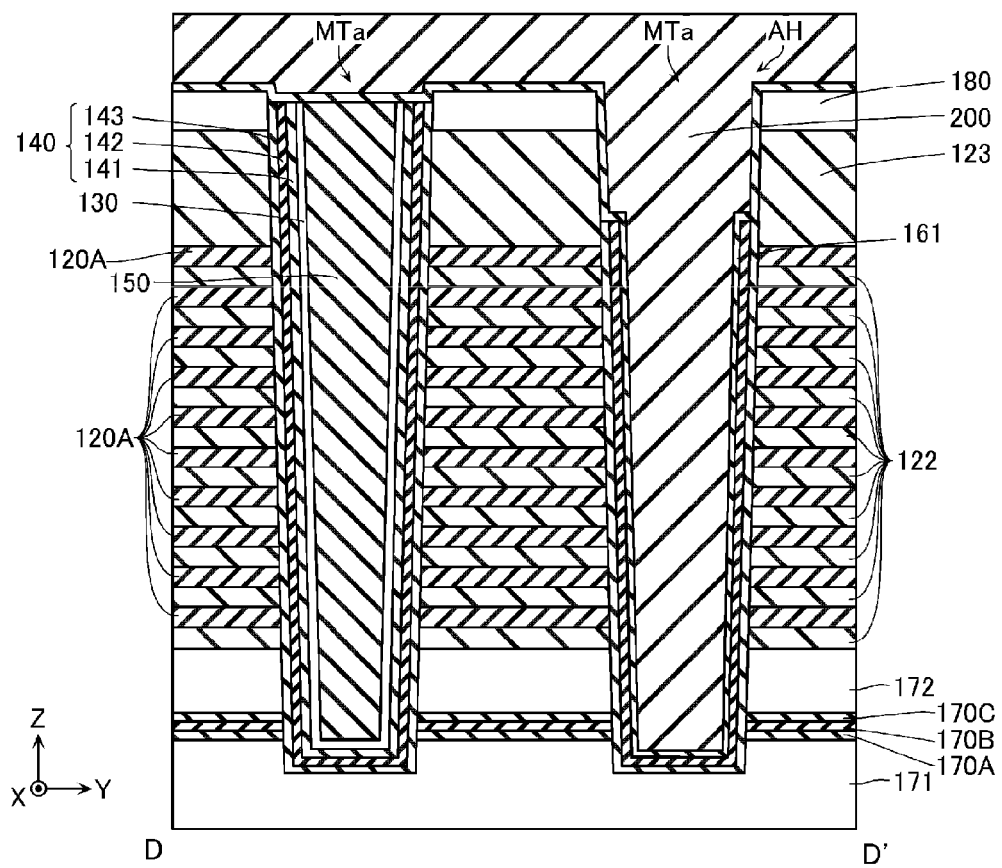

Next, as illustrated in FIGS. 15A and 15B, a carbon film 200 is formed on the upper surface of the structure illustrated in FIGS. 14A and 14B, at the position corresponding to the region AH of the structure MTa. The carbon film 200 is formed by, for example, spin coating of a coating-type carbon film material, etc.

Figure 16A:
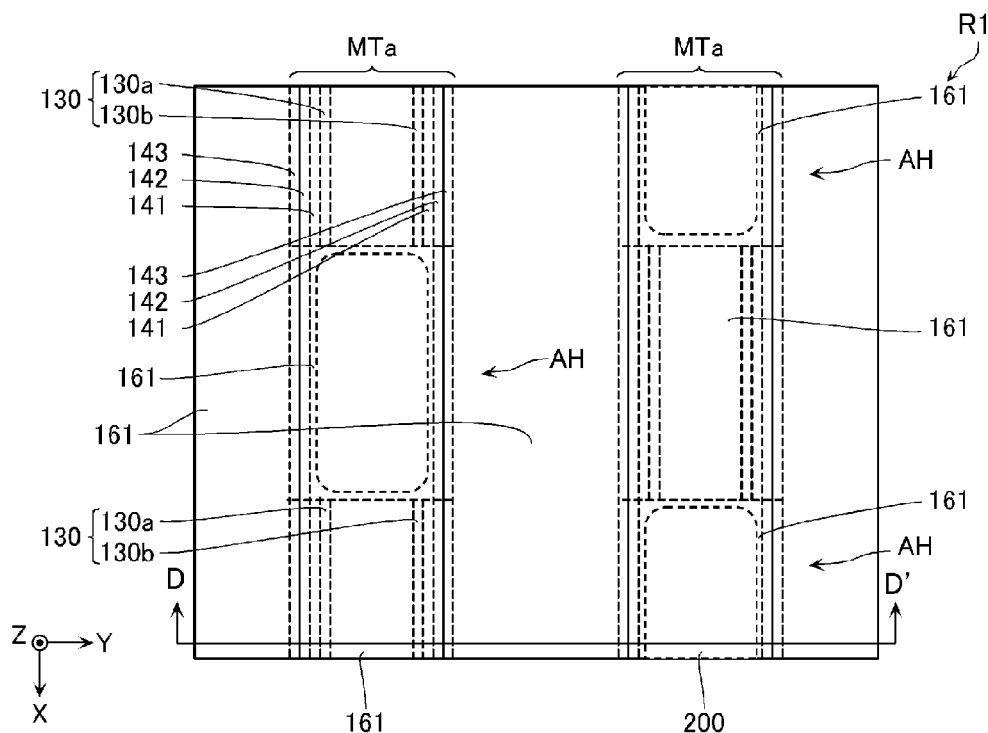
FIGS. 16A and 16B area schematic plan view and a sectional view illustrating the same production method.
Figure 16B:
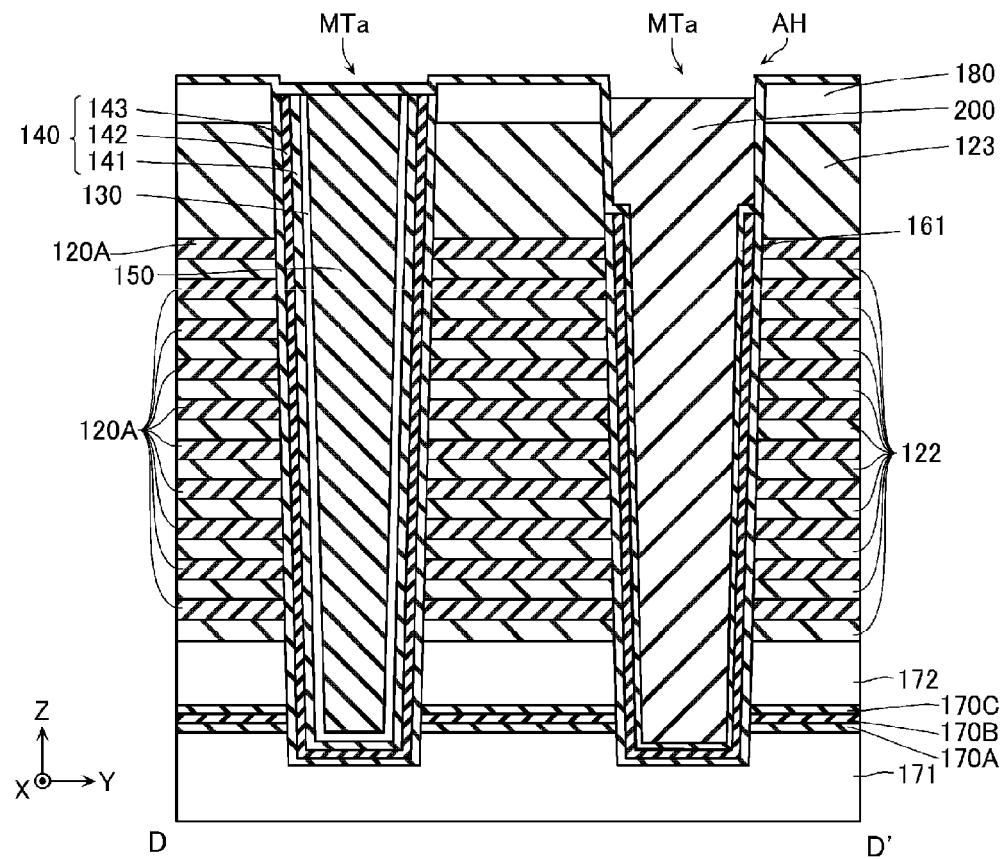

Next, As illustrated in FIGS. 16A and 16B, a part of the carbon film 200 is removed from the upper surface of the structure illustrated in FIGS. 15A and 15B, so that the upper surface of the carbon film 200 buried in the position corresponding to the region AH of the structure MTa is formed at a position lower than the upper surface of the semiconductor layer 180. This step is performed by, for example, RIE, etc.

Figure 17A:
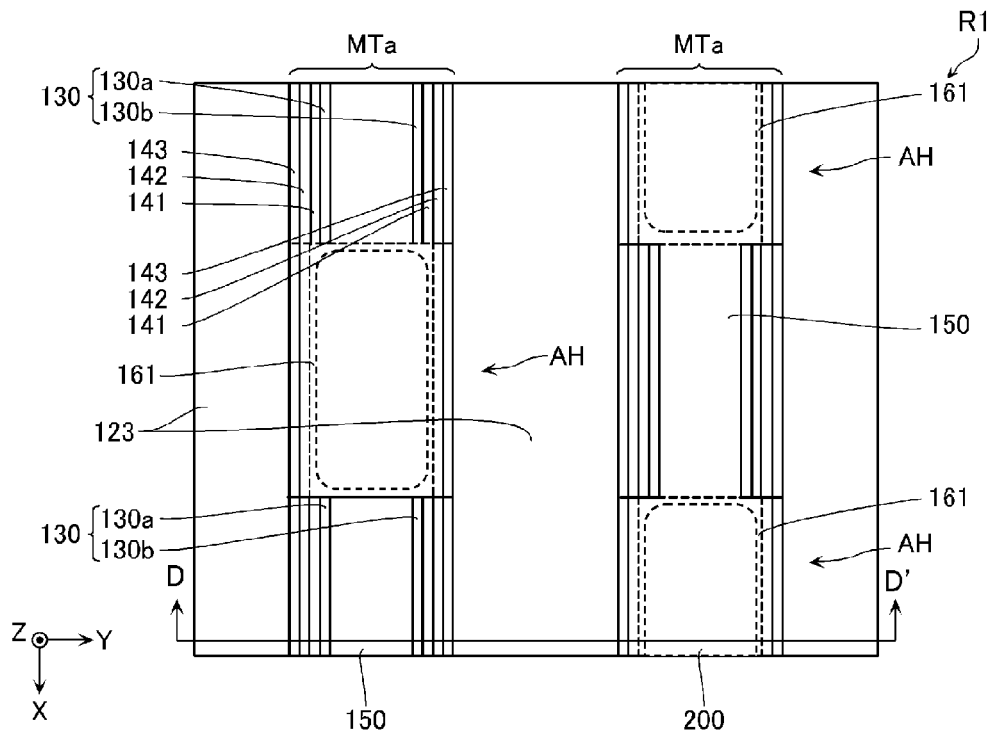
FIGS. 17A and 17B are a schematic plan view and a sectional view illustrating the same production method.
Figure 17B:
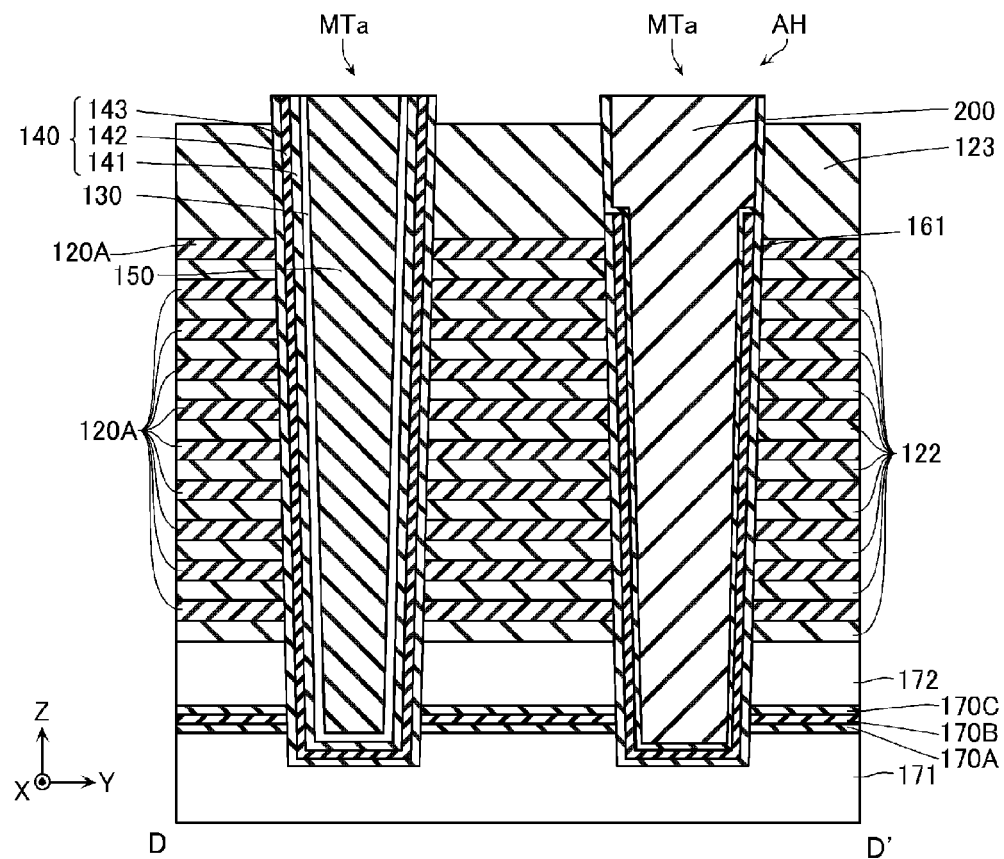

Next, as illustrated in FIGS. 17A and 17B, a part of the insulating layer 161, and the semiconductor layer 180 are removed from the upper surface of the structure illustrated in FIGS. 16A and 16B. Through this step, the position of the upper surface of the structure MTa becomes higher than the upper surface of the insulating layer 123. This step is performed by, for example, wet etching, etc.

Figure 18A:
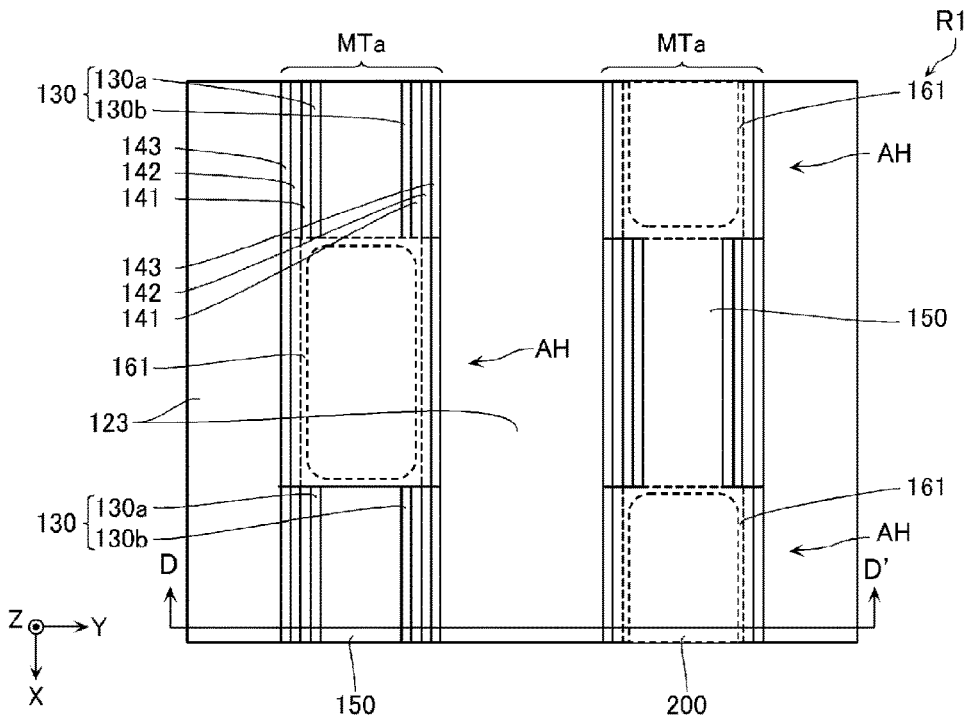
FIGS. 18A and 18B area schematic plan view and a sectional view illustrating the same production method.
Figure 18B:
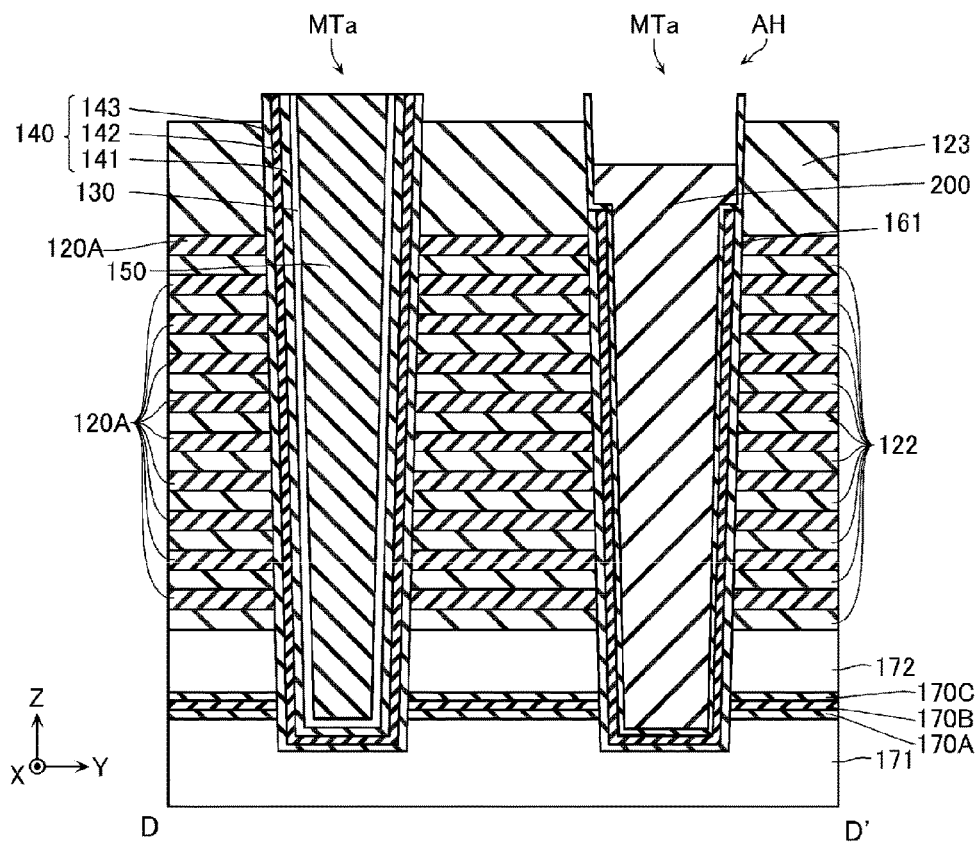

Next, as illustrated in FIGS. 18A and 18B, a part of the carbon film 200 is removed at the position corresponding to the region AH of the structure MTa. Through this step, at the position corresponding to the region AH of the structure MTa, the position of the upper surface of the carbon film 200 becomes lower than the upper surface of the insulating layer 123. This step is performed by, for example, RIE, etc.

Figure 19A:
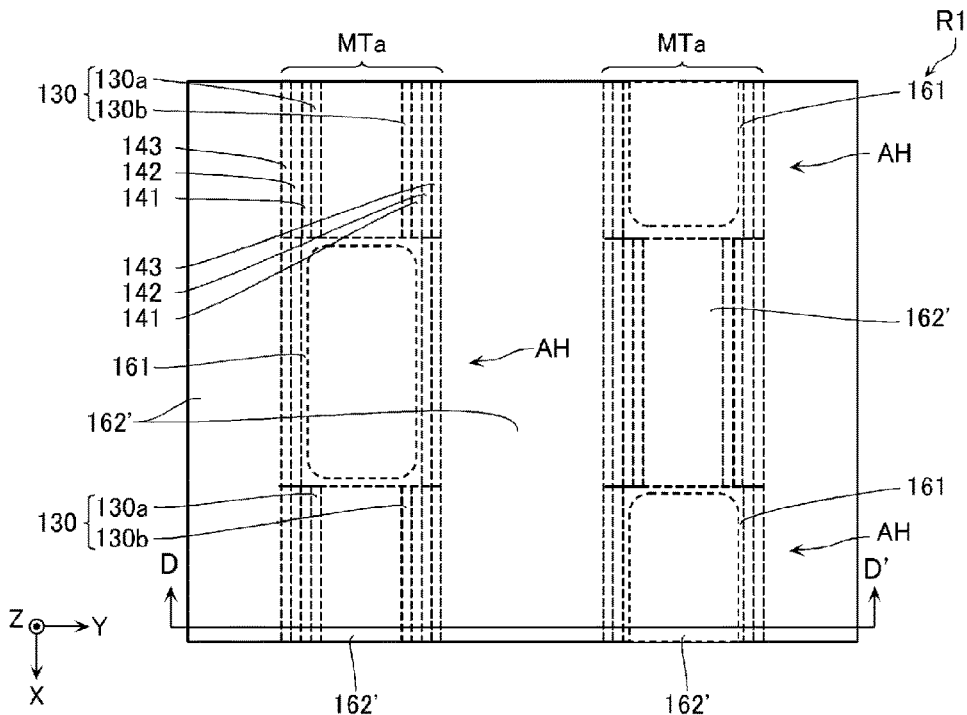
FIGS. 19A and 19B area schematic plan view and a sectional view illustrating the same production method.
Figure 19B:
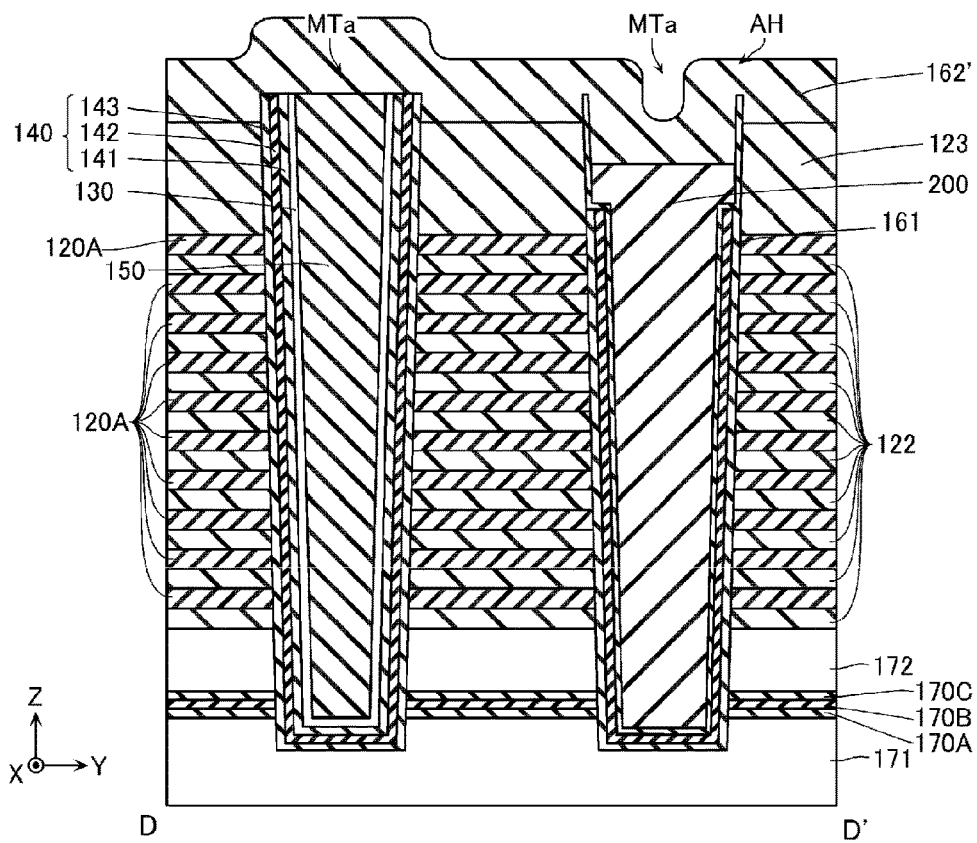

Next, as illustrated in FIGS. 19A and 19B, an insulating layer 162' is formed on the upper surface of the structure illustrated in FIGS. 18A and 18B. The insulating layer 162' is formed by, for example, CVD, etc.

Figure 20A:
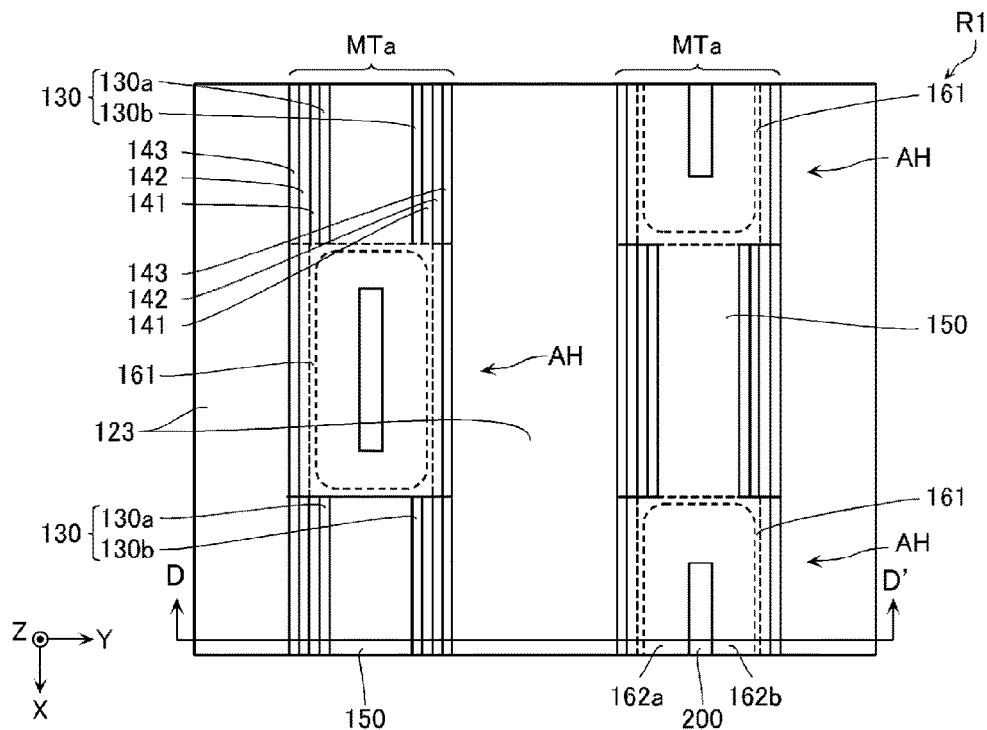
FIGS. 20A and 20B are a schematic plan view and a sectional view illustrating the same production method.
Figure 20B:
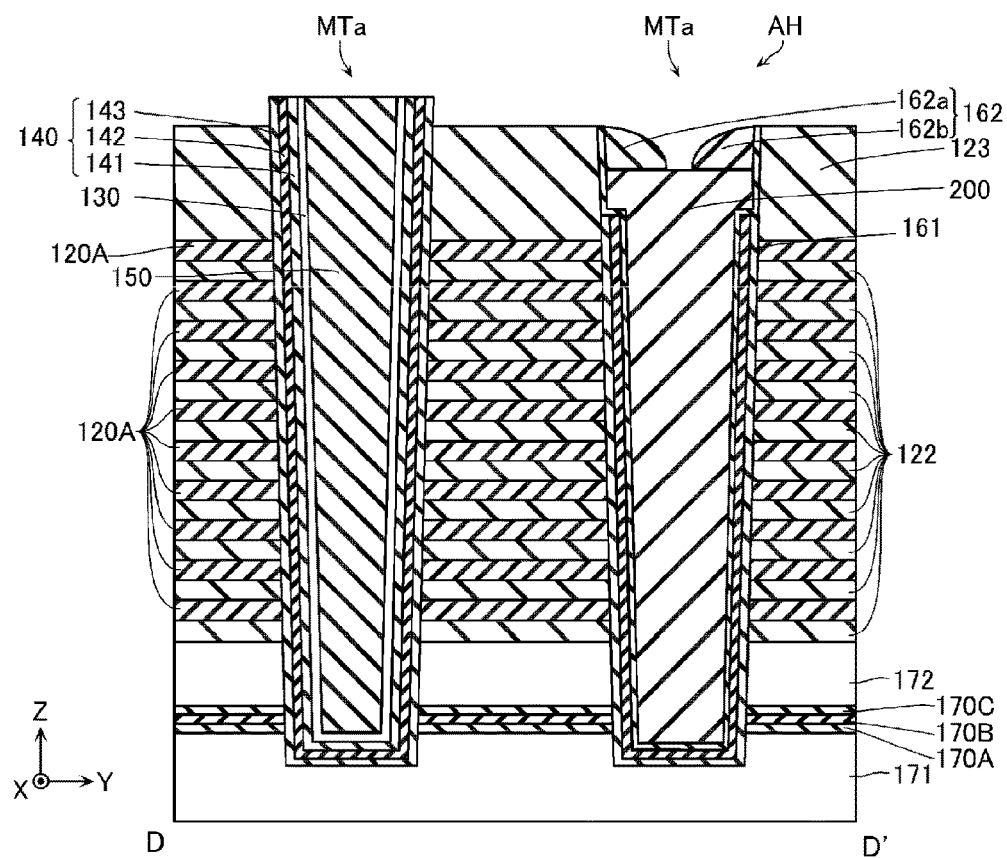

Next, as illustrated in FIGS. 20A and 20B, a part of the insulating layer 162' is removed from the upper surface of the structure illustrated in FIGS. 19A and 19B. Through this step, at the position corresponding to the region AH of the structure MTa, the insulating layer 162 (an insulating layer 162a and an insulating layer 162b in the sectional view of FIG. 20B) is formed, in which the height decreases from the outer periphery of the region AH toward the central portion, and a gap is present at the center. The insulating layer 162a and the insulating layer 162b are separated at the central portion of the structure MTa in the Y direction, and thus the carbon film 200 is exposed at the central portion of the structure MTa in the Y direction. This step is performed by, for example, RIE, etc.

Figure 21A:
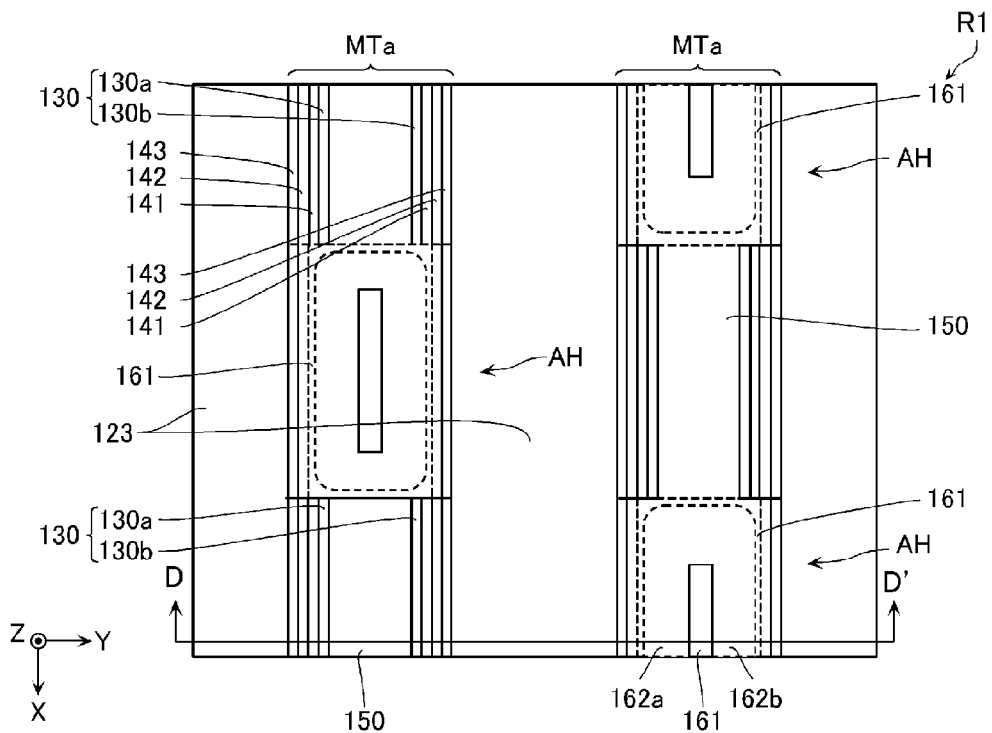
FIGS. 21A and 21B area schematic plan view and a sectional view illustrating the same production method.
Figure 21B:
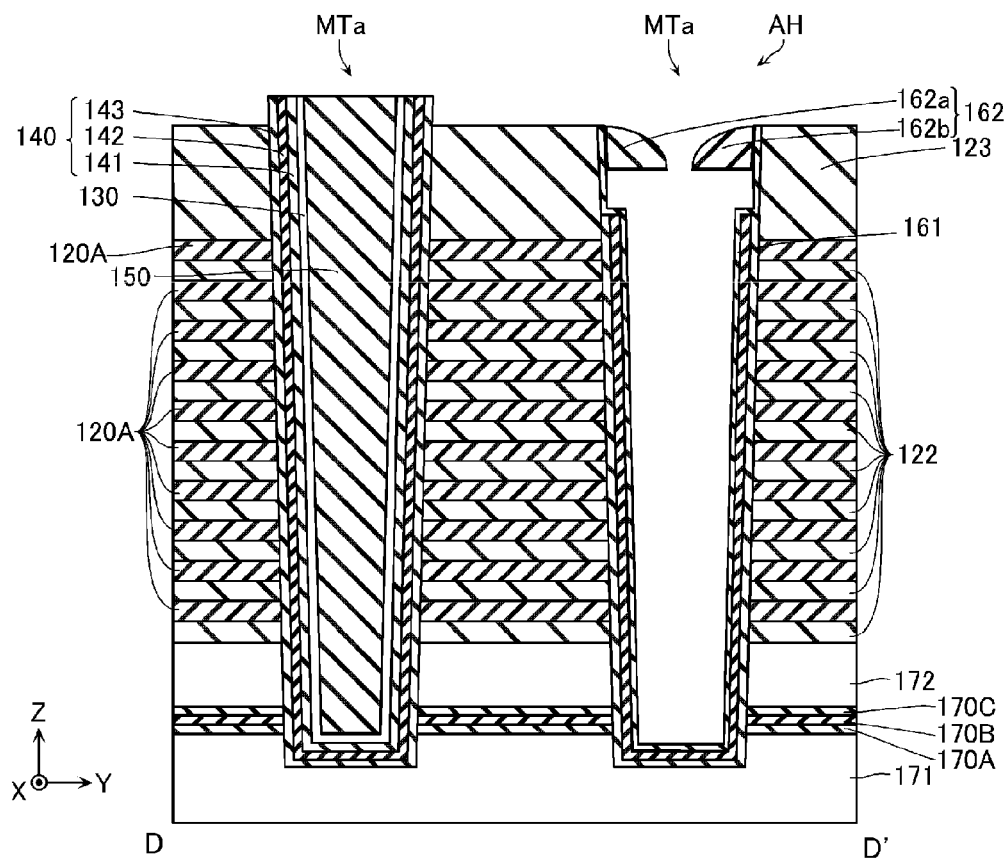

Next, as illustrated in FIGS. 21A and 21B, the carbon film 200 buried in the position corresponding to the region AH of the structure MTa is removed. The removal of the carbon film 200 is performed through the gap formed between the insulating layer 162a and the insulating layer 162b. This step is performed by, for example, asking, etc.

Figure 22A:
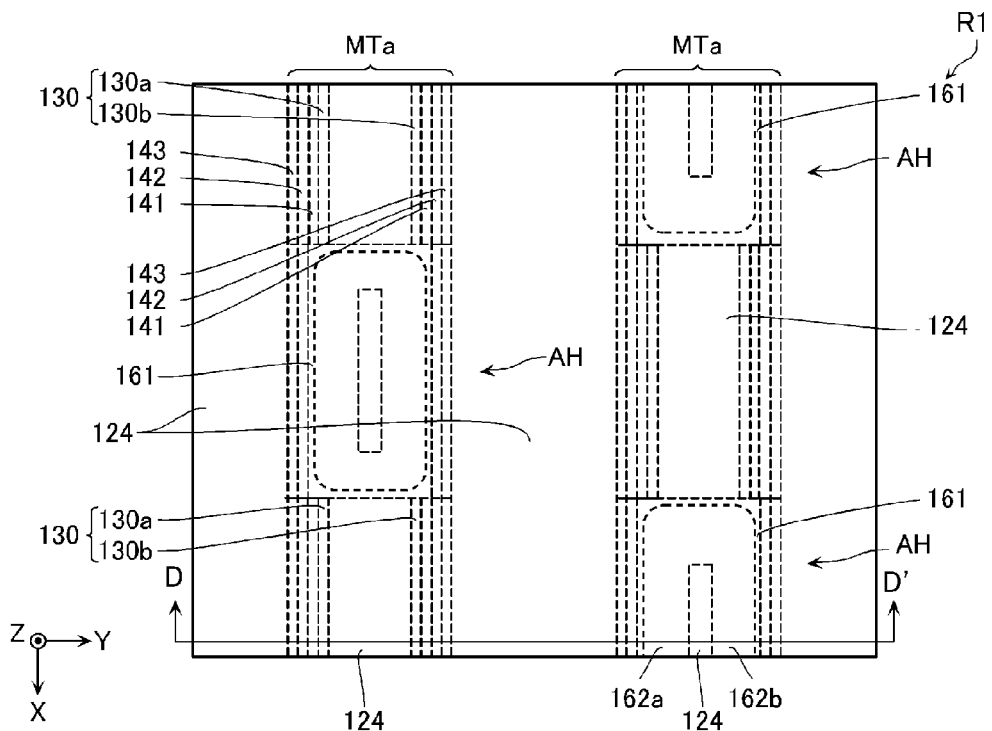
FIGS. 22A and 22B are a schematic plan view and a sectional view illustrating the same production method.
Figure 22B:
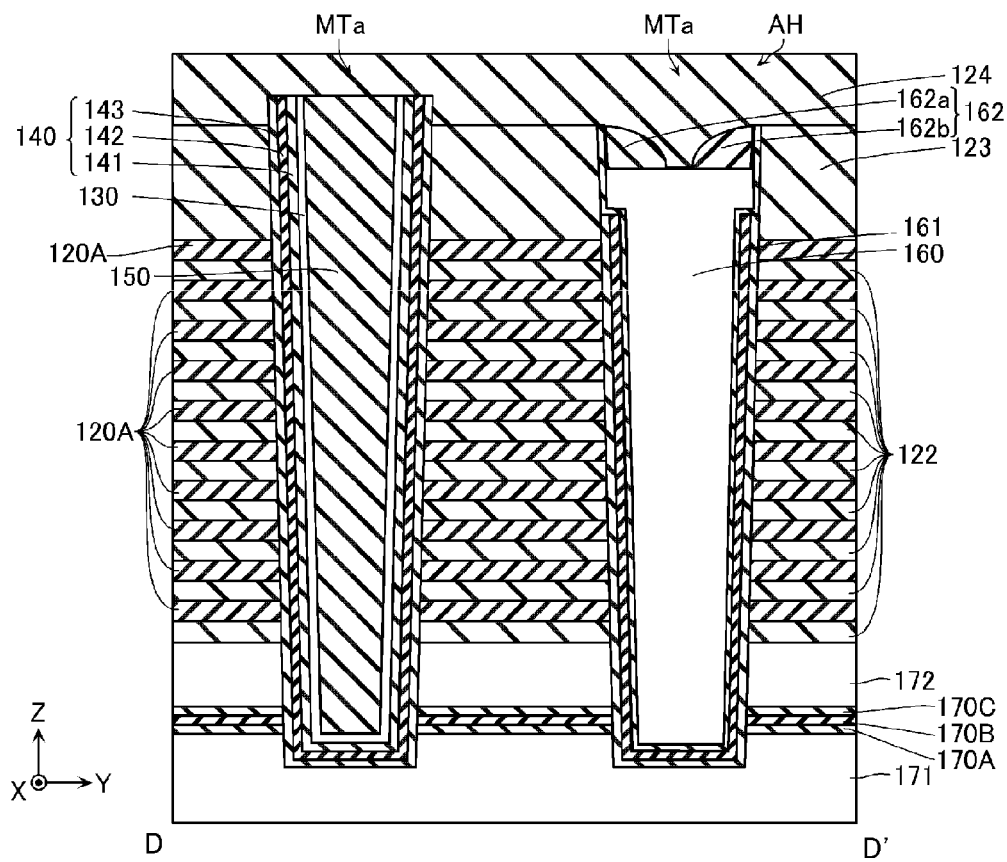

Next, as illustrated in FIGS. 22A and 22B, the film deposition of the insulating layer 124 of, for example, silicon oxide (SiO2) is performed on the upper surface of the structure illustrated in FIGS. 21A and 21B, and the gap 160 is formed at the position corresponding to the region AH of the structure MTa. In this step, the film deposition of the insulating layer 124 is performed under a film deposition condition of, for example, low coverage characteristics such as a fast growth rate. Thus, the insulating layer 124 is formed only above the insulating layer 162a and the insulating layer 162b, and does not enter the gap 160 through the gap between the insulating layer 162a and the insulating layer 162b (is not formed below the insulating layer 162a and the insulating layer 162b). This step is performed by, for example, CVD, etc.

Figure 23A:
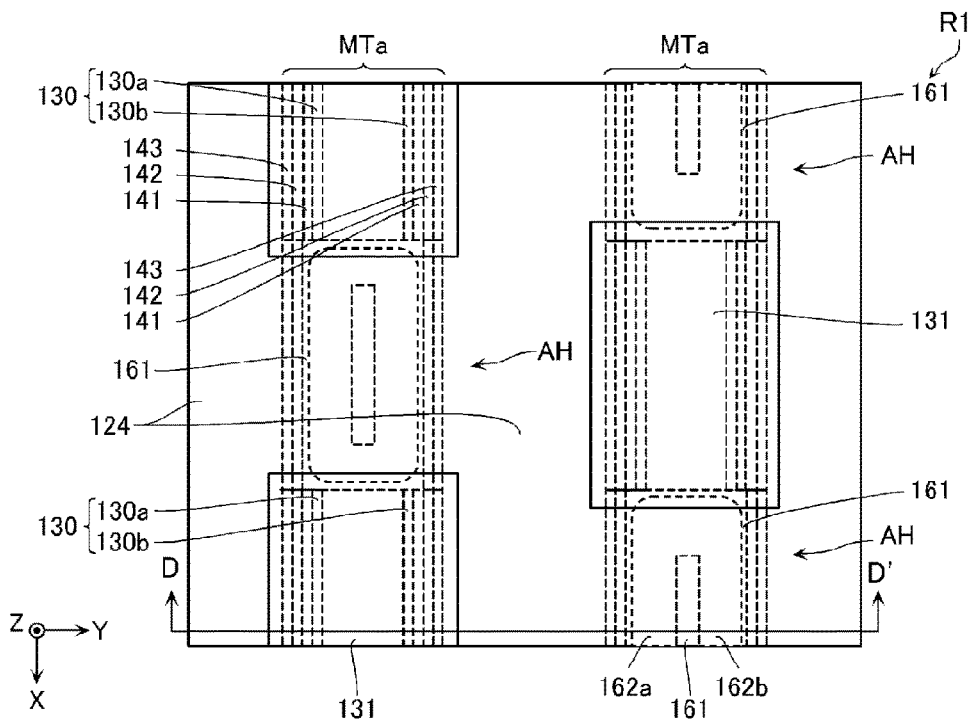
FIGS. 23A and 23B are a schematic plan view and a sectional view illustrating the same production method.
Figure 23B:
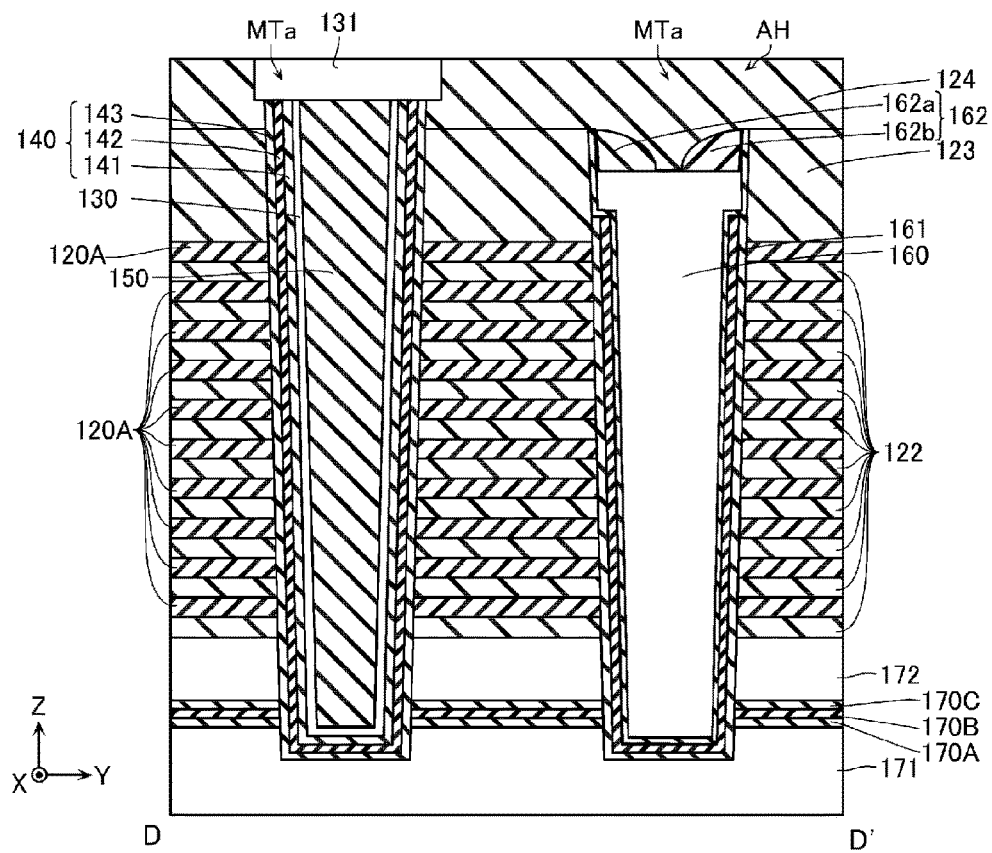

Next, as illustrated in FIGS. 23A and 23B, the insulating layer 124 is removed up to the upper end surface of the semiconductor layer 130 in the Z direction, in a portion between the regions AH adjacent in the X direction, and the semiconductor layer 131 is formed on the portion remaining after the removal. The removal of the insulating layer 124 is performed by, for example, patterning using photolithography and RIE. The semiconductor layer 131 is formed by, for example, film deposition through CVD, etching-back, etc.

The structure in the region R2 (see FIG. 6), which is obtained through the above steps, is illustrated in FIGS. 24A and 24B. In the region R2, the structure MTa is basically formed in the same manner as in the region R1, but no opening is formed between two structures MTa adjacent in the X direction. Therefore, a portion in the plurality of sacrificial layers 120A and the like stacked in the Z direction, which is provided between the two openings MTa' adjacent in the X direction, is not divided in the Y direction.

Figure 25A:
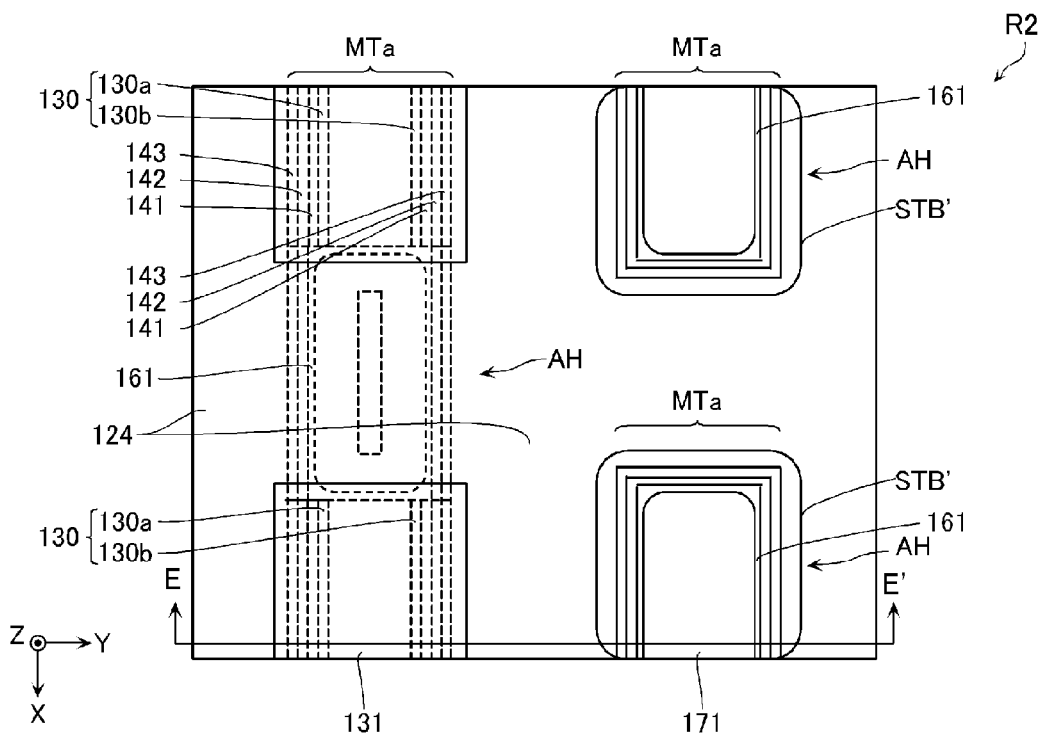
FIGS. 25A and 25B are a schematic plan view and a sectional view illustrating the same production method.
Figure 25B:
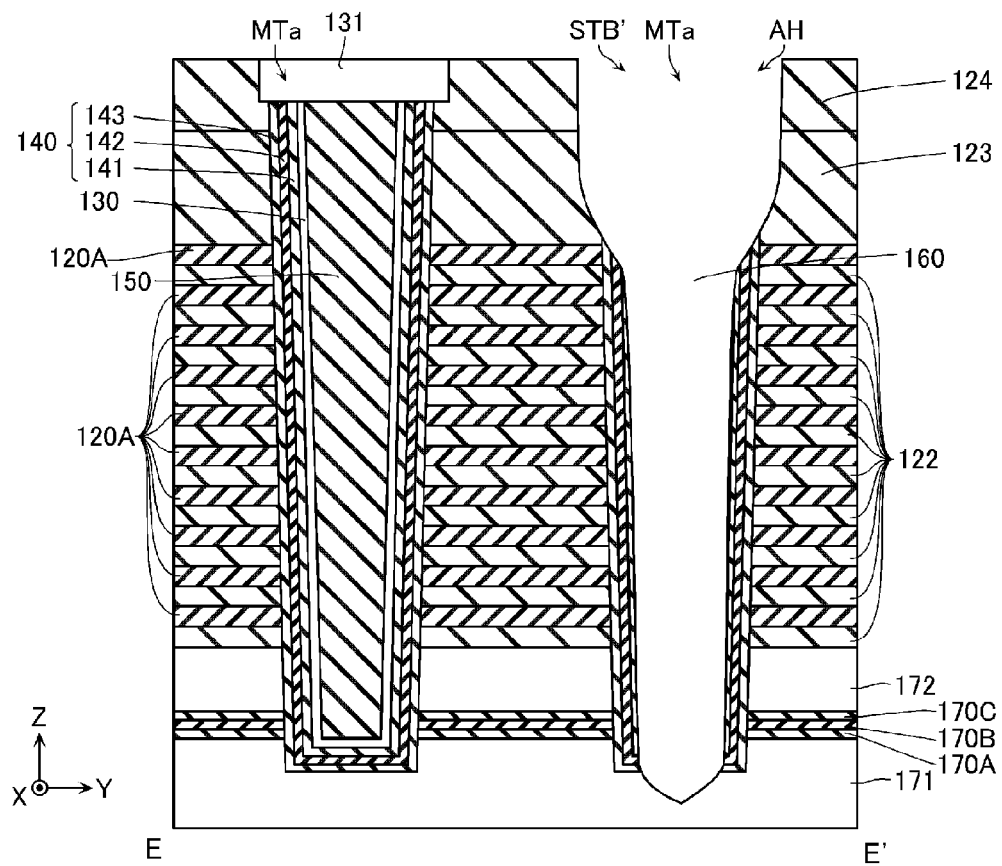

Next, as illustrated in FIGS. 25A and 25B, openings STB' are formed at regions including both ends of the structure MTa in the X direction, respectively. The openings STB' are formed while overlapping the regions AH located at both ends of the structure MTa in the X direction in view in the Z direction.

As illustrated in FIG. 25B, the opening STB' extends in the Z direction, and partially divides apart of the insulating layer 124 and the insulating layer 123 in the Y direction so that the gap 160 is exposed. When the opening STB' is formed, the insulating layer 161, the insulating layer 123, the insulating layer 141, the charge storage layer 142, and the block insulating layer 143, which surround the side wall portions of the gap 160, are simultaneously partially removed, and the insulating layer 141, the charge storage layer 142, and the block insulating layer 143, which are in contact with the lower surface portion of the gap 160, are simultaneously partially removed, so that the semiconductor layer 171 is exposed. For example, an insulating layer having openings in portions corresponding to the openings STB' is formed on the upper surface of the structure illustrated in FIGS. 24A and 24B, and this insulating layer is used as a mask to perform RIE or the like so that the openings STB' are formed.

Next, as illustrated in FIGS. 26A and 26B, the film deposition of an insulating layer 190 of silicon oxide (SiO2), within the opening STB', is performed. Through this step, the gap 160 in the region corresponding to the opening STB' is removed, and a structure STB" is formed. This step is performed by, for example, CVD, etc.

Next, as illustrated in FIGS. 27A to 27C, an opening STH' is formed in a region that includes a portion between the two structures MTa adjacent in the X direction, and a part of the portions of two structures STB" adjacent in the X direction.

As illustrated in FIG. 27B, a portion in the opening STH' in the F-F' cross-section, which overlaps the structure STB" when viewed in the Z direction, extends in the Z direction, and partially divides the insulating layer 124, the insulating layer 123, the sacrificial layers 120A and the insulating layers 122, the semiconductor layer 172, the insulating layer 170C, the insulating layer 170B, and the insulating layer 170A, in the Y direction, so that the semiconductor layer 171 is exposed.

As illustrated in FIG. 27C, a portion in the opening STH' in the G-G' cross-section, which does not overlap the structure STB" when viewed in the Z direction, extends in the Z direction, and partially divides the insulating layer 124, the insulating layer 123, the sacrificial layers 120A and the insulating layers 122, in the Y direction, so that the semiconductor layer 172 is exposed.

As illustrated in FIGS. 27A to 27C, a portion in the structure STB", which does not overlap the opening STH' when viewed in the Z direction, becomes a structure STB in which the insulating layer 190 is buried. That is, the opening STH' is provided between the two structures STB adjacent in the X direction. For example, an insulating layer having openings in portions corresponding to the openings STH' is formed on the upper surface of the structure illustrated in FIGS. 26A and 26B, and this insulating layer is used as a mask to perform RIE, etc. so that the openings STH' are formed. The RIE is executed under, for example, a condition that silicon oxide (SiO2) is more easily removed than silicon (Si).

Figure 28A:
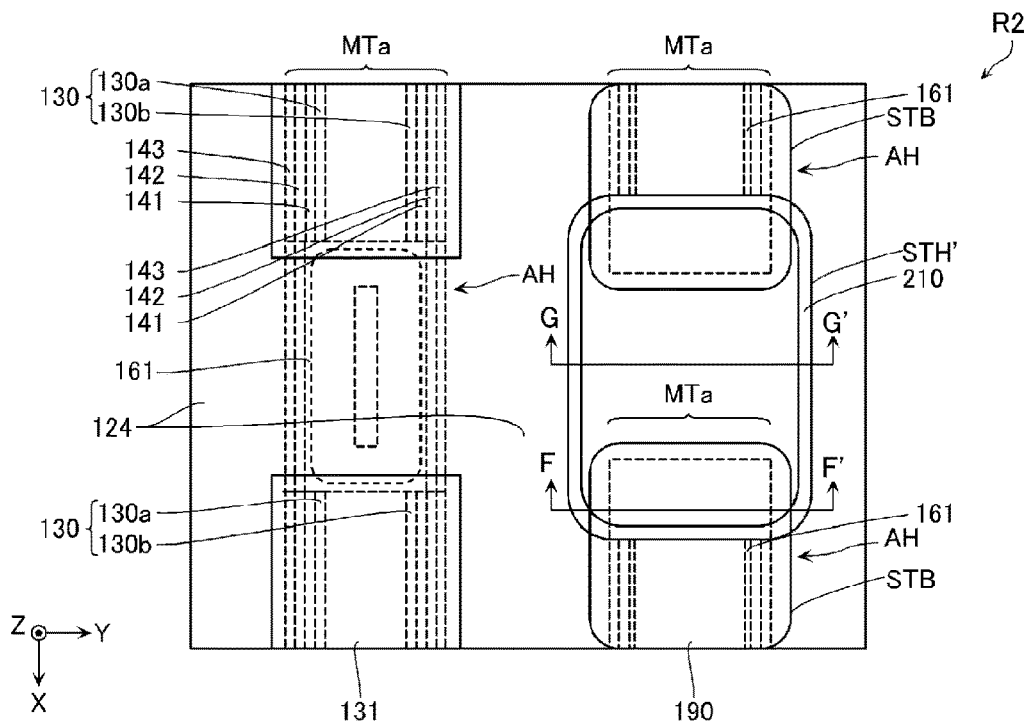
FIGS. 28A to 28C are a schematic plan view and a sectional view illustrating the same production method.
Figure 28B:
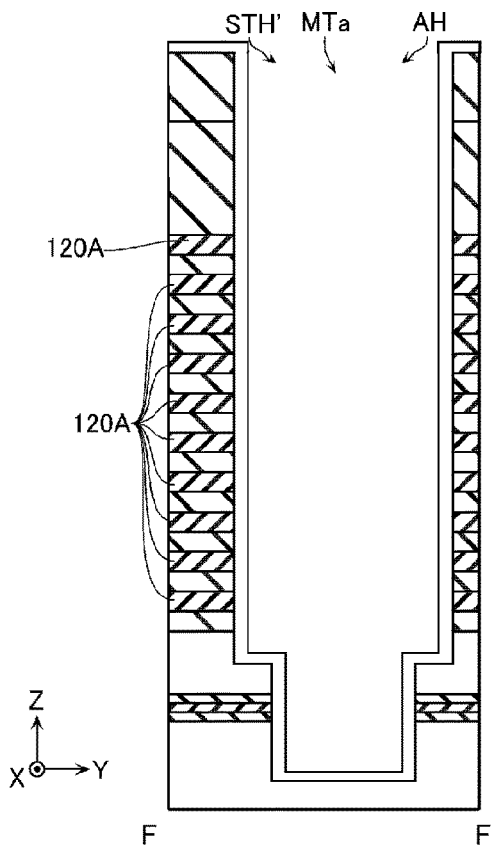
Figure 28C:
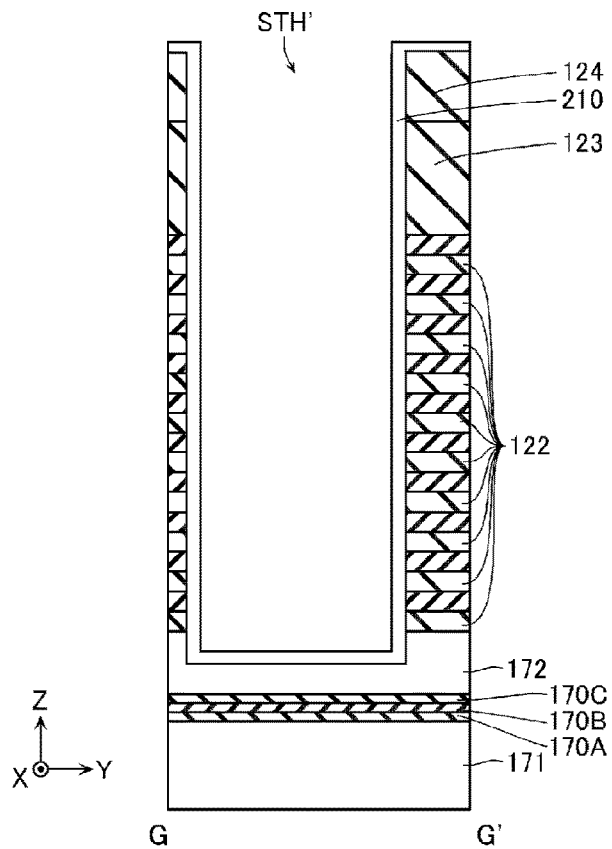

Next, as illustrated in FIGS. 28A to 28C, a protective layer 210 of amorphous silicon (Si) is formed on the upper surface of the insulating layer 124, and the lower surface and the side surfaces of the opening STH'. The protective layer 210 is formed by, for example, CVD, etc.

Figure 29A:
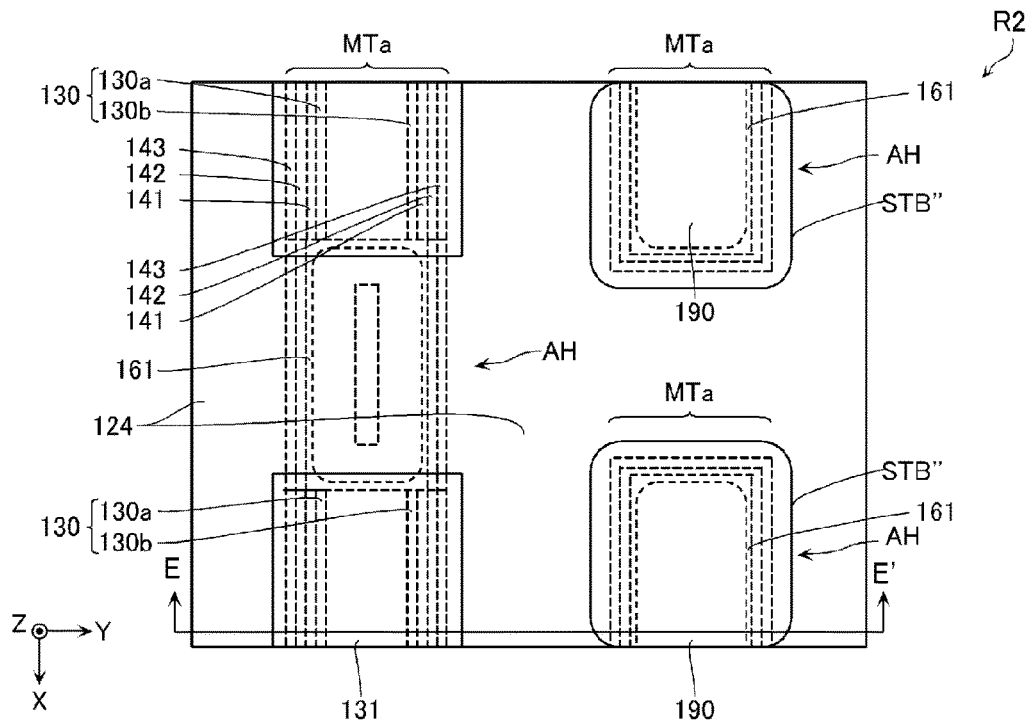
FIGS. 29A to 29C are a schematic plan view and a sectional view illustrating the same production method.
Figure 29B:
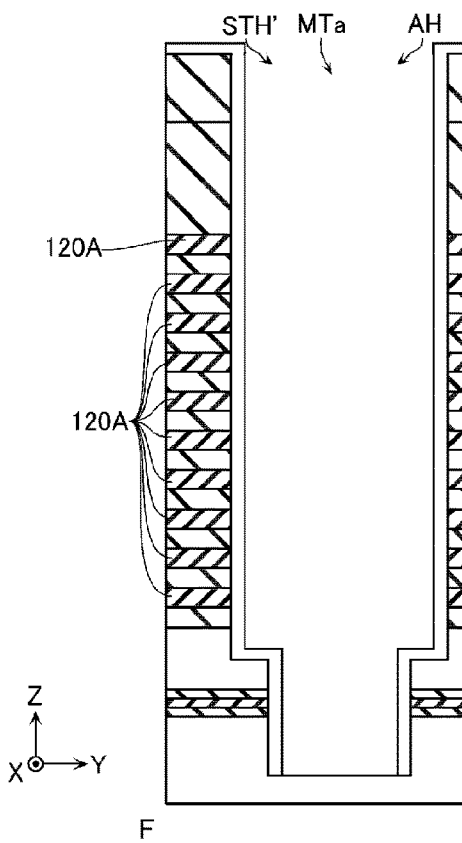
Figure 29C:
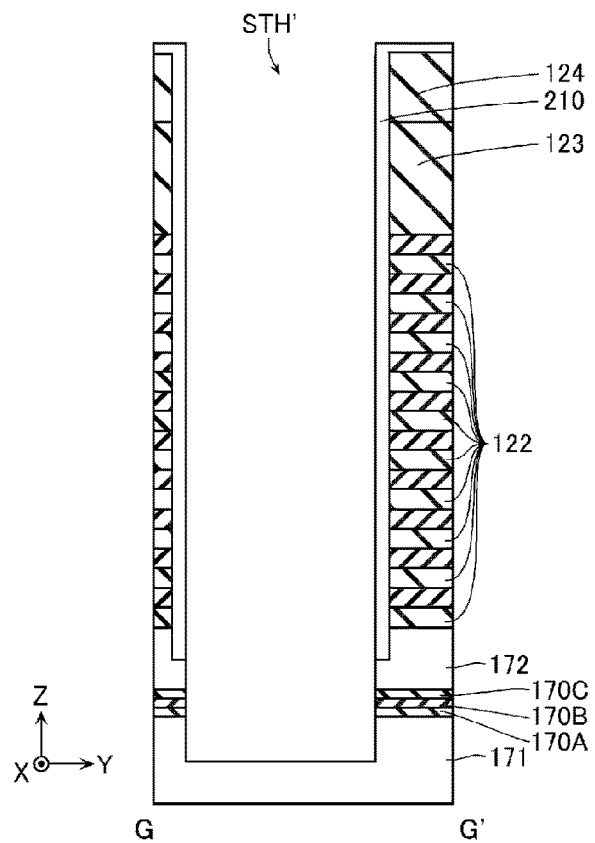

Next, as illustrated in FIGS. 29A to 29C, a portion in the protective layer 210, which is provided in the lower surface portion within the opening STH', is removed so that the semiconductor layer 171 is exposed. This step is performed by, for example, RIE, etc.

Figure 31A:
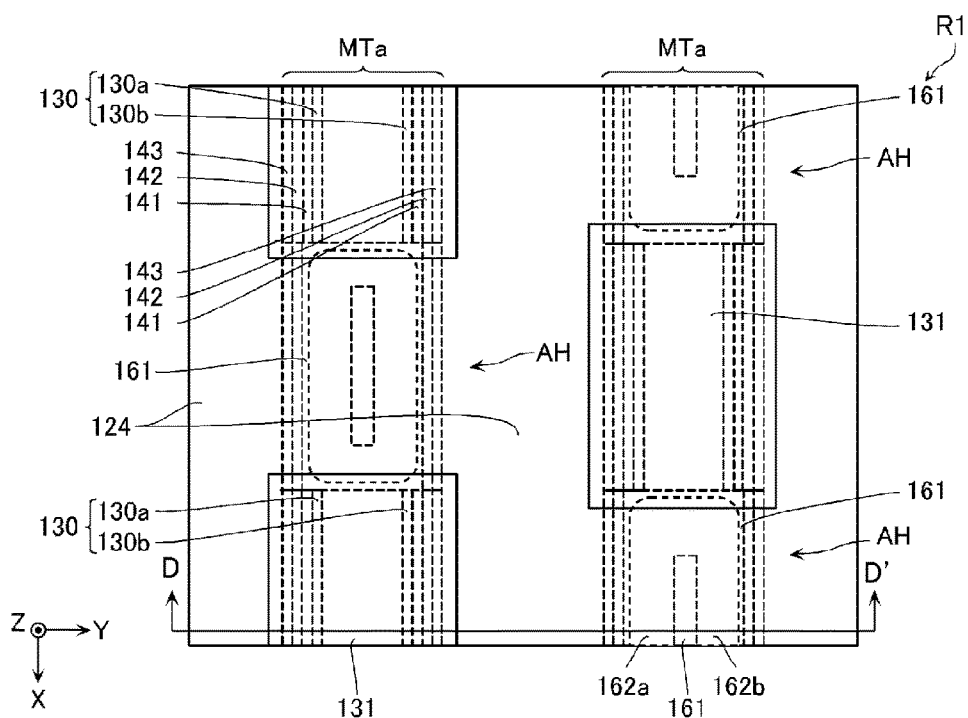
FIGS. 31A and 31B are a schematic plan view and a sectional view illustrating the same production method.
Figure 31B:
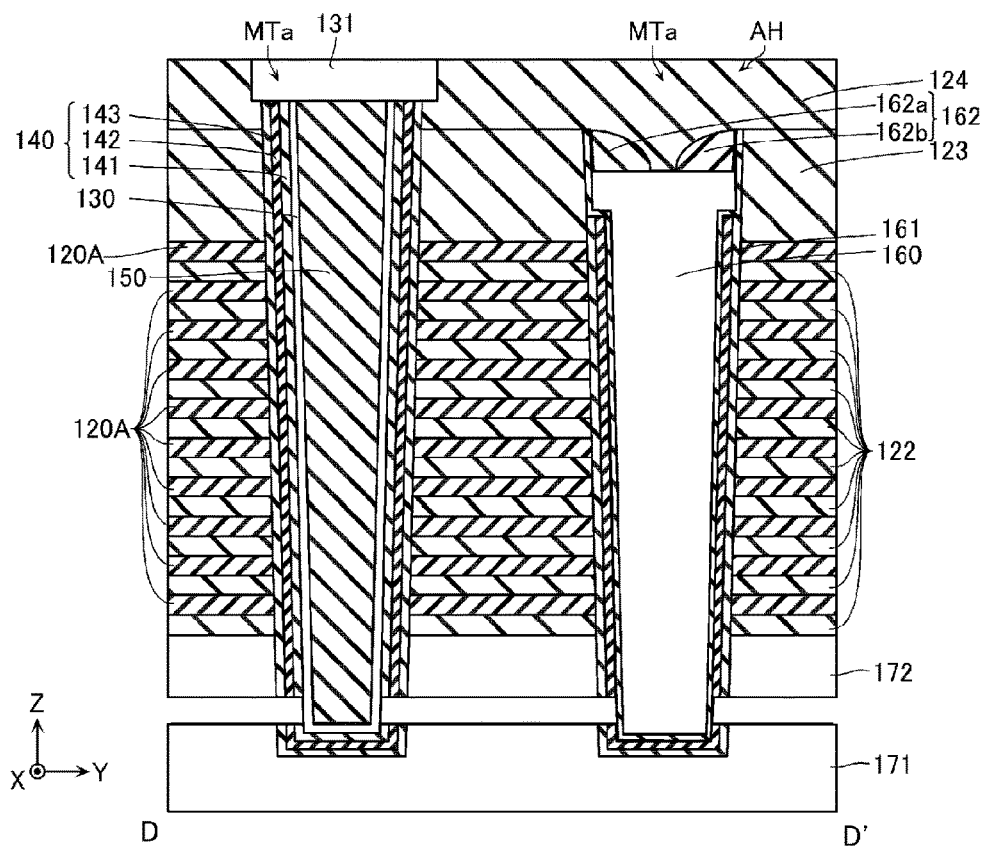

Next, as illustrated in FIGS. 30A to 30C and FIGS. 31A and 31B, the insulating layer 170A, the insulating layer 170B, and the insulating layer 170C are removed through the opening STH'. Through this step, as illustrated in FIGS. 31A and 31B, a part of the side wall of the semiconductor layer 130 in the structure MTa is exposed. In this step, the sacrificial layers 120A made of the same type of material as the insulating layer 170B are protected by the protective layer 210, and thus are not etched at the same time. This step is performed by, for example, a method such as wet etching.

Next, as illustrated in FIGS. 32A to 32C and FIGS. 33A and 33B, through the opening STH', the semiconductor layer 170 of polysilicon (Si) is formed on the side surfaces of the semiconductor layer 130, the upper surface of the semiconductor layer 171, and the lower surface of the semiconductor layer 172. This step is performed by, for example, epitaxial growth, etc.

Figure 32B:
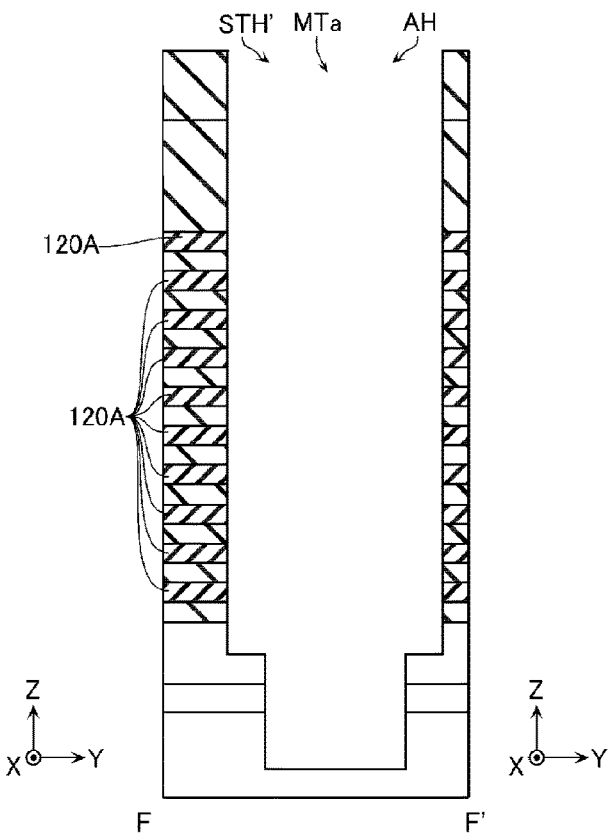
Figure 32C:
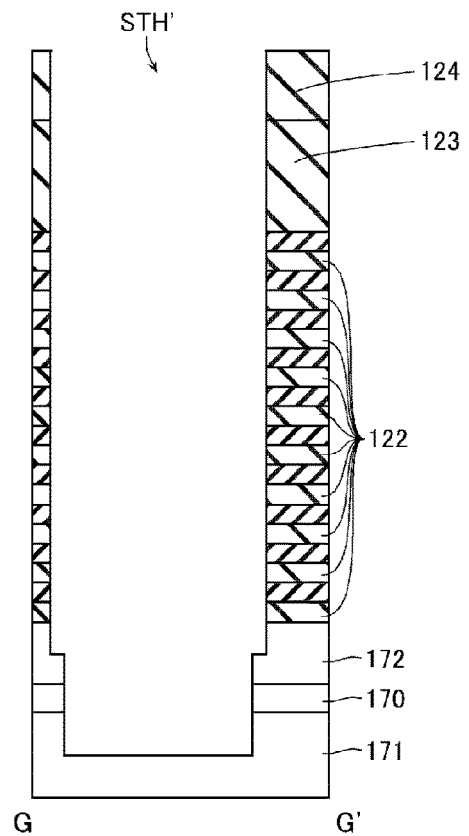
Figure 33A:
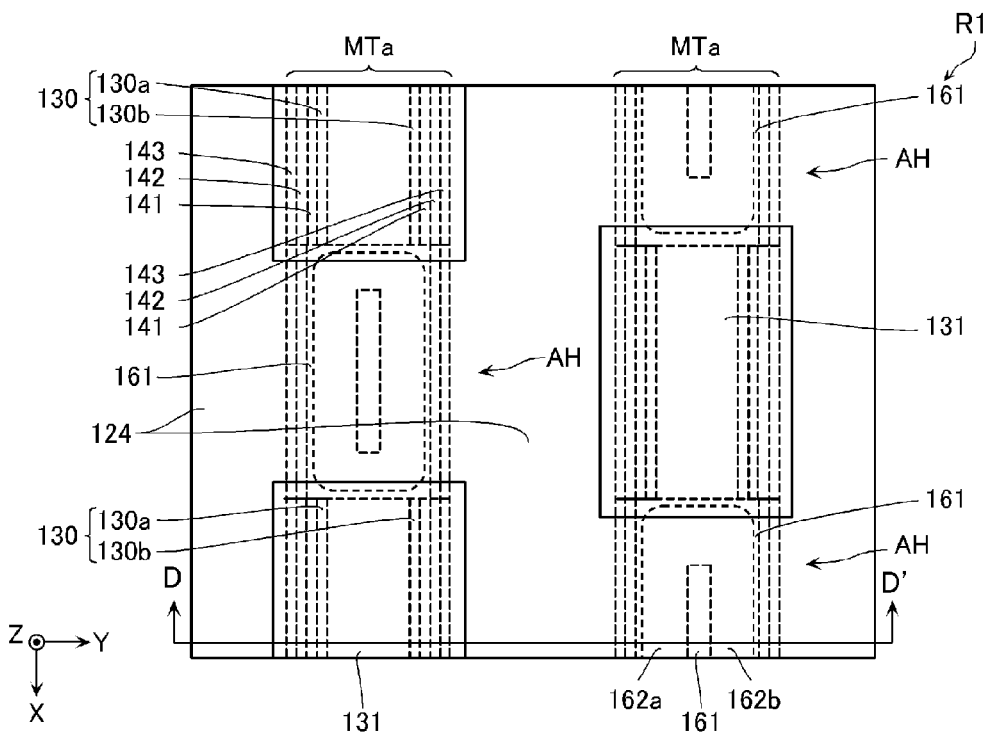
FIGS. 33A and 33B are a schematic plan view and a sectional view illustrating the same production method.
Figure 33B:
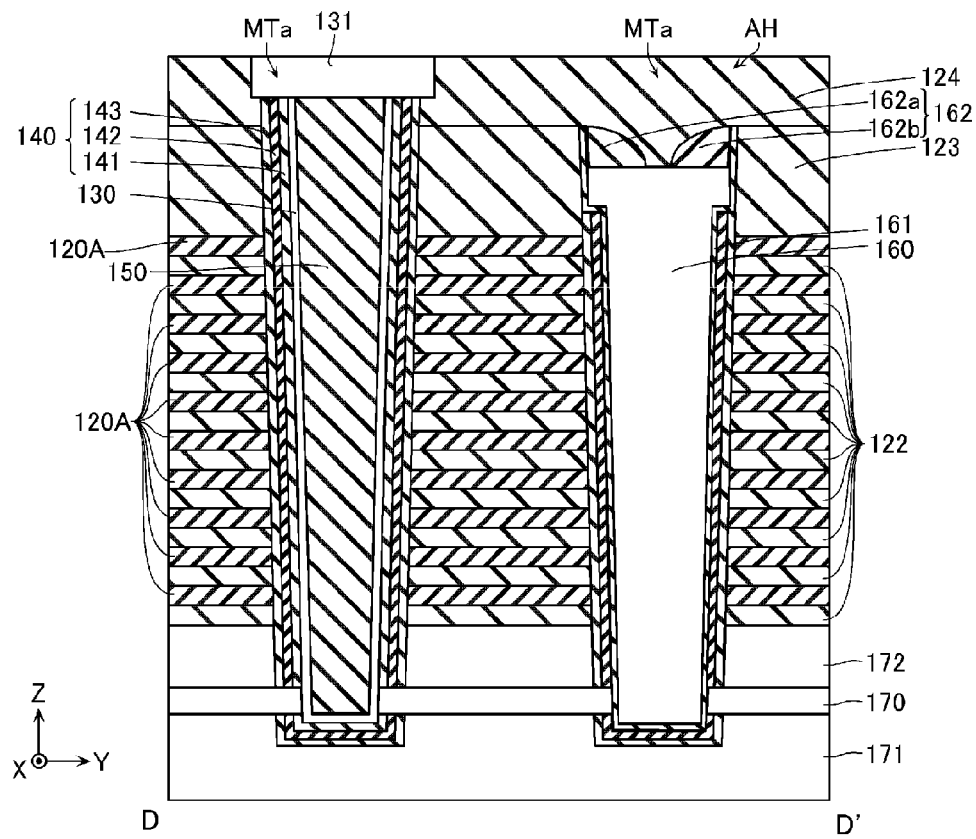

Next, as illustrated in FIGS. 32A to 32C, the protective layer 210 on the inner wall portions of the opening STH' is removed. This step is performed by, for example, a method such as wet etching.

Next, as illustrated in FIGS. 34A to 34C and FIGS. 35A and 35B, the plurality of sacrificial layers 120A are removed through the opening STH' to form a plurality of cavities CA. This step is performed by, for example, a method such as wet etching.

Figure 36A:
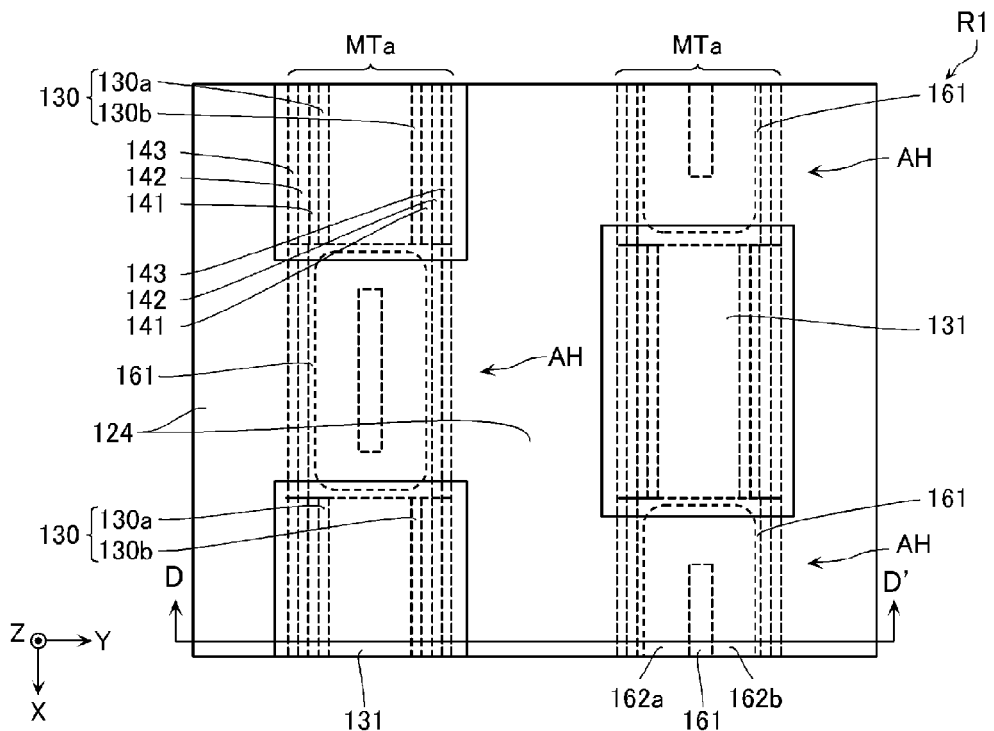
FIGS. 36A and 36B area schematic plan view and a sectional view illustrating the same production method.
Figure 36B:
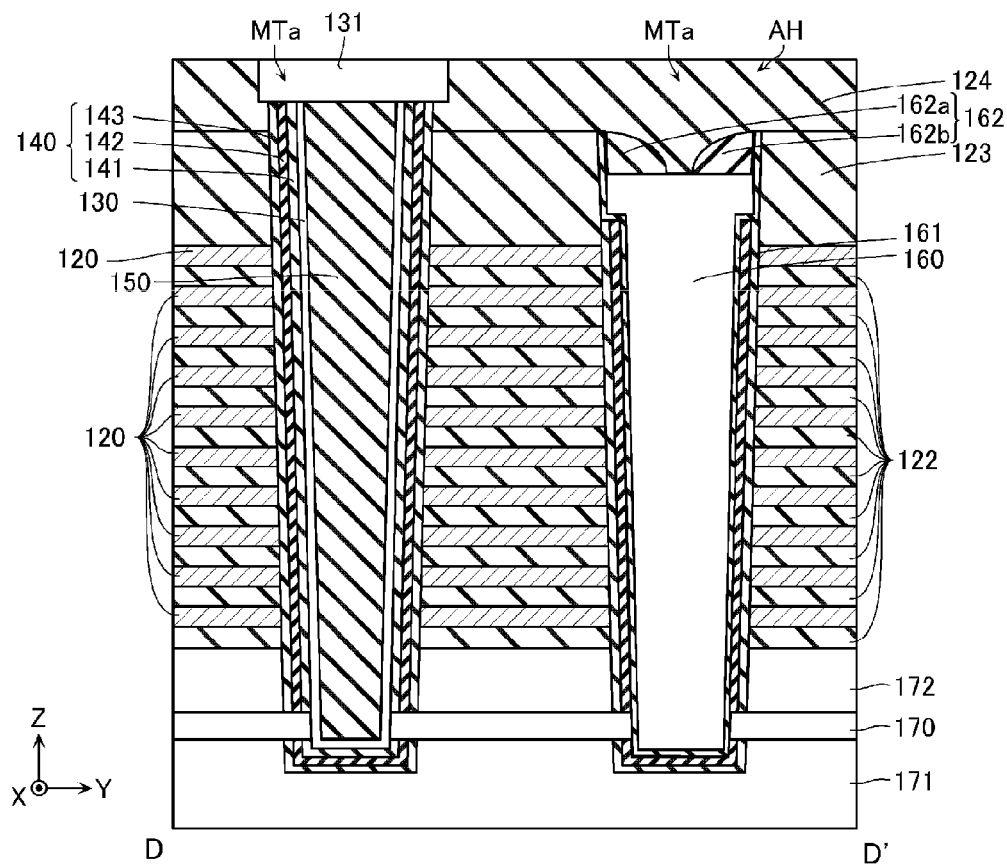

Next, as illustrated in FIGS. 36A and 36B, the plurality of conductive layers 120 are formed in the cavities CA formed by removing the sacrificial layers 120A. The conductive layers 120 are formed by, for example, a method such as CVD.

Next, an insulating layer such as an oxide film is formed in the opening STH' so as to form a structure STH, and then, the bit line contact BLC is provided above the semiconductor layer 131, and the bit line BL is provided above the bit line contact BLC so that the configuration described with reference to FIGS. 3A and 3B is formed.

[Read Operation]

Figure 37A:
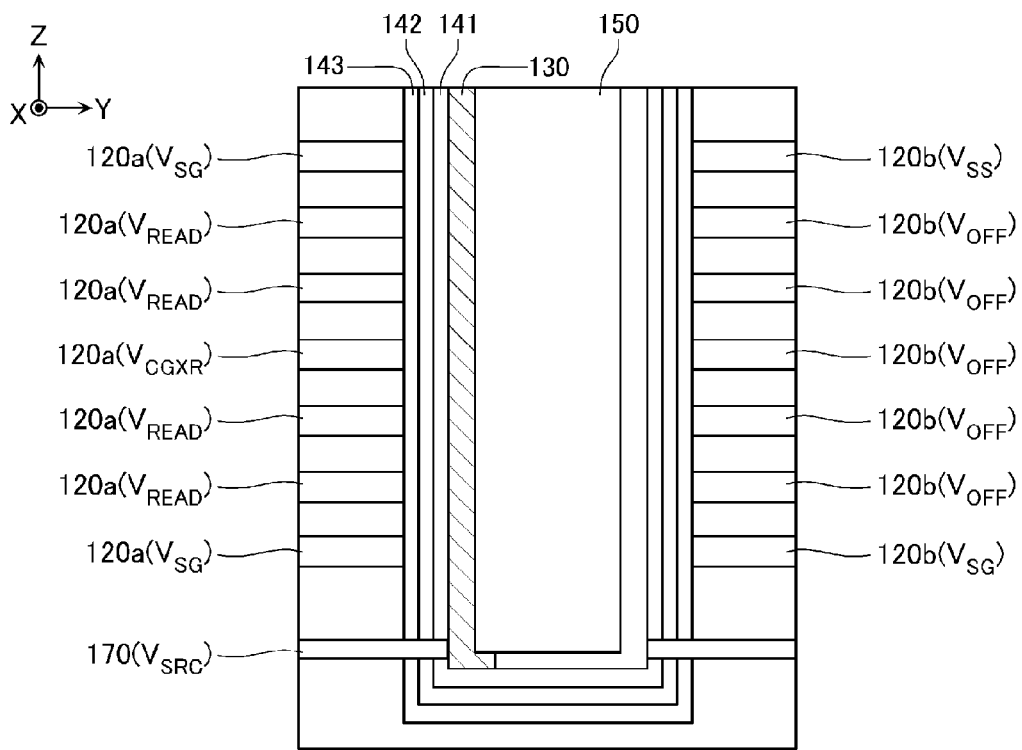
FIGS. 37A and 37B are schematic sectional views illustrating a read operation and a write operation according to the first embodiment.

Next, a read operation of the semiconductor storage device according to at least one embodiment will be described with reference to FIG. 37A. FIG. 37A is a schematic sectional view illustrating the same read operation. FIG. 37A illustrates an example where the read operation is executed for predetermined memory cells MC in the memory string MSa.

As illustrated in FIG. 37A, at the read operation, a read voltage VCGXR is supplied to the first conductive layer 120a functioning as a selected word line WL, a read pass voltage VREAD is supplied to the first conductive layer 120a functioning as a non-selected word line WL, a voltage VSG is supplied to the first conductive layer 120a functioning as a drain side select gate line SGD, a read cut-off voltage VOFF is supplied to the plurality of second conductive layers 120b functioning as word lines WL, a ground voltage VSS is supplied to the second conductive layer 120b functioning as a drain side select gate line SGD, a voltage VSG is supplied to the conductive layer 120 functioning as a source side select gate line SGS, and a source voltage VSRC is supplied to the semiconductor layer 170.

The read voltage VCGXR is a voltage at which the memory cell MC is turned ON or OFF according to data recorded in the memory cell MC. For example, when the threshold voltage of the memory cell MC is controlled in n (n is an integer of 2 or more) states, the read voltage VCGXR is controlled in at least n−1 magnitudes. The read pass voltage VREAD is a voltage at which the memory cell MC is turned ON regardless of data recorded in the memory cell MC, and is larger than the maximum value of the read voltage VCGXR. The read cut-off voltage VOFF is a voltage at which the memory cell MC is turned OFF regardless of data recorded in the memory cell MC, and is smaller than the minimum value of the read voltage VCGXR. The read cut-off voltage VOFF may be smaller than, for example, the ground voltage VSS. That is, the read cut-off voltage VOFF may have a negative polarity. The voltage VSG is a voltage at which the drain side select transistor STD and the source side select transistor STS are turned ON, and is larger than the ground voltage VSS. The source voltage VSRC is a voltage having a similar magnitude to the ground voltage VSS, and is larger than the ground voltage VSS.

Accordingly, in the semiconductor layer 130, an electron channel that brings the bit line BL and a channel region of the selected memory cell MC into conduction, and an electron channel that brings the source line SL and a channel region of the selected memory cell MC into conduction are formed. The selected memory cell MC is turned ON or OFF according to an amount of charges stored in the charge storage layer 142 of the selected memory cell MC. The peripheral circuit PC (see FIG. 1) determines the data recorded in the memory cell MC by detecting, for example, the high/low voltages of the bit line BL, or the magnitude of the current flowing through the bit line BL.

In FIG. 37A, the read cut-off voltage VOFF is supplied to all second conductive layers 120b functioning as the word lines WL. However, this method is merely an example, and a specific method is properly adjustable. For example, the read cut-off voltage VOFF may be supplied to only the second conductive layer 120b adjacent in the Y direction to the first conductive layer 120a functioning as the selected word line WL, and the ground voltage VSS, the read pass voltage VREAD, or another voltage may be supplied to other second conductive layers 120b functioning as the word lines WL.

[Write Operation]

Figure 37B:
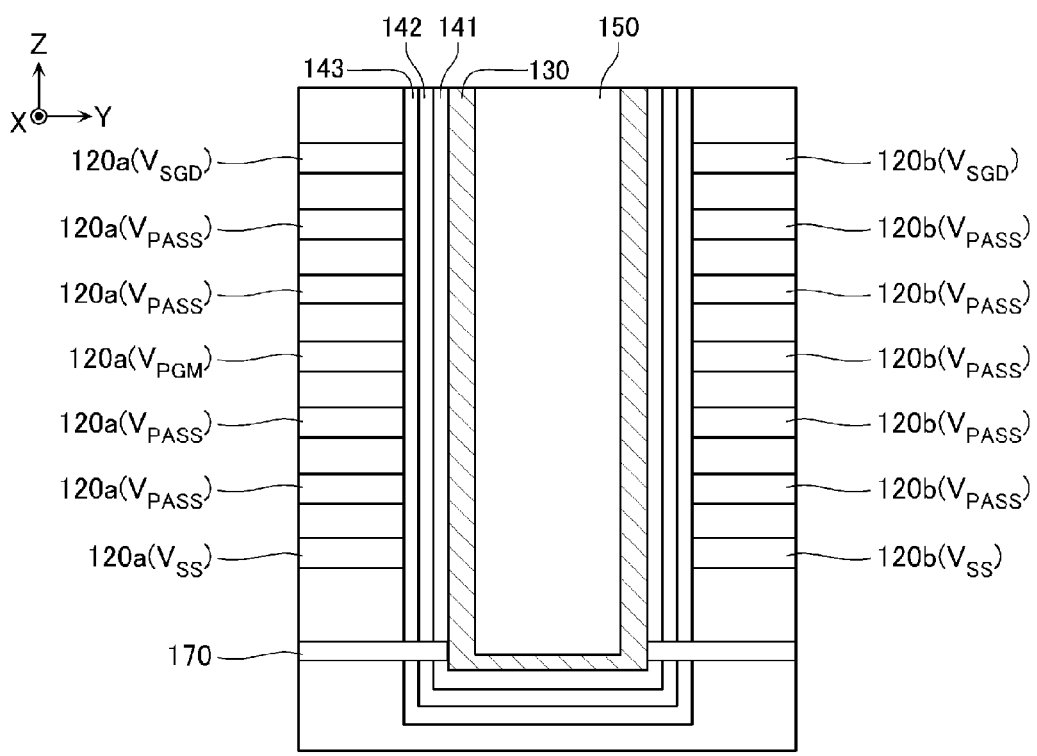

Next, a write operation of the semiconductor storage device according to at least one embodiment will be described with reference to FIG. 37B. FIG. 37B is a schematic sectional view illustrating the same write operation. FIG. 37B illustrates an example where the write operation is executed for predetermined memory cells MC in the memory string MSa.

At the write operation, a program voltage VPGM is supplied to the first conductive layer 120a functioning as a selected word line WL, a write pass voltage VPASS is supplied to the first conductive layer 120a and the second conductive layer 120b functioning as non-selected word lines WL, a voltage VSGD is supplied to the first conductive layer 120a and the second conductive layer 120b functioning as drain side select gate lines SGD, and a ground voltage VSS is supplied to the first conductive layer 120a and the second conductive layer 120b functioning as source side select gate lines SGS.

The program voltage VPGM is a voltage at which electrons are stored in the charge storage layer 142 of the selected memory cell MC, and is larger than the above described read pass voltage VREAD. The write pass voltage VPASS is a voltage at which the memory cell MC is turned ON regardless of data recorded in the memory cell MC, and is equal to or larger than the above described read pass voltage VREAD, and is smaller than the program voltage VPGM. The voltage VSGD is a voltage at which the drain side select transistor STD is turned ON when the source voltage VSRC is supplied to the bit line BL, and the drain side select transistor STD is turned OFF when a predetermined drive voltage is supplied to the bit line BL. The voltage VSGD is larger than the ground voltage VSS, and is smaller than the above described voltage VSG.

Accordingly, an electron channel that brings the bit line BL and the channel region of the selected memory cell MC into conduction is formed in the first semiconductor layer 130a. Electrons in the channel region of the selected memory cell MC tunnel through the first insulating layer 141a and are stored in the first charge storage layer 142a.

When the above described write operation is executed a plurality of times for the semiconductor storage device described with reference to FIG. 2 and FIGS. 3A and 3B, charges are gradually stored in the charge storage layer 142, and the threshold voltage of the memory cell MC gradually increases. In at least one embodiment, through this method, the threshold voltage of the memory cell MC is controlled in two or more states, and accordingly, data is stored.

[Effect]

Figure 38:
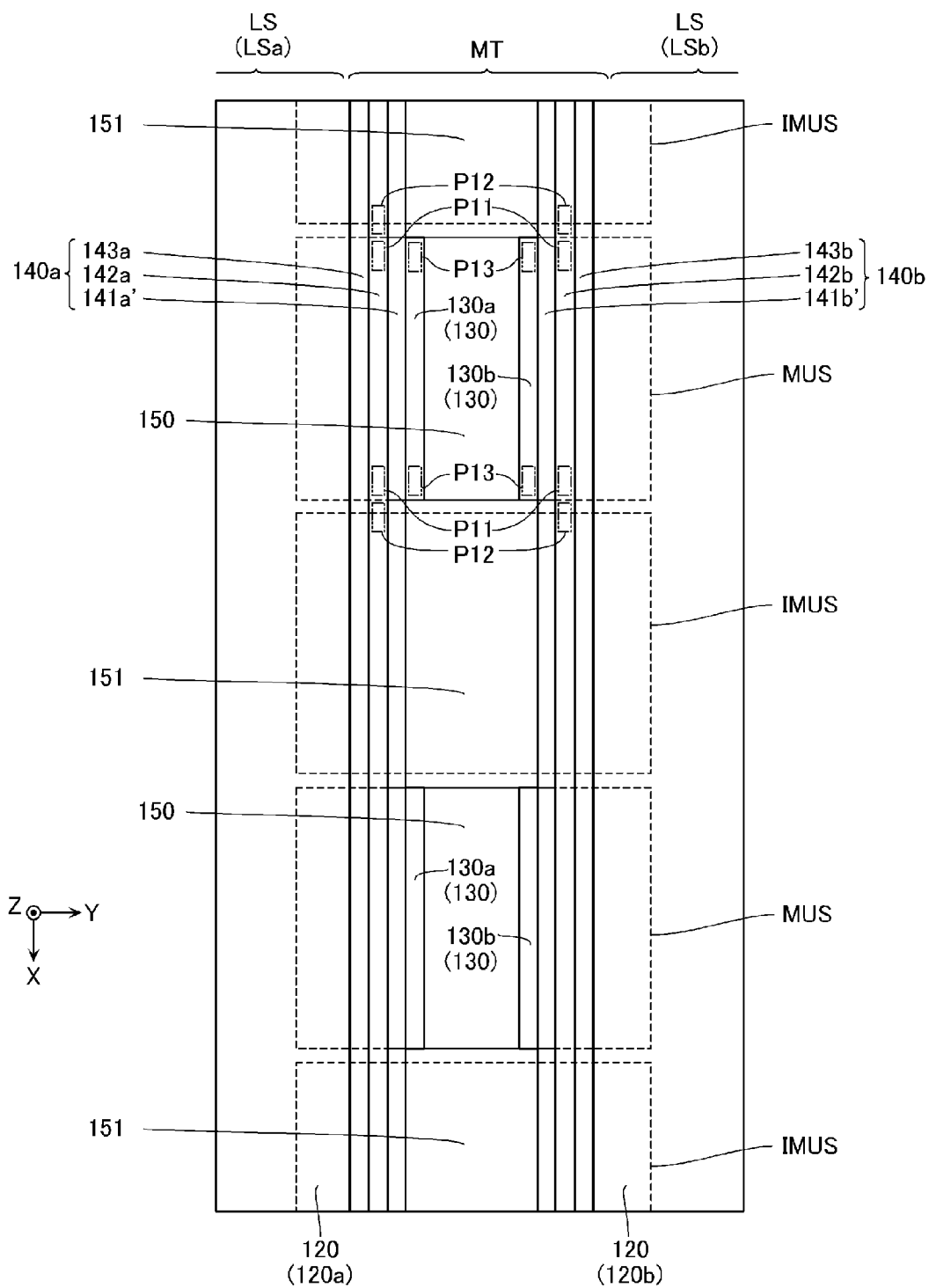
FIG. 38 is a schematic plan view illustrating a part of the configuration of a semiconductor storage device according to Comparative Example.

FIG. 38 illustrates the configuration of a semiconductor storage device according to Comparative Example. The semiconductor storage device according to Comparative Example includes a first insulating layer 141a' and a second insulating layer 141b' instead of the first insulating layer 141a and the second insulating layer 141b.

The first insulating layer 141a' extends in the X direction while corresponding to both the plurality of memory unit structures MUS and the plurality of inter-memory-unit structures IMUS alternately arranged in the X direction. The first insulating layer 141a' is provided between the first conductive layers 120a and the plurality of first semiconductor layers 130a.

The second insulating layer 141b' extends in the X direction while corresponding to both the plurality of memory unit structures MUS and the plurality of inter-memory-unit structures IMUS alternately arranged in the X direction. The second insulating layer 141b' is provided between the second conductive layers 120b and the plurality of second semiconductor layers 130b.

In the semiconductor storage device according to Comparative Example, the inter-memory-unit structure IMUS includes an insulating layer 151 instead of the gap 160. The insulating layer 151 is provided in the central portion of the inter-memory-unit structure IMUS, and extends in the Z direction. The insulating layer 151 is an insulating layer of, for example, silicon oxide (SiO2).

Here, for example, unlike in at least one embodiment in which the gap 160 is disposed, in Comparative Example in which the insulating layer 151 is provided, in some cases, the threshold voltage of the memory cell MC may not suitably increase during the above described write operation. This may be considered to be caused by the following phenomenon. That is, after the write operation is executed, the above described read operation is executed, and when a current flows through the bit line BL, it is determined that the threshold voltage of the memory cell MC has not reached the target value. When a current does not flow through the bit line BL, it is determined that the threshold voltage of the memory cell MC has reached the target value. Here, when the write operation is executed in the semiconductor storage device according to Comparative Example, in portions P11 of the charge storage layer 142 facing vicinities of both ends of the semiconductor layer 130 in the X direction, electrons having a sufficient amount of charges may not be stored. This is because a strong electric field is applied to portions P12 of the charge storage layer 142 located outside the portions P11 facing both end portions of the semiconductor layer 130 in the X direction. Thus, when the read operation is executed after execution of the write operation, an electron channel may be formed in portions P13 at vicinities of both ends of the semiconductor layer 130 in the X direction, which may become a leak path and a current may flow therethrough. In such a case, even when electrons having a sufficient amount of charges are stored in the charge storage layer 142 of the selected memory cell MC in the write operation, the threshold voltage of the memory cell MC may not reach the target value.

Therefore, in at least one embodiment, for example, as illustrated in FIGS. 3A and 3B, and FIG. 4, the gap 160, which is a region having a low relative dielectric constant, is disposed between the semiconductor layers 130 adjacent in the X direction. This may prevent the application of a strong electric field to portions of the charge storage layer 142 facing the outsides of both end portions of the semiconductor layer 130 in the X direction when a program voltage is applied between the conductive layer 120 and the semiconductor layer 130. Thus, a relatively uniform electric field may be generated over the entire region in the X direction, for the portion of the charge storage layer 142 facing the semiconductor layer 130. Accordingly, charges may be stored in the portion of the charge storage layer 142 facing the semiconductor layer 130, uniformly in the X direction. This may prevent the formation of a leak path in vicinities of both ends of the semiconductor layer 130 in the X direction during the read operation and may suitably control the threshold voltage of the memory cell MC so that it is possible to provide the semiconductor storage device that suitably operates.

Second Embodiment

Figure 39A:
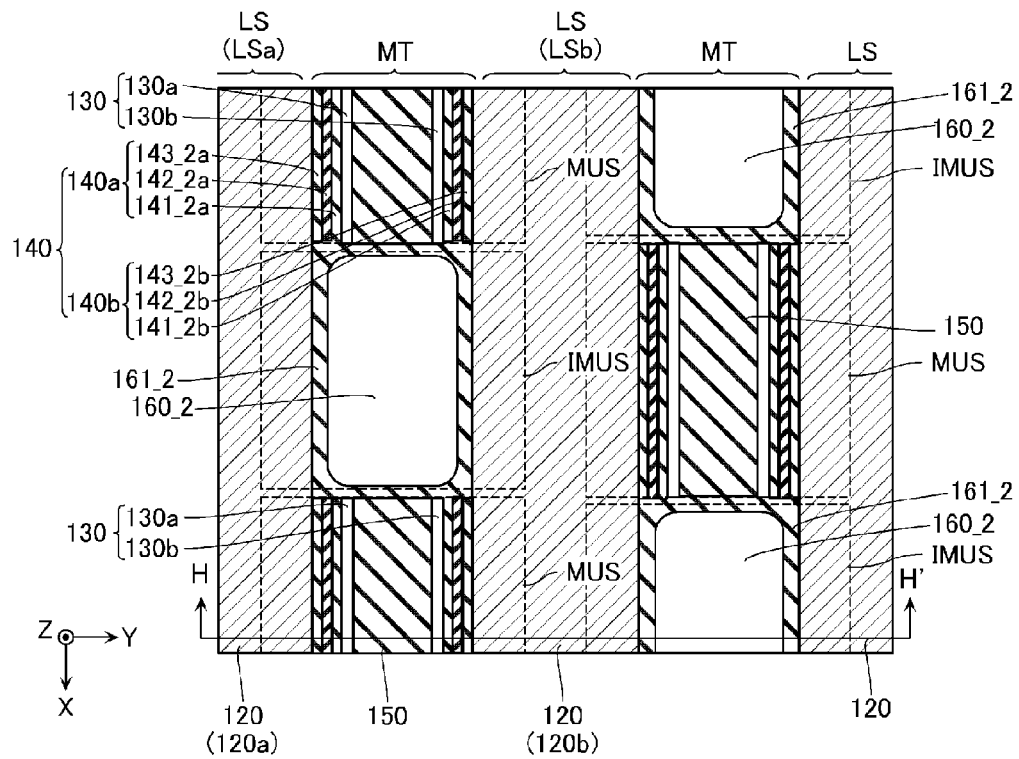
FIGS. 39A and 39B are a schematic plan view and a sectional view of a semiconductor storage device according to a second embodiment.
Figure 39B:
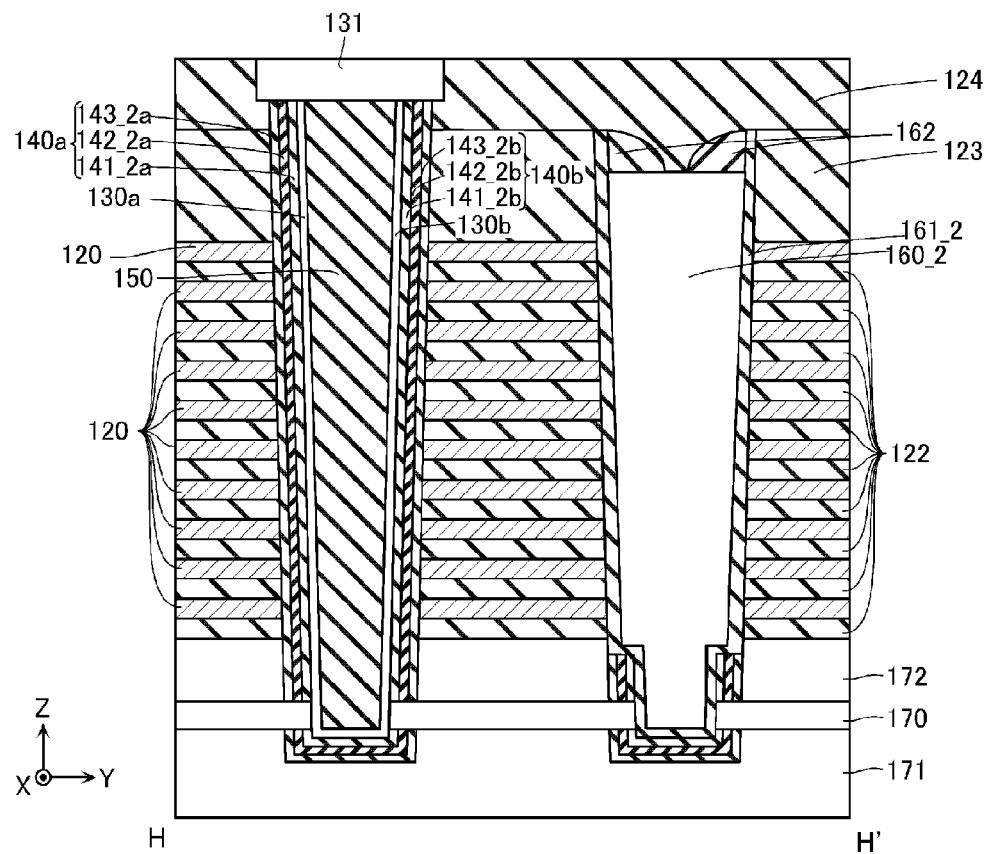
Figure 40:
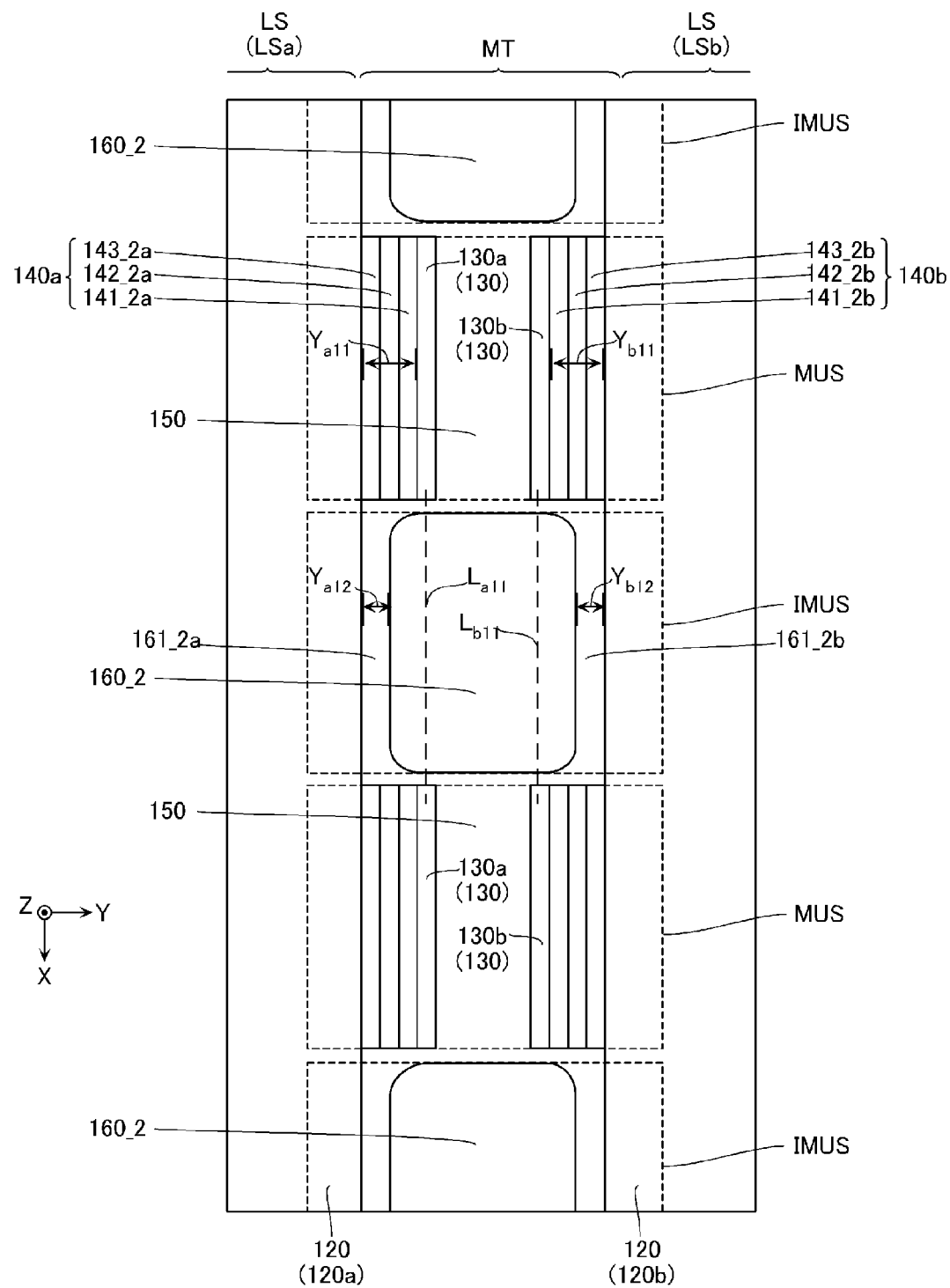
FIG. 40 is an enlarged-scale schematic view of portions corresponding to a memory unit structure MUS and the vicinity thereof in FIG. 39A.

Next, the configuration of a semiconductor storage device according to a second embodiment will be described with reference to FIGS. 39A and 39B and FIG. 40. FIG. 39A is a schematic plan view of the semiconductor storage device according to the second embodiment. FIG. 39B is a schematic sectional view corresponding to the cross-section of a portion indicated by the line H-H' in FIG. 39A. FIG. 40 is an enlarged-scale schematic view of portions corresponding to the memory unit structure MUS and the vicinity thereof in FIG. 39A. A part of the configurations are omitted in FIGS. 39A and 39B and FIG. 40.

The memory unit structure MUS and the inter-memory-unit structure IMUS according to the second embodiment are basically configured in the same manner as in the first embodiment. Meanwhile, the semiconductor storage device according to at least one embodiment includes a first insulating layer 141_2a and a second insulating layer 141_2b instead of the first insulating layer 141a and the second insulating layer 141b, includes a first charge storage layer 142_2a and a second charge storage layer 142_2b instead of the first charge storage layer 142a and the second charge storage layer 142b, includes a first block insulating layer 143_2a and a second block insulating layer 143_2b instead of the first block insulating layer 143a and the second block insulating layer 143b, includes a gap 160_2 instead of the gap 160, and includes an insulating layer 161_2 instead of the insulating layer 161.

The first insulating layer 141a and the first insulating layer 141_2a are basically configured in the same manner. The second insulating layer 141b and the second insulating layer 141_2b are basically configured in the same manner. The first charge storage layer 142a and the first charge storage layer 142_2a are basically configured in the same manner. The second charge storage layer 142b and the second charge storage layer 142_2b are basically configured in the same manner. The first block insulating layer 143a and the first block insulating layer 143_2a are basically configured in the same manner. The second block insulating layer 143b and the second block insulating layer 143_2b are basically configured in the same manner.

Meanwhile, as illustrated in FIGS. 39A and 39B and FIG. 40, in the embodiment, not only the first insulating layers 141_2a and the second insulating layers 141_2b, but also the first charge storage layers 142_2a and the second charge storage layers 142_2b, and the first block insulating layers 143_2a and the second block insulating layers 143_2b are provided corresponding to the plurality of memory unit structures MUS arranged in the X direction, and are divided in the X direction.

The gap 160_2 is a space having the same configuration as the gap 160, which is provided between the semiconductor layer 130 (the first semiconductor layer 130a and the second semiconductor layer 130b) in one of two memory unit structures MUS adjacent to each other in the X direction, and the semiconductor layer 130 (the first semiconductor layer 130a and the second semiconductor layer 130b) in the other memory unit structure MUS. Meanwhile, the insulating layer 161_2 of silicon oxide (SiO2) is provided at a position where the side surfaces and the lower surface of the gap 160_2 are covered.

FIG. 40 illustrates a first virtual line La11 extending in the X direction to pass through two first semiconductor layers 130a adjacent in the X direction, and a second virtual line Lb11 extending in the X direction to pass through two second semiconductor layers 130b adjacent in the X direction. As exemplified in FIG. 40, the gap 160_2 is provided such that the first virtual line La11 and second virtual line Lb11 pass through a part of the gap 160_2.

As exemplified in FIG. 40, a distance Ya12 in the Y direction between the first conductive layer 120a and the gap 160_2 is smaller than a distance Ya11 in the Y direction between the first conductive layer 120a and the first semiconductor layer 130a. A distance Yb12 in the Y direction between the second conductive layer 120b and the gap 160_2 is smaller than a distance Yb11 in the Y direction between the second conductive layer 120b and the second semiconductor layer 130b.

[Production Method]

Figure 41A:
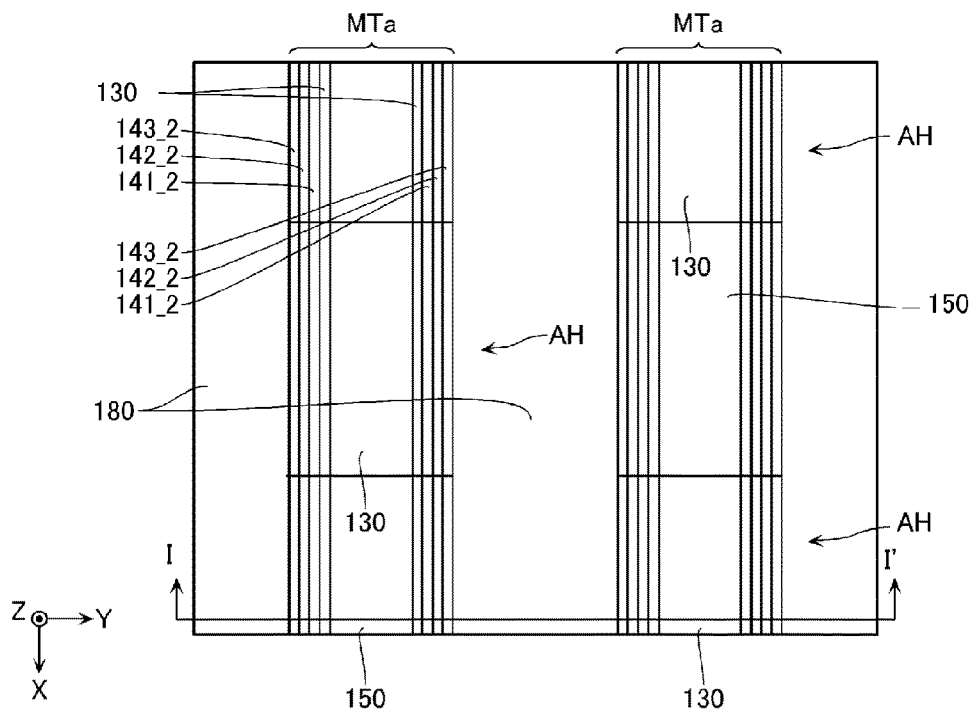
FIGS. 41A and 41B area schematic plan view and a sectional view illustrating a production method of the same semiconductor storage device.
Figure 41B:
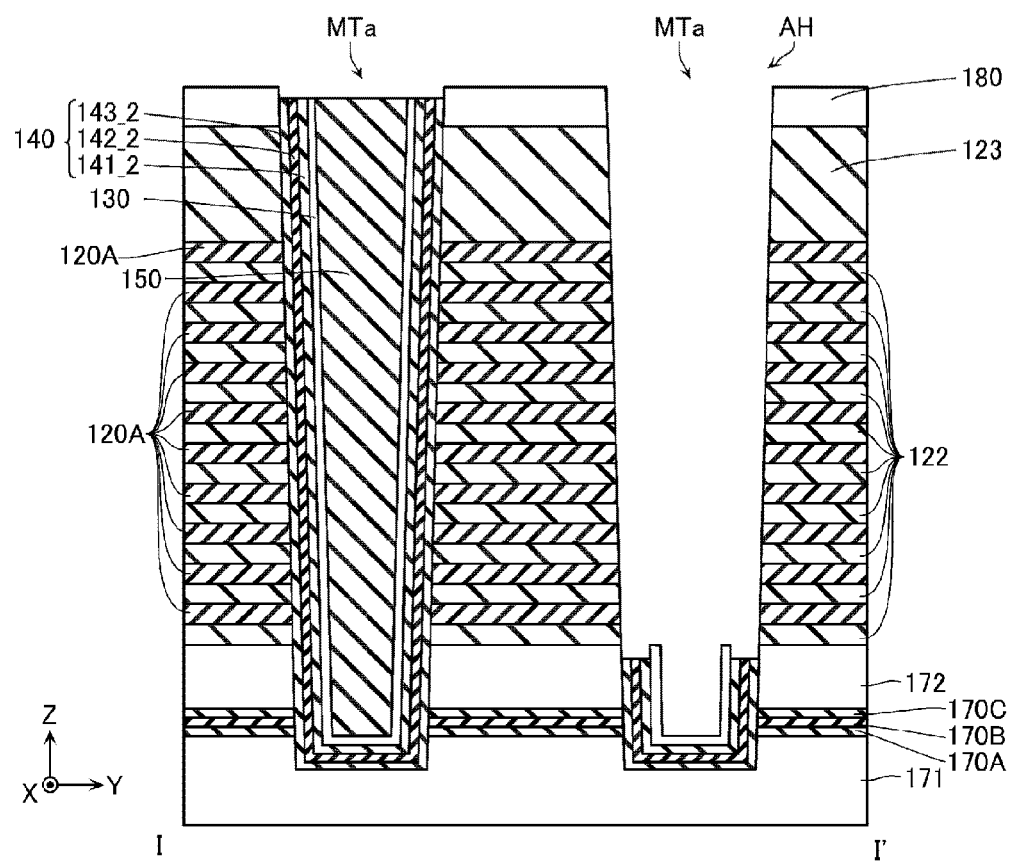

Next, a production method of the semiconductor storage device according to at least one embodiment will be described with reference to FIGS. 41A and 41B to FIGS. 44A and 44B. FIG. 41A, . . . FIG. 44A are schematic plan views illustrating the same production method. FIG. 41B, . . . , FIG. 44B are schematic sectional views illustrating the same production method, and illustrate cross-sections corresponding to the line I-I' in FIG. 41A, . . . , FIG. 44A.

In the following description, the first insulating layer 141_2a and the second insulating layer 141_2b may be referred to as an insulating layer 141_2. The first charge storage layer 142_2a and the second charge storage layer 142_2b may be referred to as a charge storage layer 142_2. The first block insulating layer 143_2a and the second block insulating layer 143_2b may be referred to as a block insulating layer 143_2.

First, the structure illustrated in FIGS. 11A and 11B is formed in the same manner as that in the steps described with reference to FIGS. 5A and 5B to FIGS. 11A and 11B.

Next, as illustrated in FIGS. 41A and 41B, a portion of the insulating layer 150, which is provided at a position corresponding to the region AH, is removed, and then the hard mask HM is removed. This step is performed by, for example, RIE, etc. In this step, apart of the semiconductor layer 130, a part of the insulating layer 141_2, a part of the charge storage layer 142_2, and a part of the block insulating layer 143_2 are also simultaneously removed up to a position lower than the lowermost insulating layer 122.

Figure 42A:
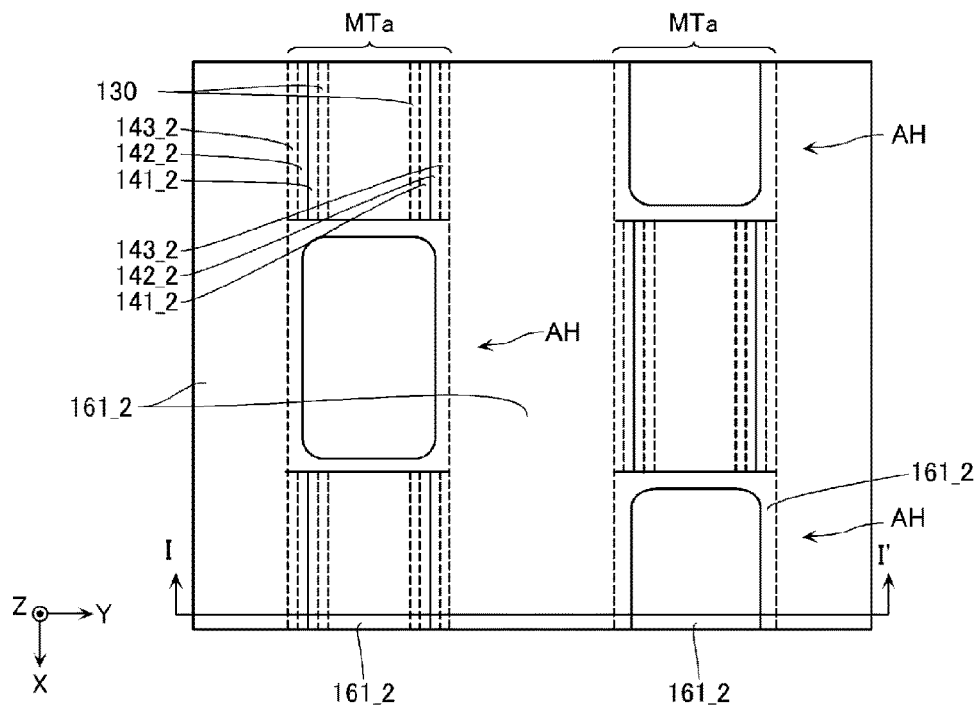
FIGS. 42A and 42B are a schematic plan view and a sectional view illustrating the same production method.
Figure 42B:
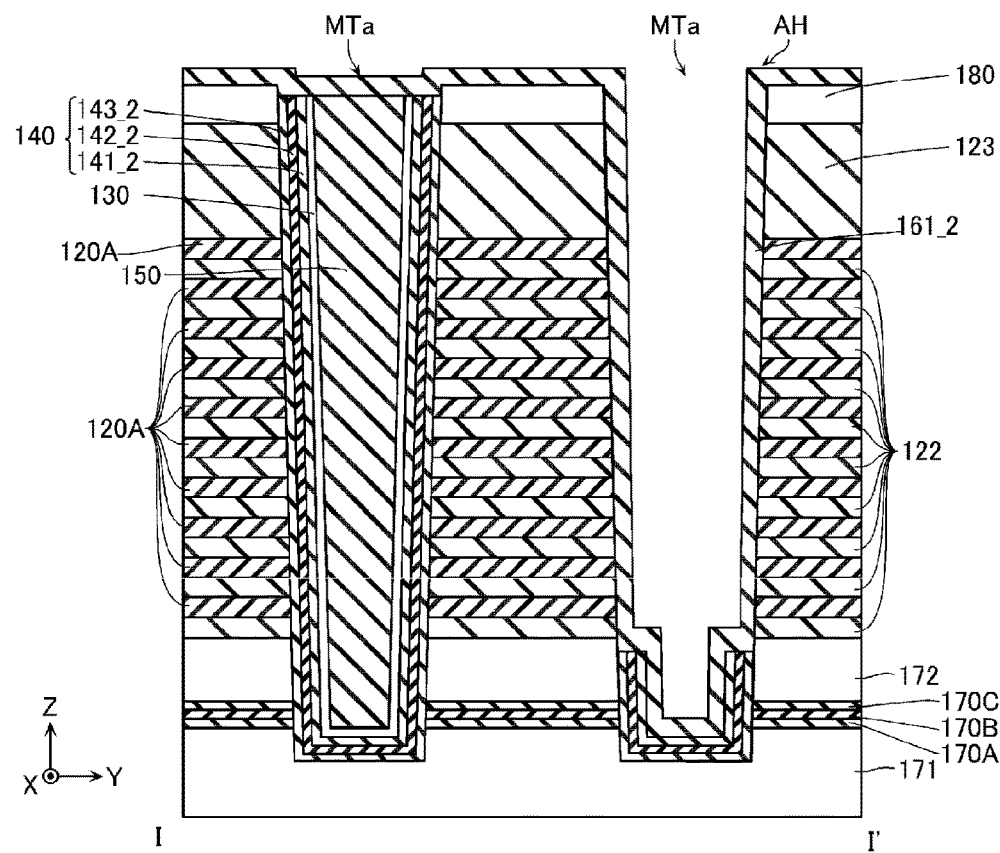

Next, as illustrated in FIGS. 42A and 42B, the semiconductor layer 130 exposed at a position corresponding to the region AH of the structure MTa is removed. Then, the insulating layer 161_2 is formed on the upper surface of the structure, and the side wall surfaces and the lower surface at the position corresponding to the region AH of the structure MTa. The thickness of the insulating layer 161_2 may be larger than the block insulating layer 143_2. The step of removing the semiconductor layer 130 is performed by isotropic etching through, for example, RIE. The step of forming the insulating layer 161_2 is performed by, for example, CVD, etc.

Figure 43A:
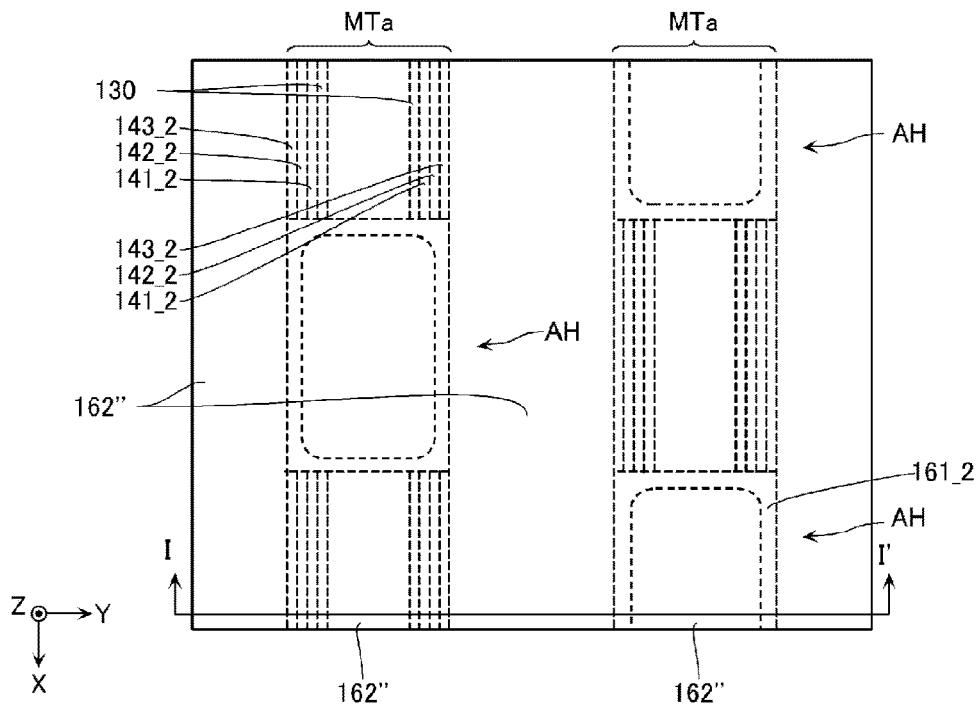
FIGS. 43A and 43B are a schematic plan view and a sectional view illustrating the same production method.
Figure 43B:
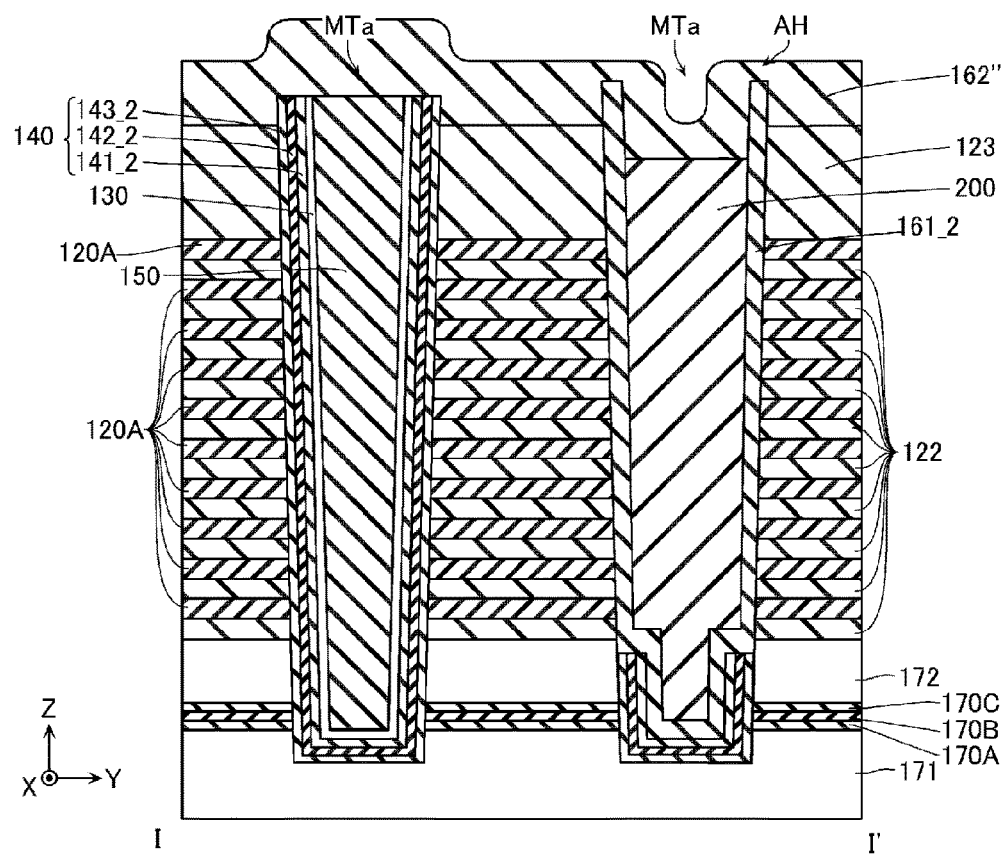
Figure 44A:
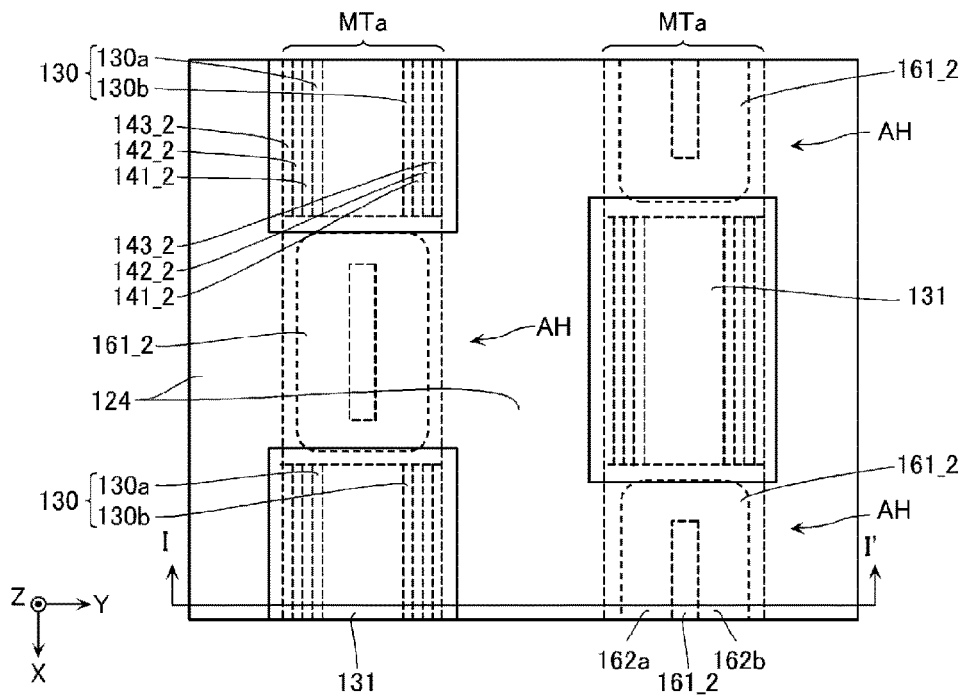
FIGS. 44A and 44B are a schematic plan view and a sectional view illustrating the same production method.
Figure 44B:
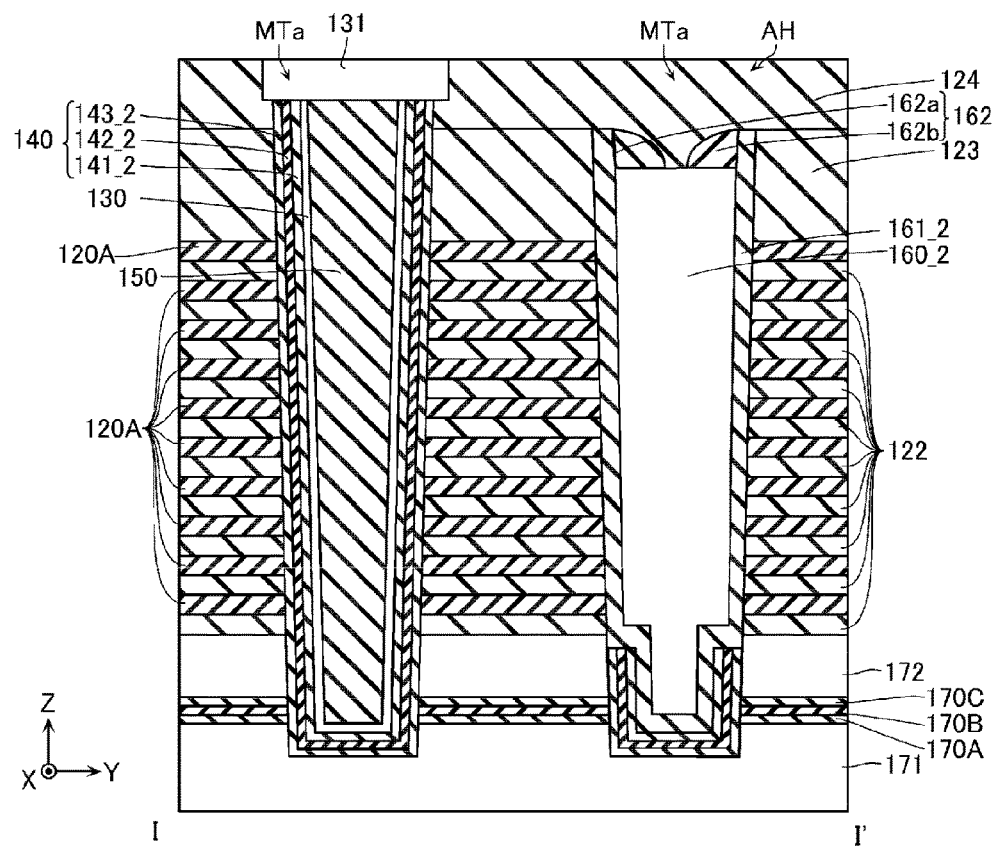

Next, as illustrated in FIGS. 43A and 43B, at the position corresponding to the region AH of the structure MTa, the carbon film 200 is formed such that the position of the upper surface is lower than the upper surface of the insulating layer 123. At the same time, a part of the insulating layer 161_2, and the semiconductor layer 180 are removed. An insulating layer 162" is formed on the upper surface of the structure. This step is performed in the same manner as the steps illustrated in FIGS. 15A and 15B to FIGS. 19A and 19B.

Next, as illustrated in FIGS. 44A and 44B, the insulating layer 162 (the insulating layer 162a and the insulating layer 162b) is formed, the buried carbon film 200 is removed, and the film deposition of the insulating layer 124 is performed so that the gap 160_2 is formed. The semiconductor layer 131 is formed in a portion between the regions AH adjacent in the X direction. This step is performed in the same manner as the steps illustrated in FIGS. 20A and 20B to FIGS. 23A and 23B.

Next, the semiconductor layer 170 and the conductive layers 120 are formed so that the structure described with reference to FIGS. 39A and 39B and FIG. 40 is formed. This step is performed in the same manner as the steps described with reference to FIGS. 24A and 24B to FIGS. 36A and 36B.

Third Embodiment

Figure 45A:
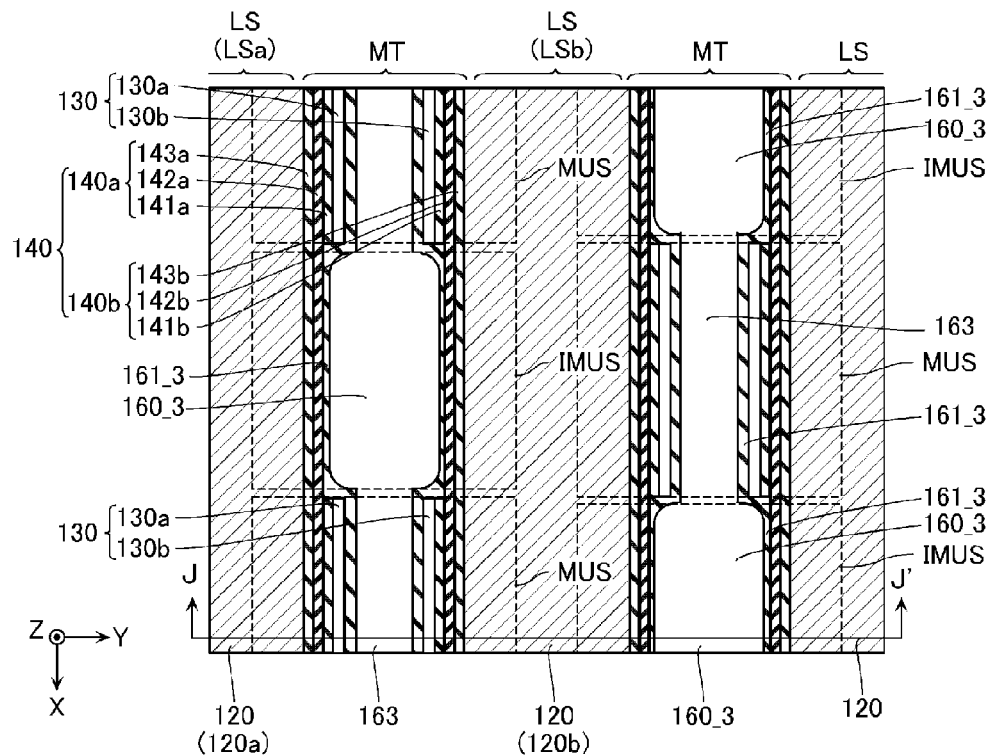
FIGS. 45A and 45B are a schematic plan view and a sectional view of a semiconductor storage device according to a third embodiment.
Figure 45B:
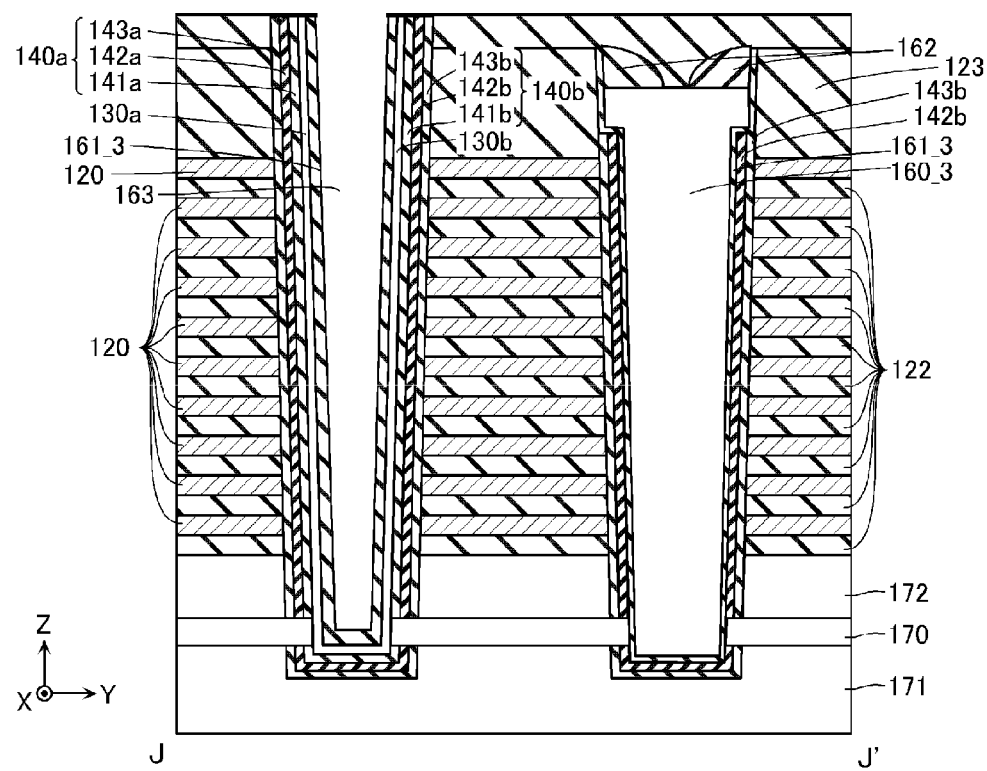

Next, the configuration of a semiconductor storage device according to a third embodiment will be described with reference to FIGS. 45A and 45B. FIG. 45A is a schematic plan view of the semiconductor storage device according to the third embodiment. FIG. 45B is a schematic sectional view corresponding to the cross-section of a portion indicated by the line J-J' in FIG. 45A. A part of the configurations are omitted in FIGS. 45A and 45B.

The memory unit structure MUS and the inter-memory-unit structure IMUS according to the third embodiment are basically configured in the same manner as in the first embodiment. Meanwhile, the semiconductor storage device according to at least one embodiment includes a gap 160_3 instead of the gap 160, and includes an insulating layer 161_3 instead of the insulating layer 161. The semiconductor storage device according to at least one embodiment includes a gap 163 in the central portion of the memory unit structure MUS in the Y direction.

The gap 160_3 is a space having the same configuration as the gap 160. Meanwhile, as illustrated in FIGS. 45A and 45B, the insulating layer 161_3 of silicon oxide (SiO2) is provided at a position where the Y-direction side surfaces and the lower surface of the gap 160_3 are covered.

The gap 163 is provided through the insulating layer 161_3 and extends in the Z direction, at a position between the first semiconductor layer 130a and the second semiconductor layer 130b in the Y direction. The gap 163 is a space having the same characteristics as the gap 160. As illustrated in FIG. 45B, the insulating layer 161_3 is provided at a position where the Y-direction side surfaces and the lower surface of the gap 163 are covered.

In the example illustrated in FIGS. 45A and 45B, the gap 163 and the gap 160_3 adjacent in the X direction are connected in the X direction. Meanwhile, the gap 163 and the gap 160_3 may not be connected in the X direction. For example, an insulating layer may be provided between the gap 163 and the gap 160_3, so that the gap 163 and the gap 160_3 may be provided as spaces apart from each other.

[Production Method]

Figure 46A:
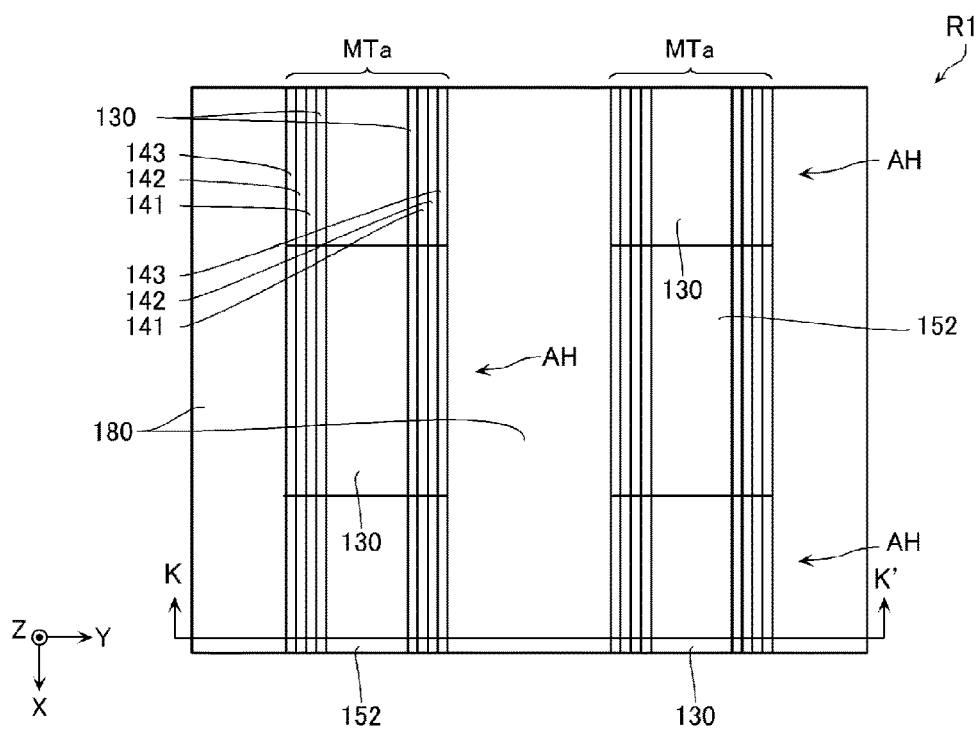
FIGS. 46A and 46B area schematic plan view and a sectional view illustrating a production method of the same semiconductor storage device.
Figure 46B:
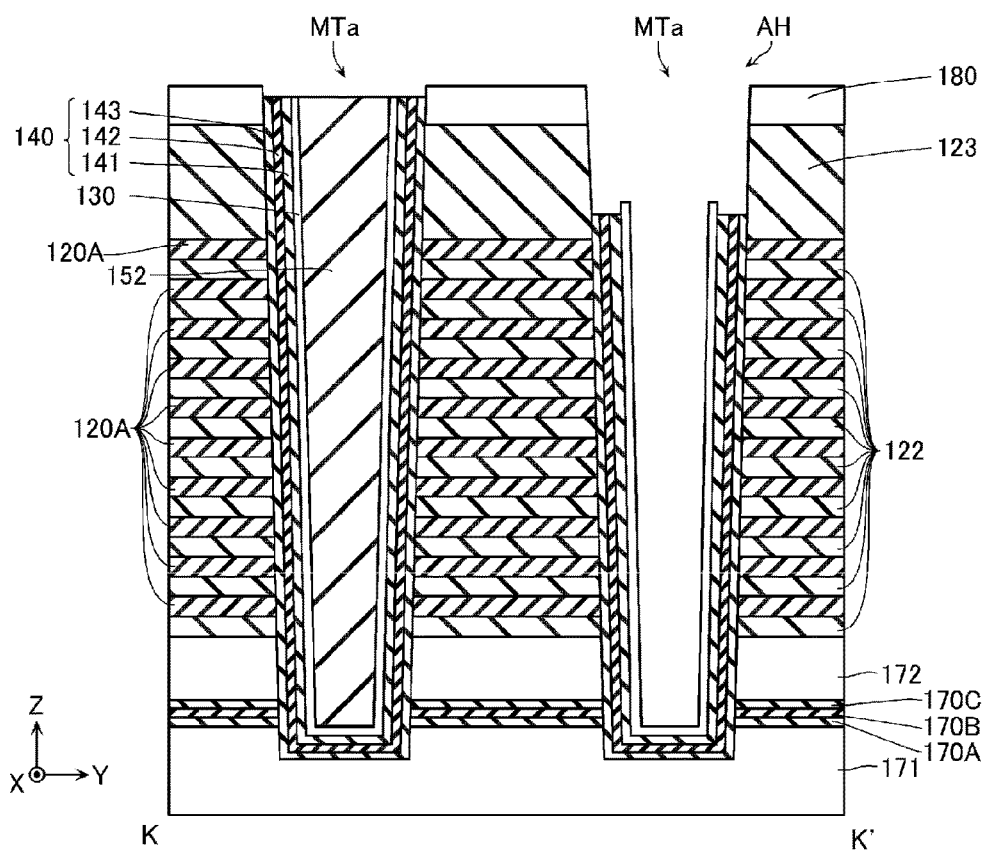

Next, a production method of the semiconductor storage device according to the embodiment will be described with reference to FIGS. 46A and 46B to FIGS. 52A and 52B. FIG. 46A, . . . , FIG. 52A are schematic plan views illustrating the same production method. FIG. 46B, . . . , FIG. 52B are schematic sectional views illustrating the same production method, and illustrate cross-sections corresponding to the line K-K' in FIG. 46A, . . . , FIG. 52A.

First, the structure illustrated in FIGS. 11A and 11B is formed in the same manner as that in the steps described with reference to FIGS. 5A and 5B to FIGS. 11A and 11B. Meanwhile, an insulating layer 152 is formed instead of the insulating layer 150, within the structure MTa. The insulating layer 152 is, for example, a coating-type silicon oxide (SiO2), which has a fast etching rate in dilute hydrofluoric acid, etc.

Next, as illustrated in FIGS. 46A and 46B, a portion of the insulating layer 152, which is provided at a position corresponding to the region AH, is removed, and then the hard mask HM is removed. This step is performed by, for example, RIE, etc. In this step, apart of the semiconductor layer 130, apart of the insulating layer 141, apart of the charge storage layer 142, and a part of the block insulating layer 143 are also simultaneously removed up to a position higher than the uppermost sacrificial layer 120A.

Figure 47A:
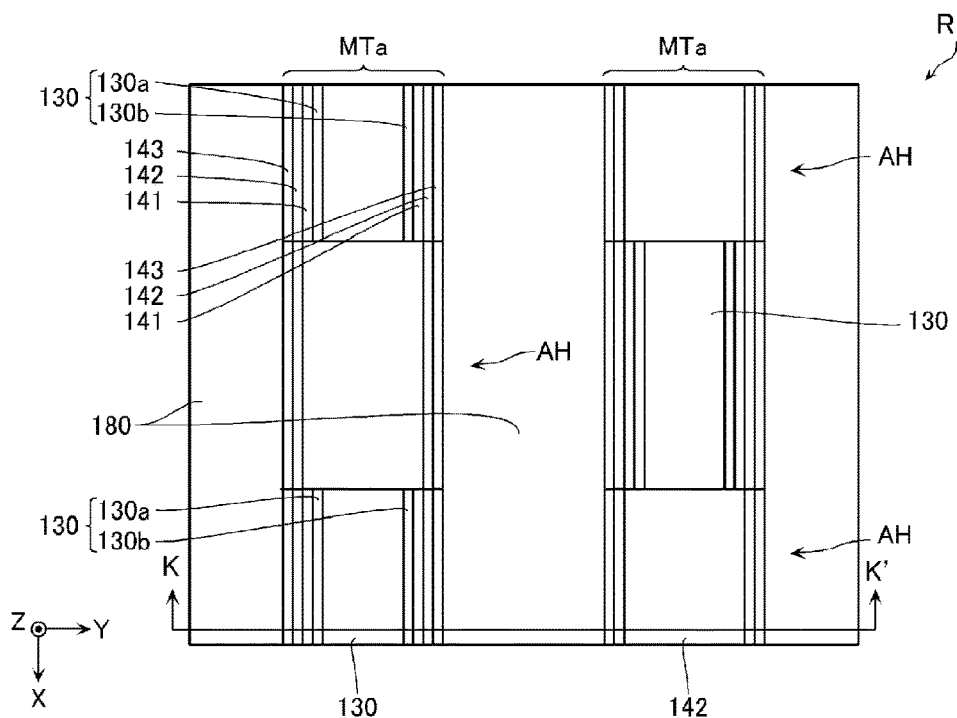
FIGS. 47A and 47B are a schematic plan view and a sectional view illustrating the production method of the same semiconductor storage device.
Figure 47B:
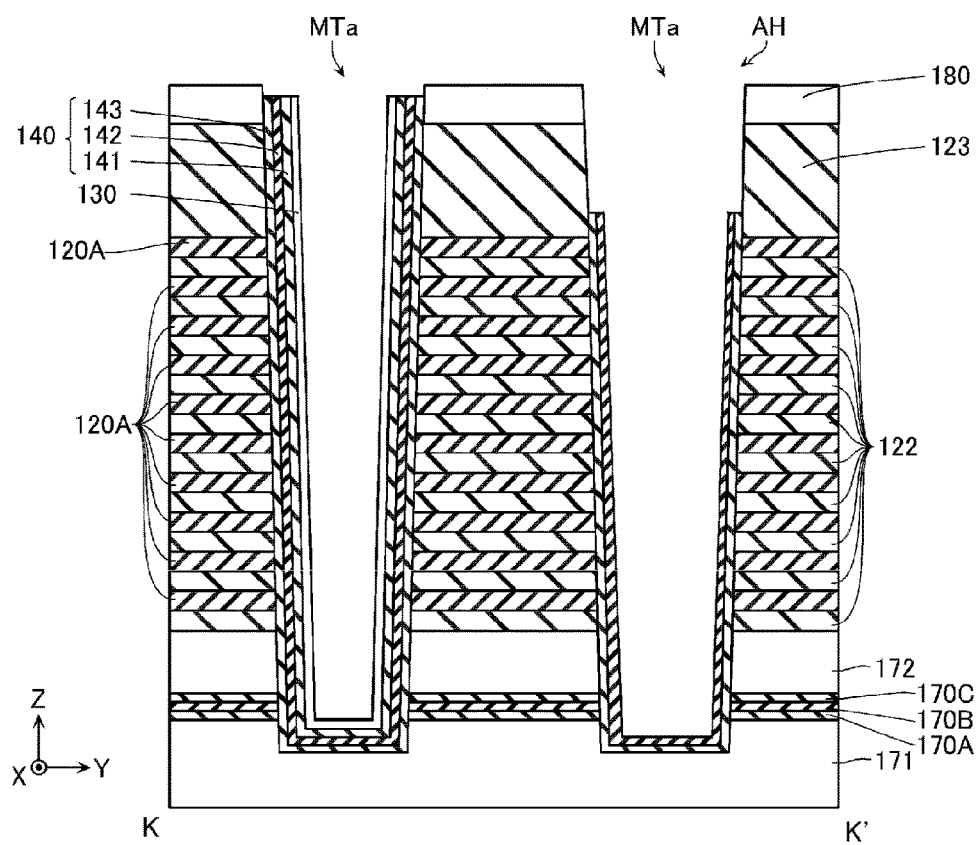

Next, as illustrated in FIGS. 47A and 47B, portions of the semiconductor layer 130 and the insulating layer 141 in the structure MTa, which are exposed at a position corresponding to the region AH, are removed. The insulating layer 152 is removed at a position not corresponding to the region AH of the structure MTa. The step of removing the semiconductor layer 130 is performed by isotropic etching through, for example, RIE. The step of removing the insulating layer 141 and the insulating layer 152 is performed by, for example, wet etching using dilute hydrofluoric acid, etc. Since the etching rate of the insulating layer 152 in dilute hydrofluoric acid, etc. is faster than the rate of the insulating layer 141, the insulating layer 152 may be completely removed, and a part of the insulating layer 141 may remain.

Figure 48A:
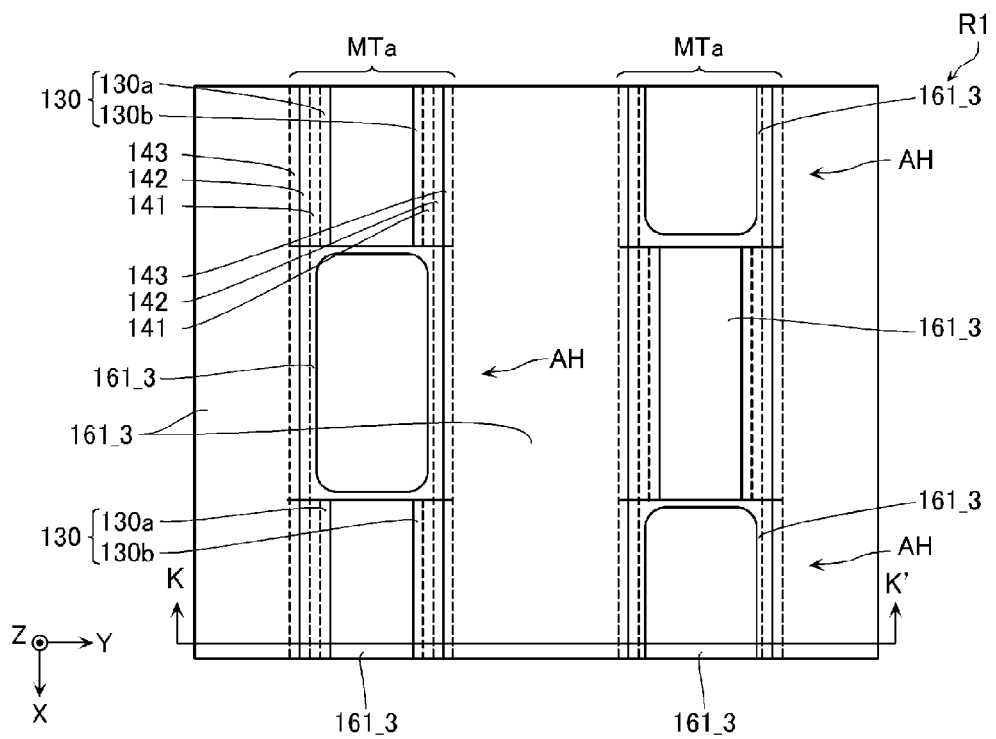
FIGS. 48A and 48B area schematic plan view and a sectional view illustrating the production method of the same semiconductor storage device.
Figure 48B:
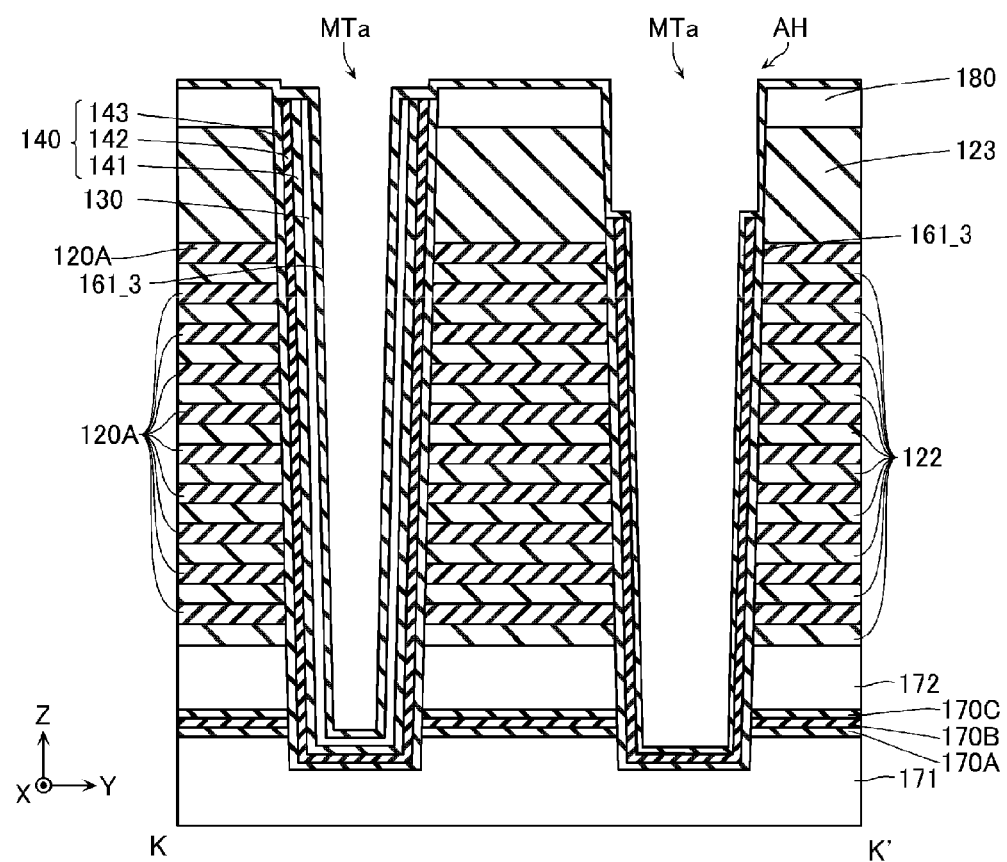

Next, as illustrated in FIGS. 48A and 48B, the insulating layer 161_3 is formed on the upper surface of the structure, and the side wall surfaces and the lower surface of the structure MTa. The step of forming the insulating layer 161_3 is performed by, for example, CVD, etc.

Figure 49A:
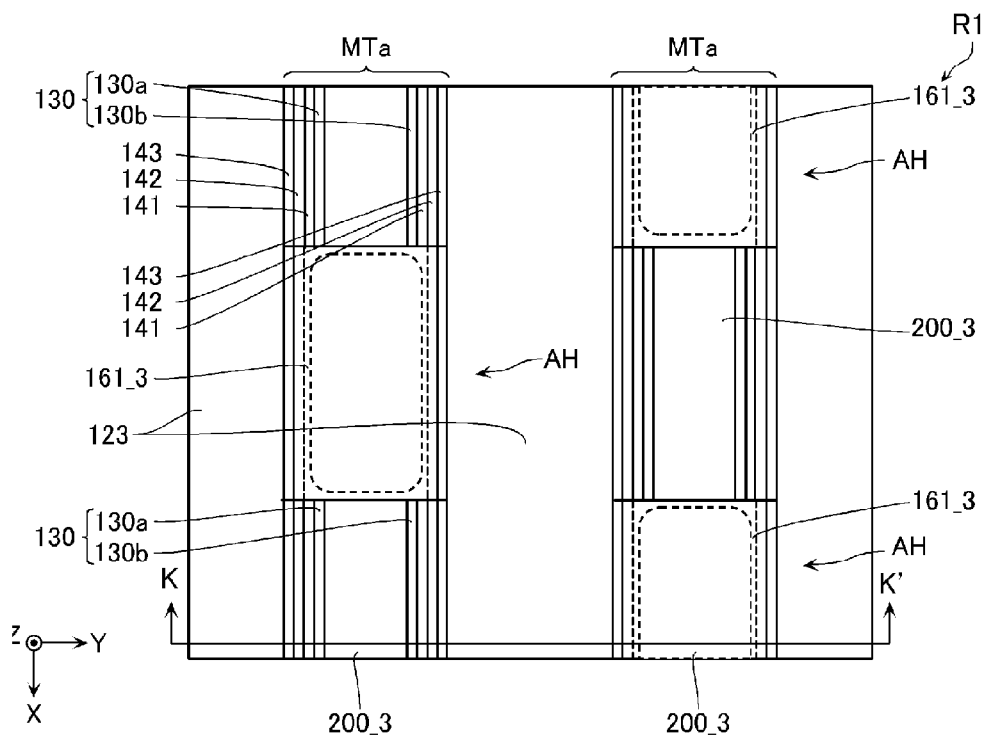
FIGS. 49A and 49B area schematic plan view and a sectional view illustrating the production method of the same semiconductor storage device.
Figure 49B:
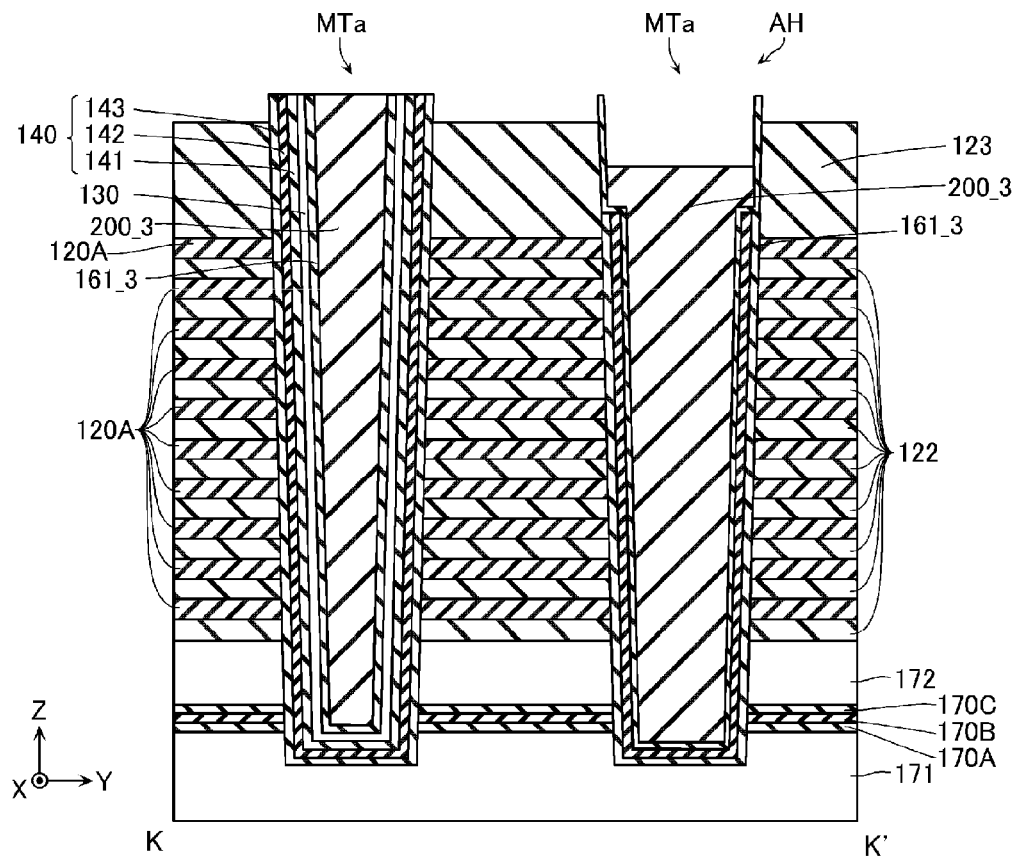

Next, as illustrated in FIGS. 49A and 49B, a carbon film 200_3 is formed at the position corresponding to the structure MTa. Apart of the carbon film 200_3 is removed such that the position of the upper surface of the carbon film 200_3 is lower than the position of the upper surface of the insulating layer 123, at the position corresponding to the region AH of the structure MTa, and the position of the upper surface of the carbon film 200_3 is similar to the position of the upper surface of the semiconductor layer 130, at the position not corresponding to the region AH of the structure MTa. This step is performed in the same manner as the steps illustrated in FIGS. 15A and 15B to FIGS. 18A and 18B.

Figure 50A:
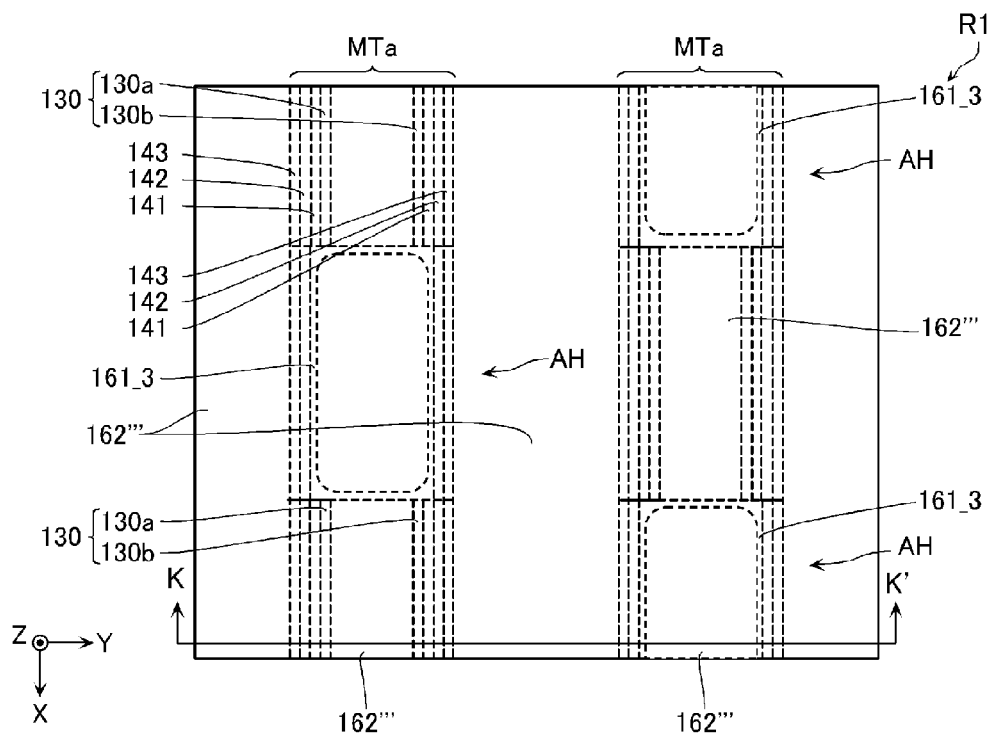
FIGS. 50A and 50B are a schematic plan view and a sectional view illustrating the production method of the same semiconductor storage device.
Figure 50B:
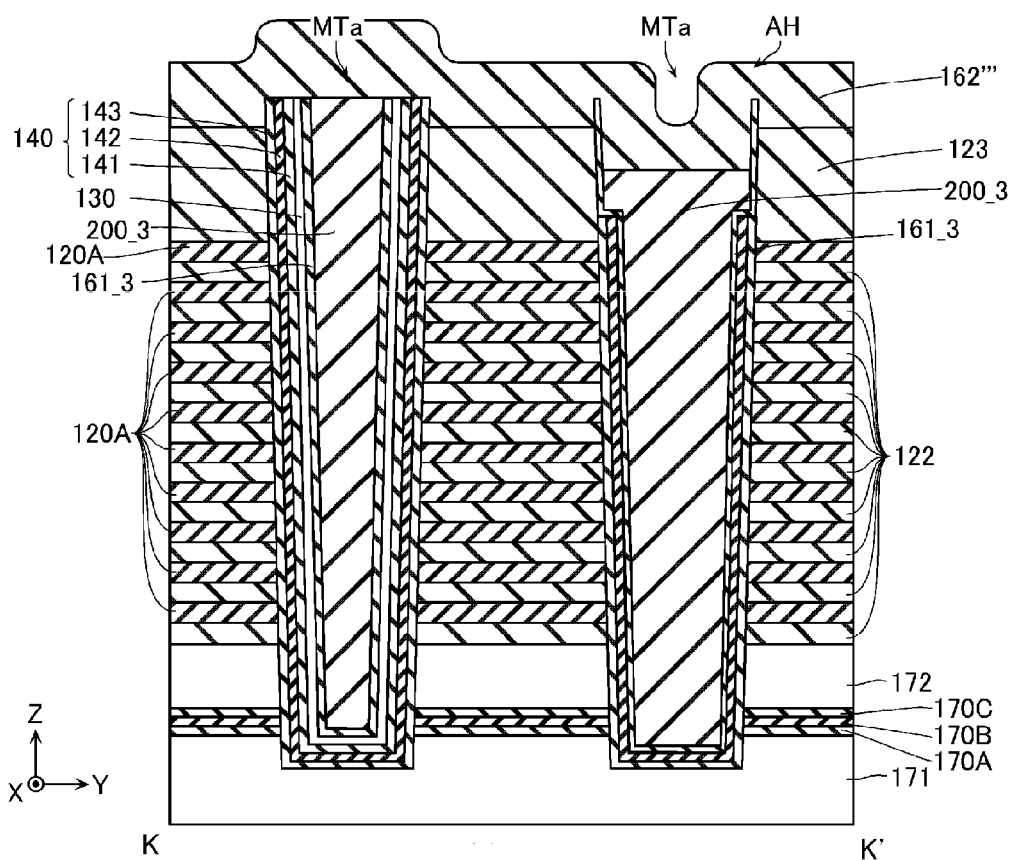

Next, as illustrated in FIGS. 50A and 50B, an insulating layer 162''' is formed on the upper surface of the structure. This step is performed in the same manner as the steps illustrated in FIGS. 19A and 19B.

Figure 51A:
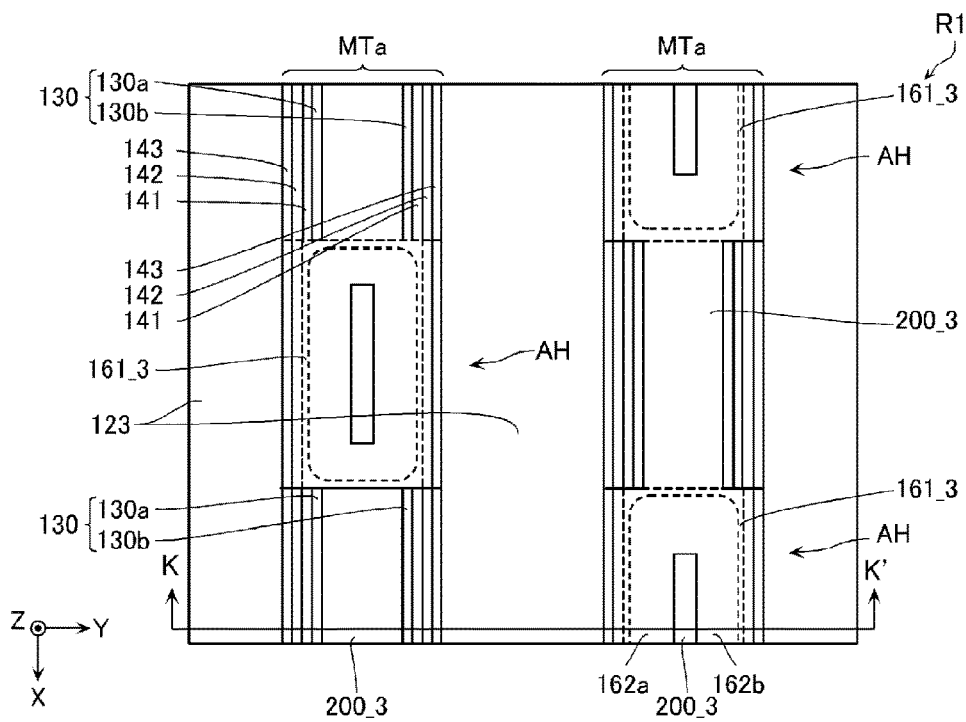
FIGS. 51A and 51B are a schematic plan view and a sectional view illustrating the production method of the same semiconductor storage device.
Figure 51B:
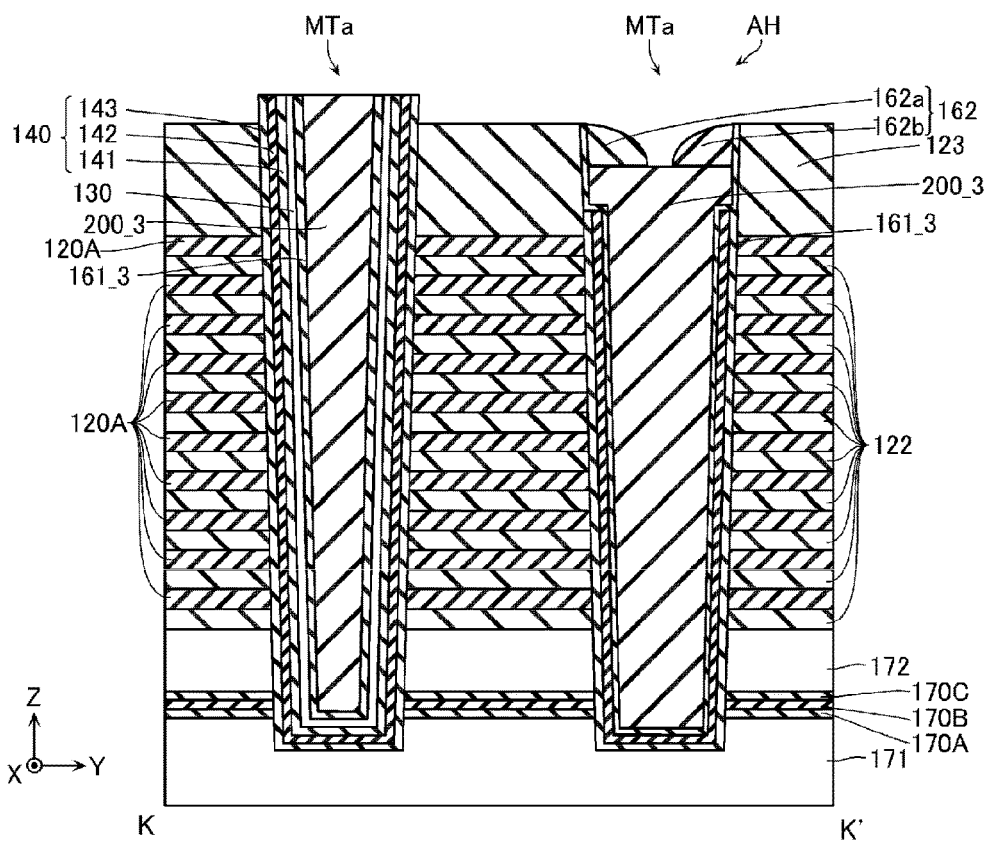
Figure 52A:
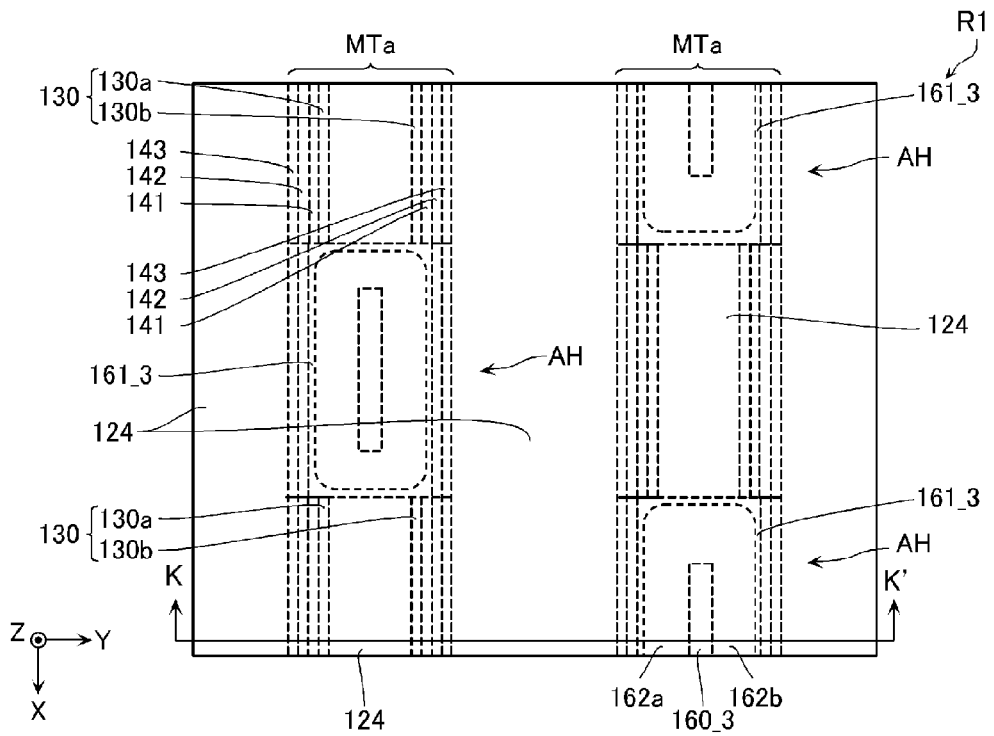
FIGS. 52A and 52B are a schematic plan view and a sectional view illustrating the production method of the same semiconductor storage device.
Figure 52B:
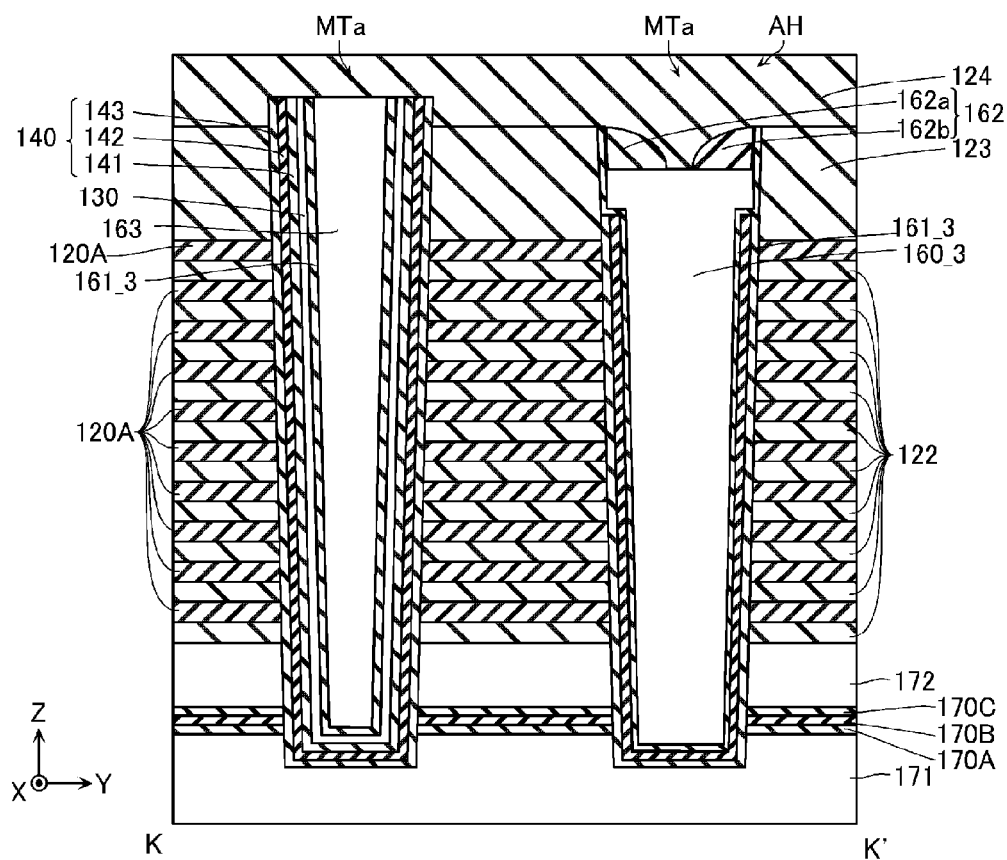

Next, as illustrated in FIGS. 51A and 51B, a part of the insulating layer 162''' is removed from the upper surface of the structure illustrated in FIGS. 50A and 50B. Through this step, at the position corresponding to the region AH of the structure MTa, the insulating layer 162 (the insulating layer 162a and the insulating layer 162b in the sectional view of FIG. 50B) is formed. The insulating layer 162a and the insulating layer 162b are separated at the central portion of the structure MTa in the Y direction, and thus the carbon film 200_3 is exposed at the central portion of the structure MTa in the Y direction. This step is performed by, for example, RIE, etc.

Next, as illustrated in FIGS. 52A and 52B, the carbon film 200_3 buried in the structure MTa is removed, and the film deposition of the insulating layer 124 is performed so that the gap 160_3 and the gap 163 are formed. This step is performed in the same manner as the steps illustrated in FIGS. 21A and 21B to FIGS. 22A and 22B.

Next, the semiconductor layer 170 and the conductive layers 120 are formed so that the structure described with reference to FIGS. 45A and 45B is formed. This step is performed in the same manner as the steps described with reference to FIGS. 25A and 25B to FIGS. 36A and 36B.

Fourth Embodiment

Figure 53A:
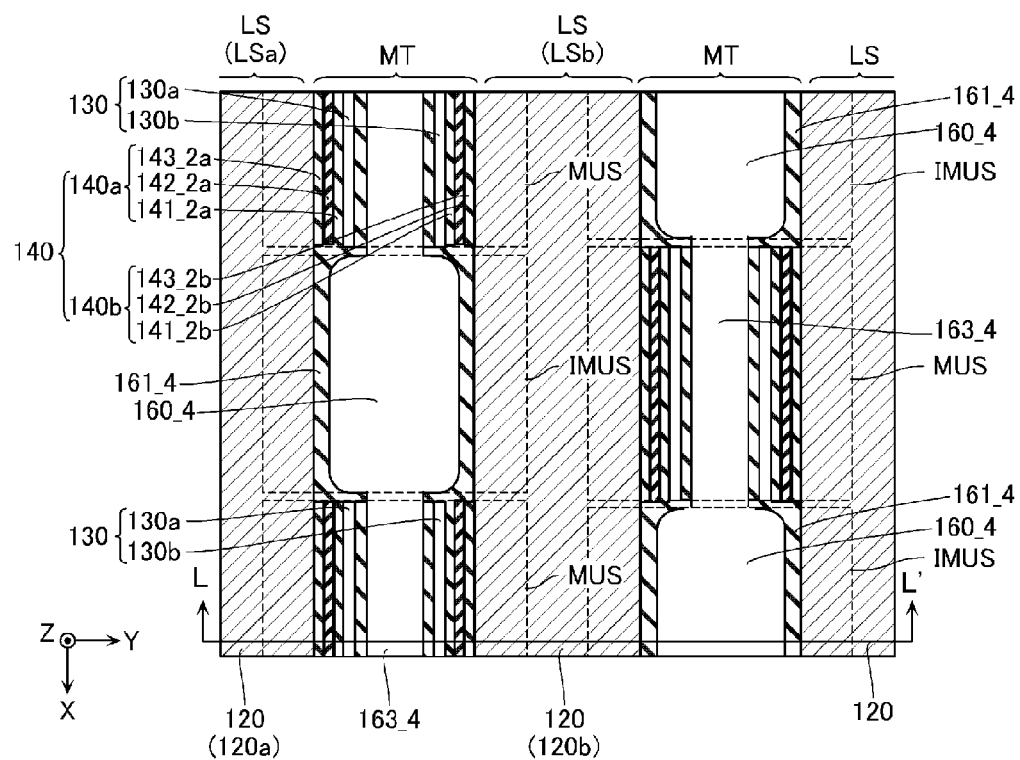
FIGS. 53A and 53B are a schematic plan view and a sectional view of a semiconductor storage device according to a fourth embodiment.
Figure 53B:
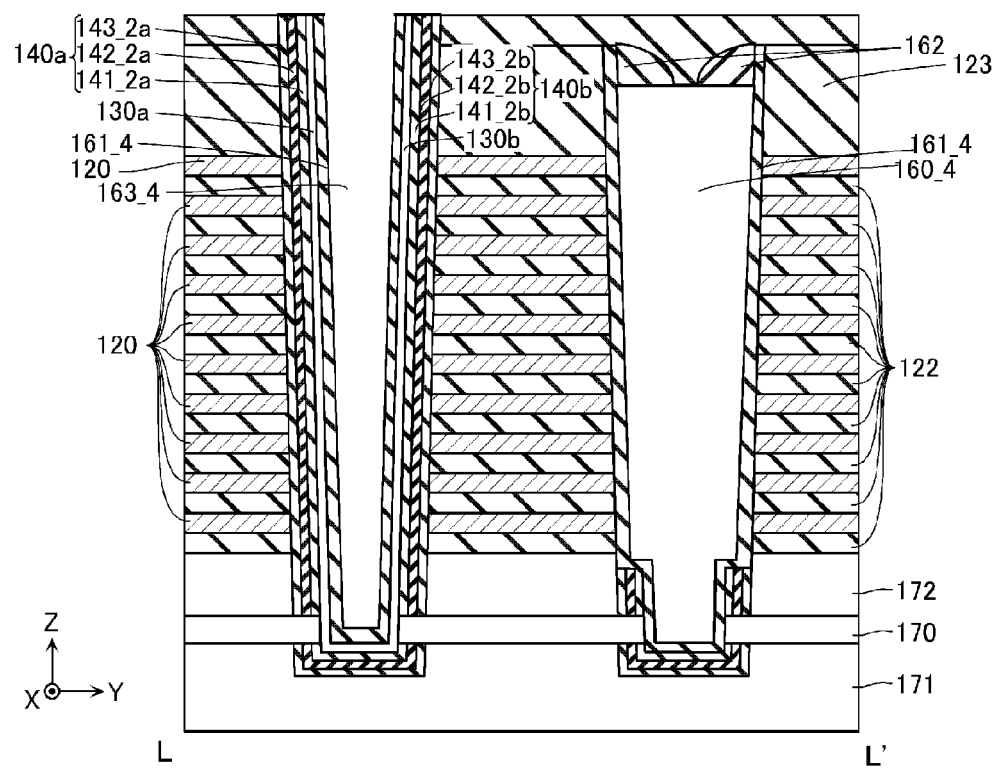

Next, the configuration of a semiconductor storage device according to a fourth embodiment will be described with reference to FIGS. 53A and 53B. FIG. 53A is a schematic plan view of the semiconductor storage device according to the fourth embodiment. FIG. 53B is a schematic sectional view corresponding to the cross-section of a portion indicated by the line L-L' in FIG. 53A. A part of the configurations are omitted in FIGS. 53A and 53B.

The memory unit structure MUS and the inter-memory-unit structure IMUS according to the fourth embodiment are basically configured in the same manner as in the second embodiment. Meanwhile, the semiconductor storage device according to at least one embodiment includes a gap 160_4 instead of the gap 160_2, and includes an insulating layer 161_4 instead of the insulating layer 161_2. The semiconductor storage device according to at least one embodiment includes a gap 163_4 in the central portion of the memory unit structure MUS in the Y direction.

The gap 160_4 is a space having the same configuration as the gap 160_2. Meanwhile, as illustrated in FIGS. 53A and 53B, the insulating layer 161_4 of silicon oxide (SiO2) is provided at a position where the Y-direction side surfaces and the lower surface of the gap 160_4 are covered.

The gap 163_4 is provided through the insulating layer 161_4 and extends in the Z direction, at a position between the first semiconductor layer 130a and the second semiconductor layer 130b in the Y direction. The gap 163_4 is a space having the same characteristics as the gap 160. The insulating layer 161_4 is provided at a position where the Y-direction side surfaces and the lower surface of the gap 163_4 are covered.

In the example illustrated in FIGS. 53A and 53B, the gap 163_4 and the gap 160_4 which are adjacent to each other are connected in the X direction. Meanwhile, the gap 163_4 and the gap 160_4 may not be connected in the X direction. For example, an insulating layer or the like may be provided between the gap 163_4 and the gap 160_4, so that the gap 163_4 and the gap 160_4 may be provided as spaces apart from each other.

Other Embodiments

The semiconductor storage devices according to the first to fourth embodiments have been exemplified above. However, the above configurations are merely examples, and specific configurations and the like are suitably adjustable.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a first conductive layer extending in a first direction;
   a second conductive layer spaced from the first conductive layer in a second direction, the second direction intersecting the first direction, the second conductive layer extending in the first direction;
   a plurality of semiconductor layers disposed between the first conductive layer and the second conductive layer and arranged in the first direction, each of the plurality of semiconductor layers including a first portion facing the first conductive layer and a second portion facing the second conductive layer;
   a plurality of first memory cells disposed between the first conductive layer and the plurality of semiconductor layers, respectively;
   a plurality of second memory cells disposed between the second conductive layer and the plurality of semiconductor layers, respectively,
   a first charge storage layer disposed between the first conductive layer and the plurality of semiconductor layers, the first charge storage layer extending in the first direction over a plurality of regions where the first conductive layer faces the plurality of semiconductor layers;
   a second charge storage layer disposed between the second conductive layer and the plurality of semiconductor layers, the second charge storage layer extending in the first direction over a plurality of regions where the second conductive layer faces the plurality of semiconductor layers,
   wherein, in the first direction, a gap exists between two adjacent semiconductor layers among the plurality of semiconductor layers, the first charge storage layer disposed between the first conductive layer and the gap, the second charge storage layer disposed between the second conductive layer and the gap;
   a second insulating layer disposed between the first portion and the first charge storage layer;
   a third insulating layer disposed between the second portion and the second charge storage layer;
   a fourth insulating layer disposed between the gap and the first charge storage layer; and
   a fifth insulating layer disposed between the gap and the second charge storage layer,
   wherein a width of the fourth insulating layer in the second direction is smaller than a width of the second insulating layer in the second direction.

2. The semiconductor storage device according to claim 1, wherein the plurality of first conductive layers and the plurality of second conductive layers are arranged in a third direction, the third direction intersecting the first direction and the second direction.

3. The semiconductor storage device according to claim 2, wherein the first portion extends in the third direction, and faces the plurality of first conductive layers in the second direction, and
   the second portion extends in the third direction, and faces the plurality of second conductive layers in the second direction.

4. The semiconductor storage device according to claim 1, wherein a gap exists between the first portion and the second portion.

5. The semiconductor storage device according to claim 1, including a first insulating layer disposed between the first portion and the second portion.

6. The semiconductor storage device according to claim 1, further comprising:
- a plurality of first charge storage layers disposed between the first conductive layer and the plurality of semiconductor layers, respectively; and
- a plurality of second charge storage layers disposed between the second conductive layer and the plurality of semiconductor layers, respectively, wherein, in the first direction, adjacent first charge storage layers are spaced apart, and adjacent second charge storage layers are spaced apart.

7. The semiconductor storage device according to claim 1, wherein a distance between the first conductive layer and the gap is smaller than a distance between the first conductive layer and the first portion.

8. The semiconductor storage device according to claim 7, wherein a distance between the second conductive layer and the gap is smaller than a distance between the second conductive layer and the second portion.

9. The semiconductor storage device according to claim 1, wherein a width of the fifth insulating layer in the second direction is smaller than a width of the third insulating layer in the second direction.

10. The semiconductor storage device according to claim 1, wherein
- a first cross section extends in the first direction and the second direction and includes the first conductive layer and the second conductive layer,
- a first virtual line extends in the first direction through at least a part of two of the first portions adjacent in the first direction, and
- a second virtual line extends in the first direction through at least a part of two of the second portions adjacent in the first direction, the first virtual line and the second virtual line being set in the first cross-section and passing through at least a part of the gap.

11. The semiconductor storage device according to claim 1, wherein at least one of the first conductive layer or the second conductive layer includes an electrode.

12. The semiconductor storage device according to claim 1, wherein at least one of the first conductive layer or the second conductive layer includes a stacked film.

13. The semiconductor storage device according to claim 5, wherein the first insulating layer includes $SiO_2$.

14. The semiconductor storage device according to claim 1, wherein the first charge storage layer includes SiN.

* * * * *